US012635135B2

(12) United States Patent (10) Patent No.: US 12,635,135 B2
Kunitake et al. (45) Date of Patent: May 19, 2026

(54) CRYSTALLINE OXIDE SEMICONDUCTOR MEMORY DEVICE

(71) Applicant: Semiconductor Energy Laboratory Co., Ltd., Atsugi (JP)

(72) Inventors: Hitoshi Kunitake, Isehara (JP); Yuki Ito, Nagoya (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 650 days.

(21) Appl. No.: 18/013,917

(22) PCT Filed: Jul. 6, 2021

(86) PCT No.: PCT/IB2021/056021
§ 371 (c)(1),
(2) Date: Dec. 30, 2022

(87) PCT Pub. No.: WO2022/013679
PCT Pub. Date: Jan. 20, 2022

(65) Prior Publication Data
US 2023/0301099 A1 Sep. 21, 2023

(30) Foreign Application Priority Data
Jul. 17, 2020 (JP) ................................ 2020-122595

(51) Int. Cl.
*H10B 43/27* (2023.01)
*H10B 41/27* (2023.01)
(Continued)

(52) U.S. Cl.
CPC ............. *H10B 43/27* (2023.02); *H10B 41/27* (2023.02); *H10B 41/35* (2023.02); *H10B 43/35* (2023.02)

(58) Field of Classification Search
CPC ........ H10B 41/27; H10B 41/35; H10B 43/35; H10B 43/27; H10B 41/70; H10D 30/021;
(Continued)

(56) References Cited

U.S. PATENT DOCUMENTS 5,528,032 A 6/1996 Uchiyama
6,156,620 A 12/2000 Puchner et al.
(Continued)

FOREIGN PATENT DOCUMENTS

JP 2000-133594 A 5/2000
JP 2007-317874 A 12/2007
(Continued)

OTHER PUBLICATIONS

International Search Report (Application No. PCT/IB2021/056021) Dated Sep. 21, 2021.
(Continued)

*Primary Examiner* — William B Partridge
*Assistant Examiner* — Chevy J Boegel
(74) *Attorney, Agent, or Firm* — Eric J. Robinson; Robinson Intellectual Property Law Office, P.C.

(57) ABSTRACT

A novel semiconductor device is provided. The semiconductor device includes an oxide semiconductor as a first semiconductor, silicon as a second semiconductor, and a plurality of memory cells lined up in a first direction; and a memory cell includes a writing transistor and a reading transistor. The first semiconductor and the second semiconductor extend in the first direction, part of the first semiconductor functions as a channel formation region of the writing transistor, and part of the second semiconductor functions as a channel formation region of the reading transistor. The second semiconductor includes a region in contact with a first layer containing a first metal element.

10 Claims, 52 Drawing Sheets

(51) Int. Cl.
*H10B 41/35* (2023.01)
*H10B 43/35* (2023.01)

(58) Field of Classification Search
CPC ............. H10D 30/6728; H10D 30/675; H10D
30/6755; H10D 64/035; H10D 64/037;
G11C 16/0483
See application file for complete search history.

(56) References Cited

U.S. PATENT DOCUMENTS

| | | | |
|---|---|---|---|
| 6,294,441 | B1 | 9/2001 | Yamazaki |
| 6,727,544 | B2 | 4/2004 | Endoh et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,372,720 | B2 | 2/2013 | Fukuzumi et al. |
| 8,461,000 | B2 | 6/2013 | Alsmeier et al. |
| 8,658,499 | B2 | 2/2014 | Makala et al. |
| 8,872,254 | B2 | 10/2014 | Lee et al. |
| 8,928,061 | B2 | 1/2015 | Chien et al. |
| 9,406,694 | B1 | 8/2016 | Ikeno et al. |
| 9,502,431 | B2 | 11/2016 | Sakuma et al. |
| 9,634,097 | B2 | 4/2017 | Rabkin et al. |
| 10,658,295 | B2 | 5/2020 | Kawai et al. |
| 10,665,604 | B2 | 5/2020 | Kimura et al. |
| 10,886,292 | B2 | 1/2021 | Kimura et al. |
| 11,329,065 | B2 | 5/2022 | Kimura et al. |
| 2009/0146206 | A1 | 6/2009 | Fukuzumi et al. |
| 2009/0282763 | A1 | 11/2009 | Ferguson |
| 2010/0213537 | A1 | 8/2010 | Fukuzumi et al. |
| 2011/0065270 | A1 | 3/2011 | Shim et al. |
| 2011/0101332 | A1 | 5/2011 | Yamazaki et al. |
| 2011/0101334 | A1 | 5/2011 | Yamazaki et al. |
| 2011/0101351 | A1 | 5/2011 | Yamazaki |
| 2011/0147823 | A1 | 6/2011 | Kuk et al. |
| 2011/0233648 | A1 | 9/2011 | Seol et al. |
| 2012/0001243 | A1 | 1/2012 | Kato |
| 2012/0001249 | A1 | 1/2012 | Alsmeier et al. |
| 2012/0098048 | A1 | 4/2012 | Choe et al. |
| 2012/0119287 | A1 | 5/2012 | Park et al. |
| 2012/0319114 | A1 | 12/2012 | Yamazaki et al. |
| 2013/0062600 | A1 | 3/2013 | Koezuka et al. |
| 2013/0221356 | A1 | 8/2013 | Yamazaki et al. |
| 2014/0097484 | A1 | 4/2014 | Seol et al. |
| 2014/0225181 | A1 | 8/2014 | Makala et al. |
| 2015/0171184 | A1 | 6/2015 | Nakajima |
| 2015/0255485 | A1 | 9/2015 | Kameoka et al. |
| 2015/0380422 | A1 | 12/2015 | Sharangpani et al. |
| 2016/0079268 | A1 | 3/2016 | Sakuma et al. |
| 2016/0247927 | A1 | 8/2016 | Nomura et al. |
| 2017/0040416 | A1 | 2/2017 | Ota et al. |
| 2018/0033799 | A1 | 2/2018 | Kanamori et al. |
| 2018/0269210 | A1 | 9/2018 | Tezuka et al. |
| 2019/0006386 | A1 | 1/2019 | Yamazaki et al. |
| 2019/0027493 | A1 | 1/2019 | Kimura et al. |
| 2019/0088673 | A1 | 3/2019 | Maeda et al. |
| 2019/0295956 | A1 | 9/2019 | Kawai et al. |
| 2022/0262822 | A1* | 8/2022 | Kimura .................. H10B 43/27 |

FOREIGN PATENT DOCUMENTS

| | | |
|---|---|---|
| JP | 2016-063027 A | 4/2016 |
| JP | 2018-207038 A | 12/2018 |
| JP | 2019-024087 A | 2/2019 |
| JP | 2019-054220 A | 4/2019 |
| JP | 2019-165178 A | 9/2019 |

OTHER PUBLICATIONS

Written Opinion (Application No. PCT/IB2021/056021) Dated Sep. 21, 2021.

Kimizuka.N et al., "2.4.4 Discussion on Growth Mechanism", Physics and Technology of Crystalline Oxide Semiconductor CAAC-IGZO: Fundamentals, Sep. 15, 2016, pp. 94-97, Wiley.

Miyagawa.H et al., "Metal-Assisted Solid-Phase Crystallization Process for Vertical Monocrystalline Si Channel in 3D Flash Memory", IEDM 19: Technical Digest of International Electron Devices Meeting, Dec. 7, 2019, pp. 650-653.

* cited by examiner

FIG. 11A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 11B
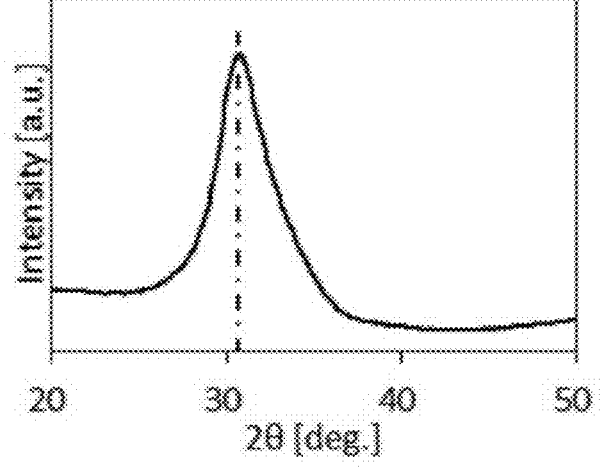
FIG. 11C
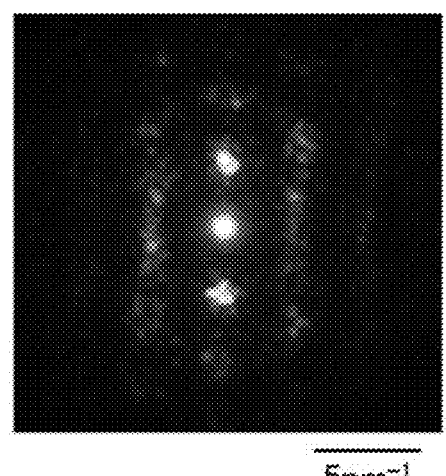
5nm⁻¹

122        123A 122    136A      123A 136A 122 124A

FIG. 21A
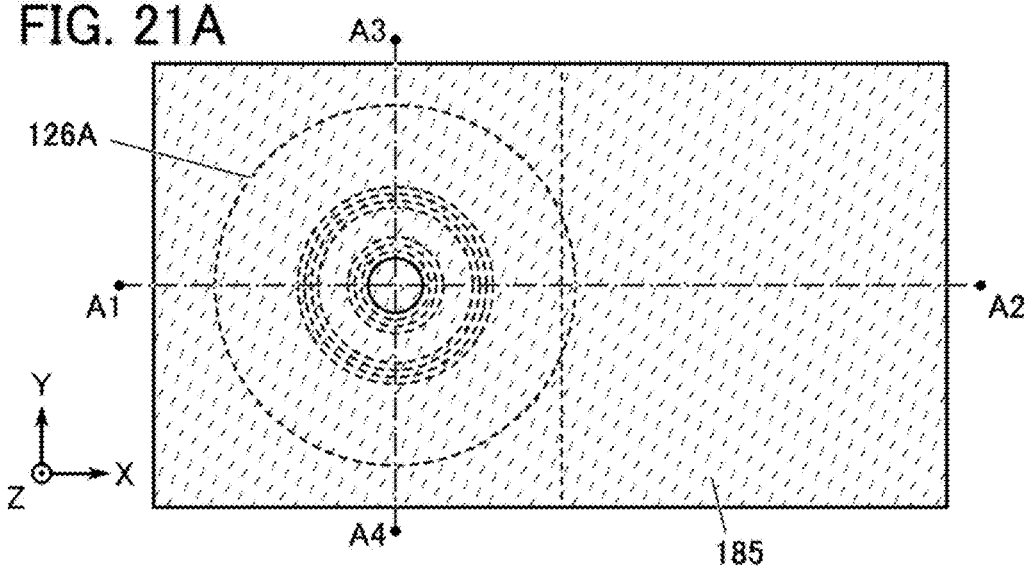
FIG. 21B
FIG. 21C
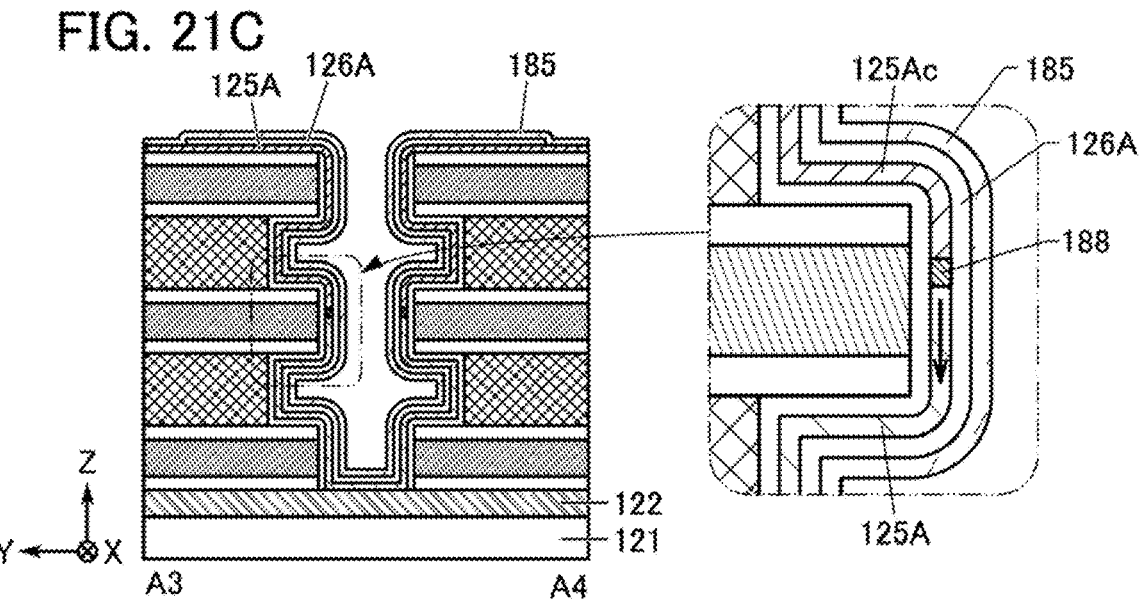

FIG. 25A
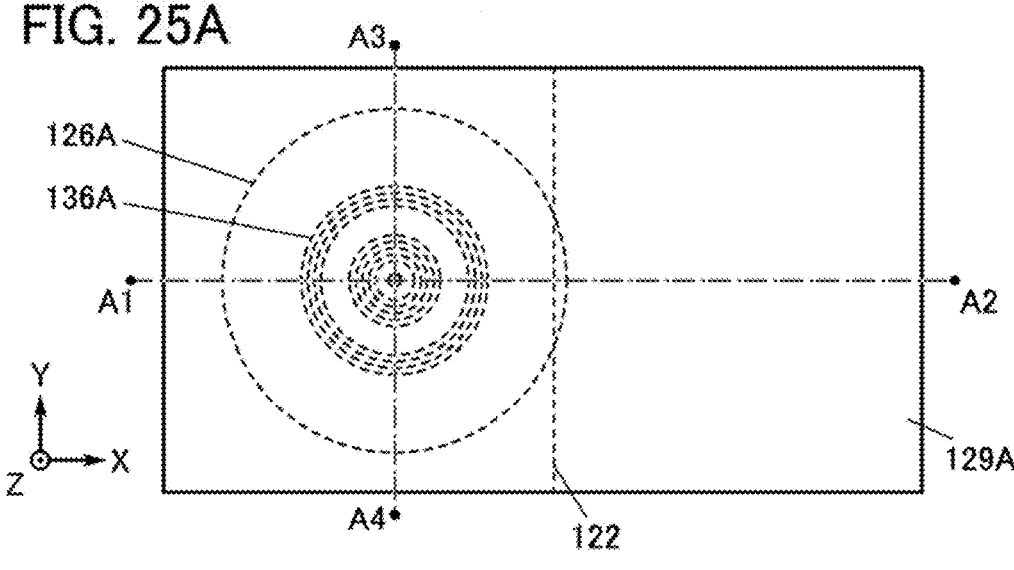
FIG. 25B
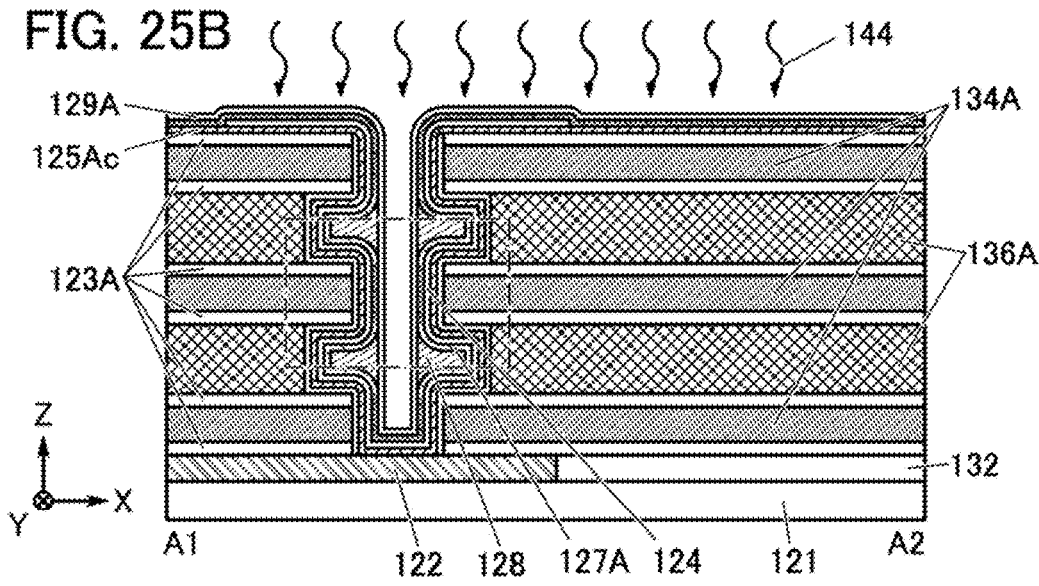
FIG. 25C
FIG. 25D
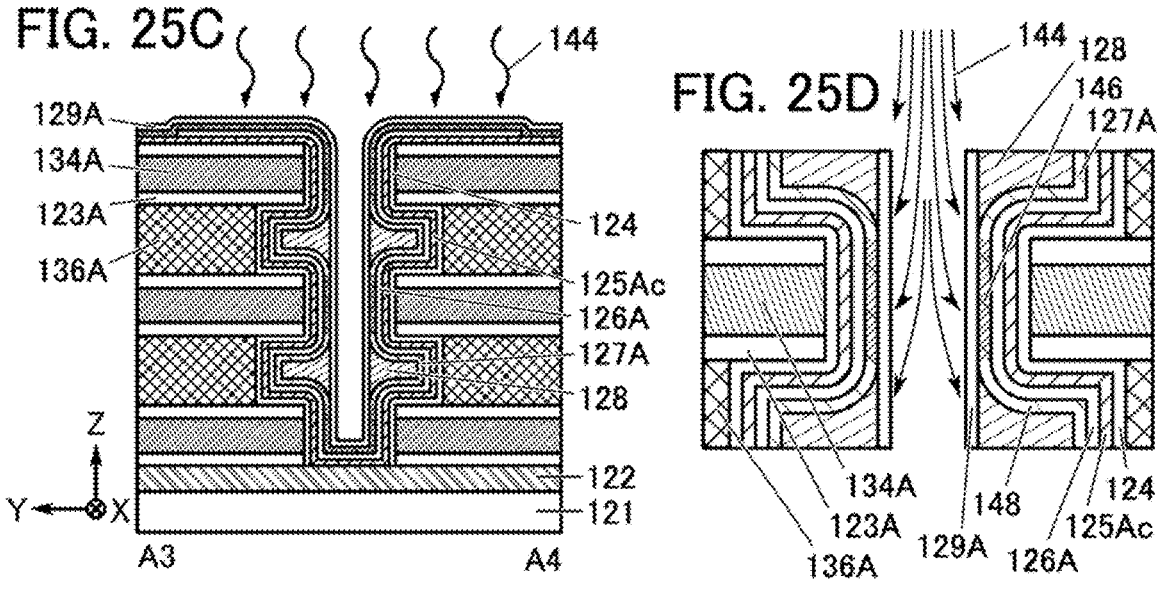

FIG. 26A
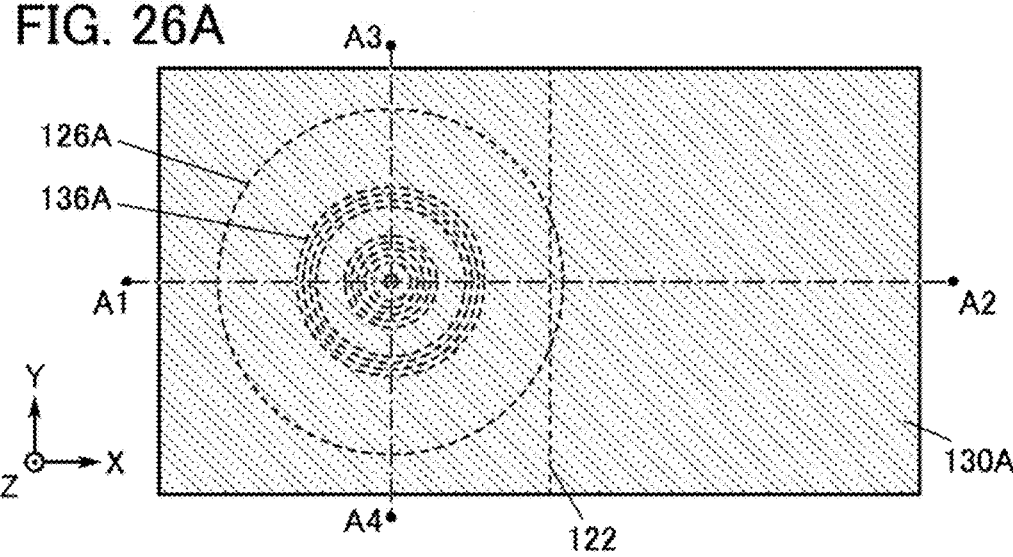
FIG. 26B
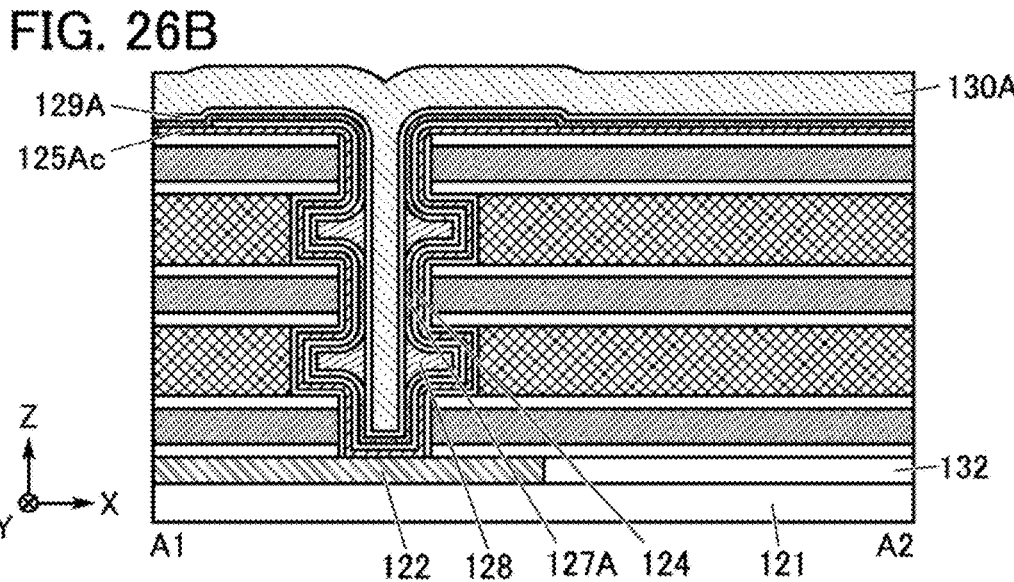
FIG. 26C

FIG. 27A
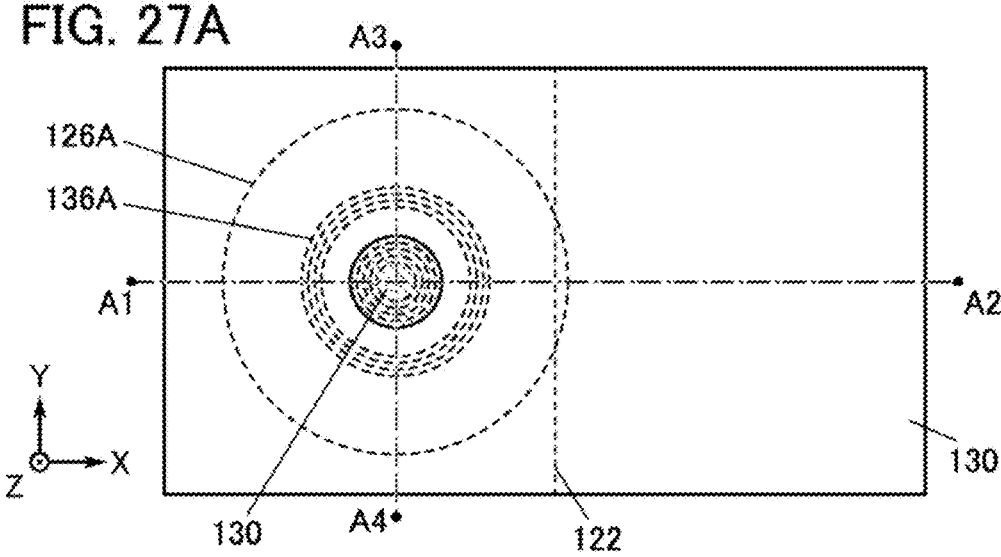
FIG. 27B
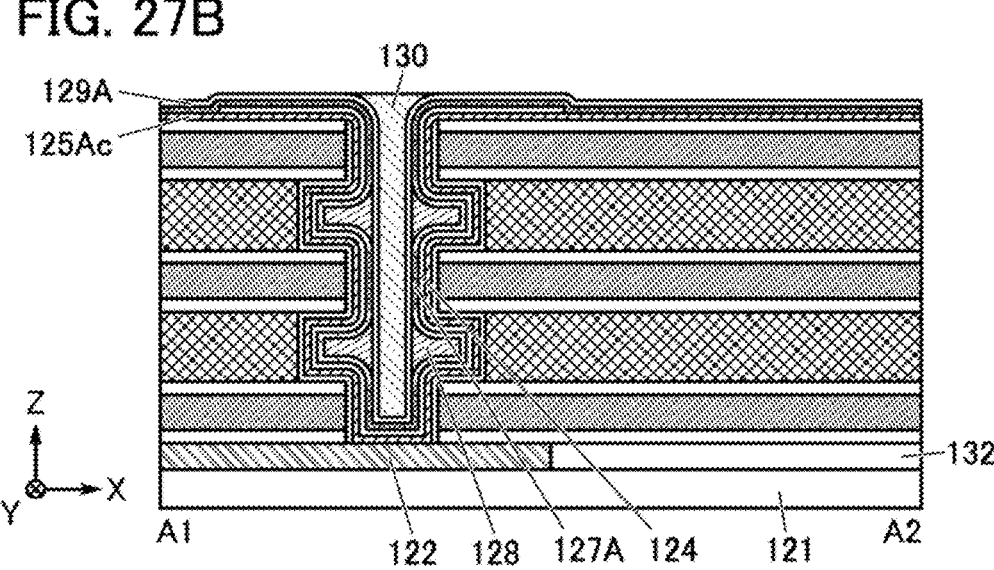
FIG. 27C

FIG. 28A
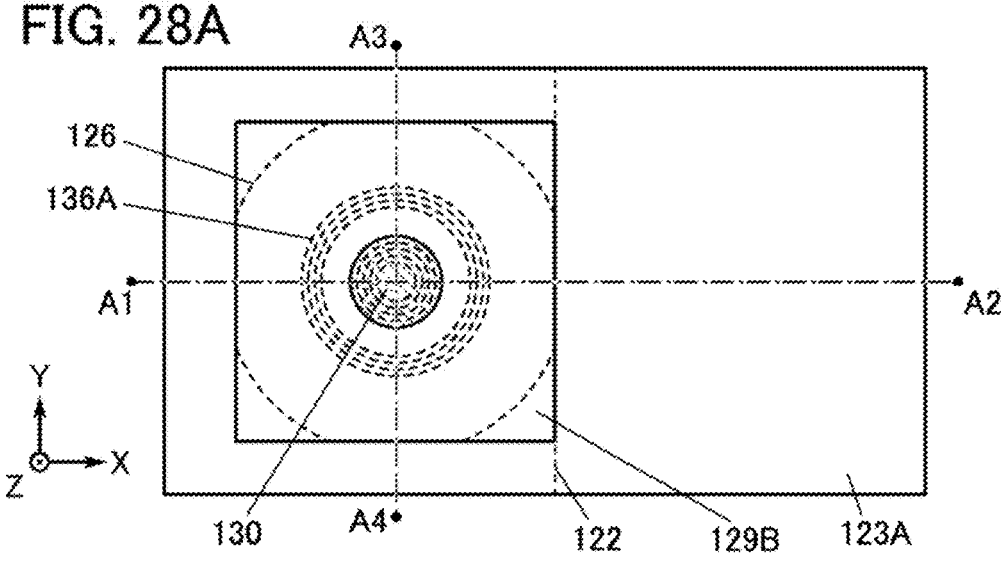
FIG. 28B
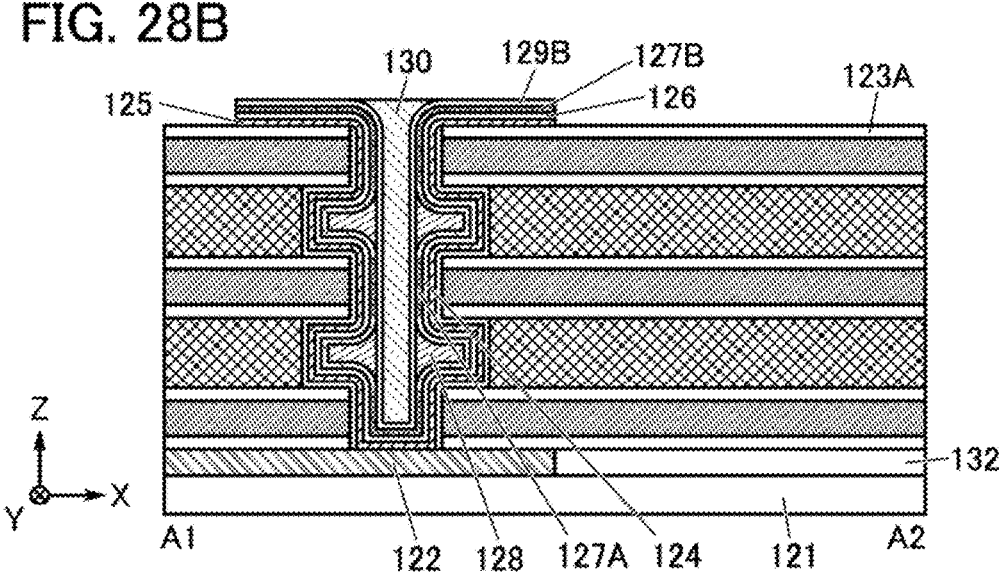
FIG. 28C

FIG. 51A
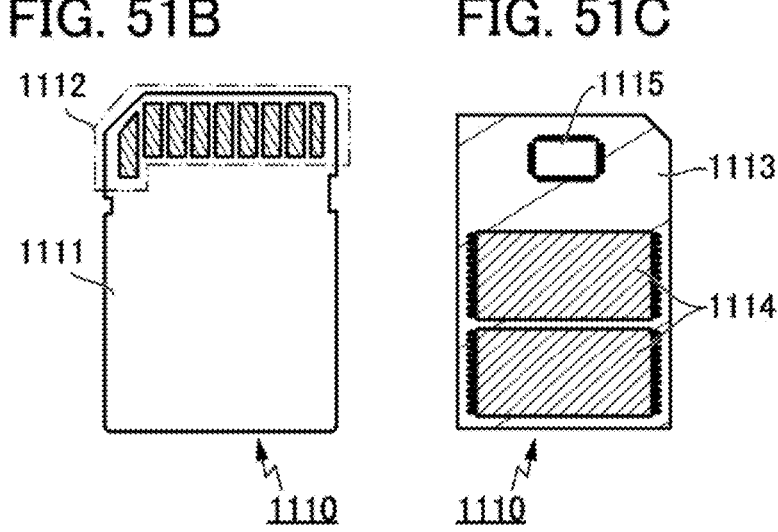
FIG. 51B
FIG. 51C
FIG. 51D
FIG. 51E
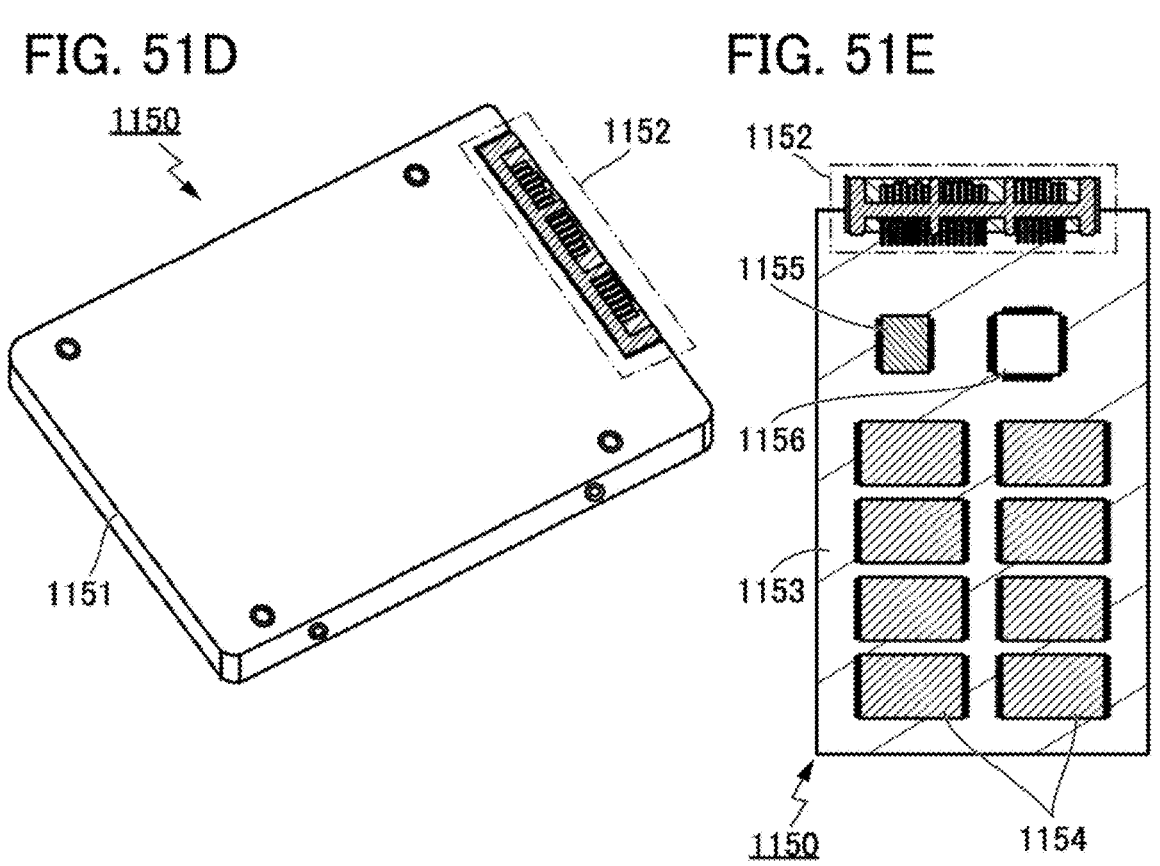

5100

5102

5101

5200

5202

5201

5203

5300

5301

5304

5303

5302

5306    5305

5400

5402

5500

5501

5502

5502

5504

5800

5801

5802

5803

CRYSTALLINE OXIDE SEMICONDUCTOR MEMORY DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, semiconductor elements such as a transistor and a diode and a circuit including a semiconductor element are semiconductor devices. A display device, a light-emitting device, a lighting device, an electro-optical device, a memory device, an imaging device, a communication device, an electronic device, and the like may include a semiconductor element or a semiconductor circuit. A display device, a light-emitting device, a lighting device, an electro-optical device, a memory device, an imaging device, a communication device, an electronic device, and the like may be referred to as a semiconductor device.

BACKGROUND ART

In recent years, with an increasing amount of data subjected to processing, a semiconductor device having a larger storage capacity has been required. A memory device with a three-dimensional structure in which memory cells are stacked to increase the storage capacity per unit area is known (Patent Document 1). In the memory device with a three-dimensional structure, a semiconductor layer is often provided to extend in a direction of stacking the memory cells. In addition, in the memory device with a three-dimensional structure, a semiconductor that contains a large number of grain boundaries, such as polycrystalline silicon, is often used for the semiconductor layer.

Polycrystalline silicon or the like contains a large number of grain boundaries, which makes it difficult to improve the operation speed and reduce variations in performance between memory cells, for example. A crystallization technique in which crystalline silicon is formed by using nickel (Ni) or the like as a catalytic element, for the purposes such as reducing grain boundaries and increasing the crystal size, is known (Patent Document 2). Patent Document 2 discloses a mechanism of crystal growth using a catalytic element and also a technical idea of fixing the catalytic element used for crystallization in a gettering region.

Patent Document 3 discloses a technical idea of applying a crystallization technique using a catalytic element to a memory device with a three-dimensional structure. Furthermore, an oxide semiconductor, which is one kind of metal oxide, has attracted attention in recent years. Non-patent Document 1 discloses CAAC-IGZO as an oxide semiconductor. Non-patent Document 1 also discloses the growth mechanism and the like of the CAAC-IGZO.

REFERENCE

Patent Document

[Patent Document 1] United States Patent Application Publication No. 2011/0065270A1

[Patent Document 2] Japanese Published Patent Application No. 2000-133594
[Patent Document 3] Japanese Published Patent Application No. 2019-054220

Non-Patent Document

[Non-Patent Document 1] Noboru Kimizuka and Shunpei Yamazaki, "PHYSICS AND TECHNOLOGY OF CRYSTALLINE OXIDE SEMICONDUCTOR CAAC-IGZO" FUNDAMENTALS (the United States), Wiley-SID Series in Display Technology, 2017, p. 94-97

SUMMARY OF THE INVENTION

Problems to be Solved by the Invention

An object of one embodiment of the present invention is to provide a highly reliable memory device. Another object is to provide a memory device with a large storage capacity. Another object is to provide a memory device that occupies a small area. Another object is to provide a memory device that operates at high speed. Another object is to provide a memory device with low manufacturing cost. Another object is to provide a novel memory device. Another object is to provide a highly reliable semiconductor device. Another object is to provide a semiconductor device that occupies a small area. Another object is to provide a semiconductor device that operates at high speed. Another object is to provide a semiconductor device with low manufacturing cost. Another object is to provide a novel semiconductor device.

Note that the description of these objects does not preclude the existence of other objects. In one embodiment of the present invention, there is no need to achieve all the objects. Other objects are apparent from and can be derived from the description of the specification, the drawings, the claims, and the like.

Means for Solving the Problems

One embodiment of the present invention is a semiconductor device including a first semiconductor extending in a first direction, a second semiconductor extending in the first direction, and a plurality of memory cells lined up in the first direction. The memory cell includes a first transistor and a second transistor, part of the first semiconductor functions as a channel formation region of the first transistor, part of the second semiconductor functions as a channel formation region of the second transistor, the first semiconductor contains an oxide semiconductor, the second semiconductor contains silicon, the second semiconductor includes a region in contact with a first layer, and the first layer includes a first metal element.

Another embodiment of the present invention is a semiconductor device including a structural body extending in a first direction, a plurality of first conductors extending in a second direction that intersects with the first direction, and a plurality of second conductors extending in the second direction. The structural body includes a third conductor, a first insulator, a plurality of fourth conductors, a first semiconductor, a second insulator, a second semiconductor, and a third insulator. In each of intersecting portions of the plurality of first conductors and the structural body, the first insulator, the first semiconductor, the second insulator, the second semiconductor, and the third insulator are placed outside the third conductor in a concentric manner. In each of intersecting portions of the plurality of second conductors and the structural body, the first insulator, the fourth conductor, the first semiconductor, the second insulator, the second semiconductor, and the third insulator are placed outside the third conductor in a concentric manner. The first semiconductor contains an oxide semiconductor, the second semiconductor contains silicon, the second semiconductor includes a region in contact with a first layer, and the first layer includes a first metal element.

The first metal element is an element that functions as a catalytic element. Nickel can be used as the first metal element, for example. The first layer may contain an impurity element such as phosphorus.

The oxide semiconductor preferably contains at least one of indium and zinc. It is particularly preferable that indium and zinc are contained. As the oxide semiconductor, a variety of crystalline oxide semiconductors such as CAAC-OS, nc-OS, and a-like OS can be used.

Effect of the Invention

According to one embodiment of the present invention, a highly reliable memory device can be provided. Alternatively, a memory device a large storage capacity can be provided. Alternatively, a memory device that occupies a small area can be provided. Alternatively, a memory device that can operate at high speed can be provided. Alternatively, a memory device with low manufacturing cost can be provided. Alternatively, a novel memory device can be provided. Alternatively, a highly reliable semiconductor device can be provided. Alternatively, a semiconductor device that occupies a small area can be provided. Alternatively, a semiconductor device that can operate at high speed can be provided. Alternatively, a semiconductor device with low manufacturing cost can be provided. Alternatively, a novel semiconductor device can be provided.

Note that the description of these effects does not preclude the existence of other effects. One embodiment of the present invention does not have to have all these effects. Other effects will be apparent from and can be derived from the description of the specification, the drawings, the claims, and the like.

BRIEF DESCRIPTION OF THE DRAWINGS

FIG. 11A is a diagram showing the classification of crystal structures of oxide semiconductors.

FIG. 11B is a diagram showing an XRD spectrum of a CAAC-IGZO film. FIG. 11C is an image showing a nano-beam electron diffraction pattern of a CAAC-IGZO film.

FIG. 21A to FIG. 21C are cross-sectional views illustrating a process for manufacturing a semiconductor device of one embodiment of the present invention.

FIG. 25A to FIG. 25D are cross-sectional views illustrating a process for manufacturing a semiconductor device of one embodiment of the present invention.

FIG. 26A to FIG. 26C are cross-sectional views illustrating a process for manufacturing a semiconductor device of one embodiment of the present invention.

FIG. 27A to FIG. 27C are cross-sectional views illustrating a process for manufacturing a semiconductor device of one embodiment of the present invention.

FIG. 28A to FIG. 28C are cross-sectional views illustrating a process for manufacturing a semiconductor device of one embodiment of the present invention.

FIG. 51A to FIG. 51E are each a diagram for describing an example of a memory device.

MODE FOR CARRYING OUT THE INVENTION

Figure 1:
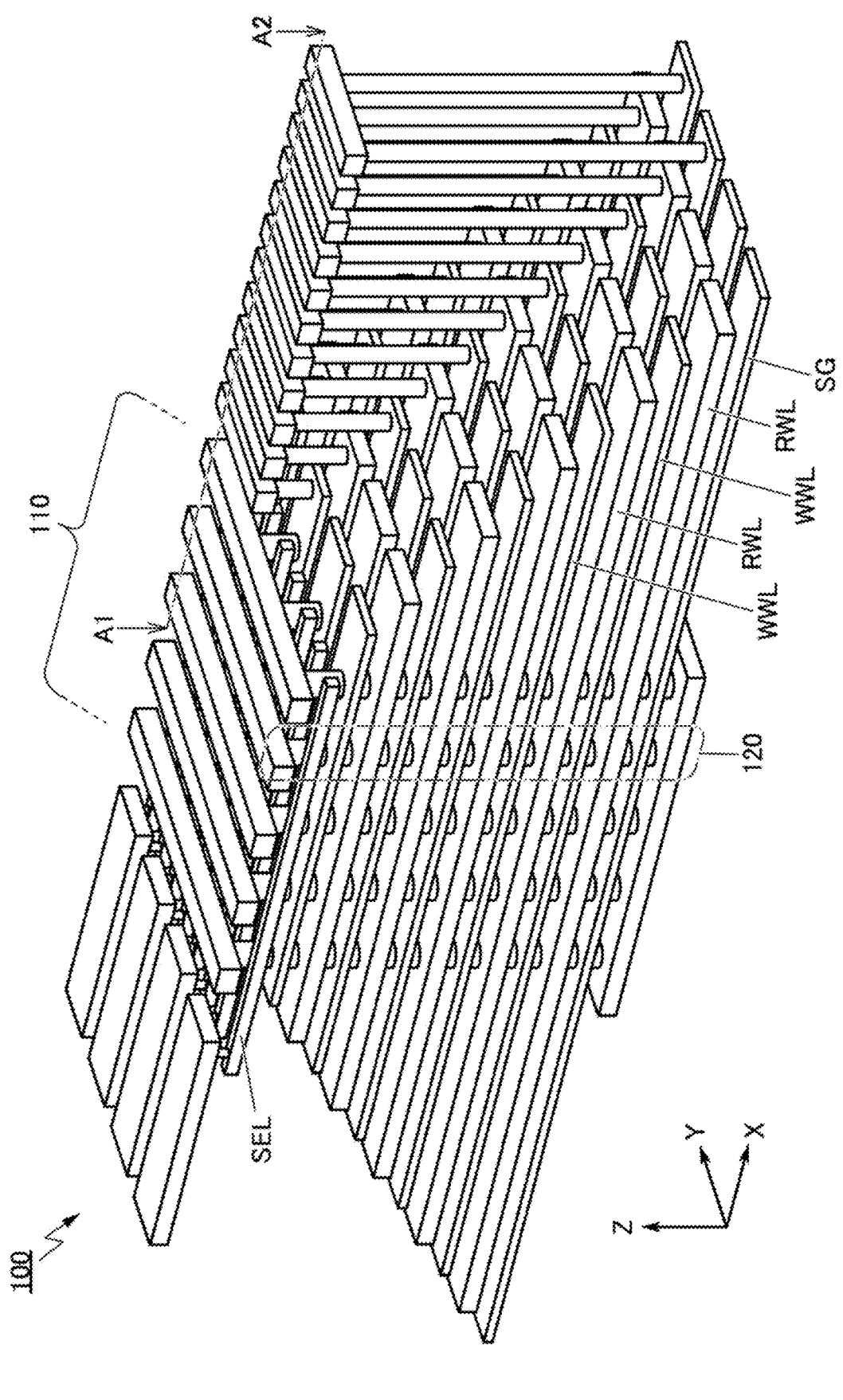
FIG. 1 is a perspective view of a memory device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases to facilitate understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In drawings and the like, some components might be omitted for easy understanding of the explanation.

In addition, in this specification and the like, the terms "electrode" and "wiring" do not functionally limit these components. For example, an "electrode" is used as part of a "wiring" in some cases, and vice versa. Furthermore, the term "electrode" or "wiring" include the case where a plurality of "electrodes" or "wirings" are formed in an integrated manner, for example.

In this specification and the like, a "terminal" in an electric circuit refers to a portion that inputs or outputs a current or a voltage or receives or transmits a signal. Accordingly, part of a wiring or an electrode functions as a terminal in some cases.

Note that the terms "over" and "under" in this specification and the like do not necessarily mean that a component is placed directly over and in contact with or directly under and in contact with another component. For example, the expression "an electrode B over an insulating layer A" does not necessarily mean that the electrode B is formed over and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function." There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to $-10°$ and less than or equal to $10°$, for example. Accordingly, the case where the angle is greater than or equal to $-5°$ and less than or equal to $5°$ is also included. Furthermore, the terms "perpendicular" and "orthogonal" indicate a state where two straight lines are placed at an angle of greater than or equal to $80°$ and less than or equal to $100°$, for example. Accordingly, the case where the angle is greater than or equal to $85°$ and less than or equal to $95°$ is also included.

In this specification and the like, the terms "identical", "same", "equal", "uniform", and the like used in describing calculation values and measurement values or in describing objects, methods, events, and the like that can be converted into calculation values or measurement values allow for a margin of error of $±20\%$ unless otherwise specified.

The terms "adjacent" and "proximity" in this specification and the like do not necessarily mean that a component is directly in contact with another component. For example, the expression "an electrode B adjacent to an insulating layer A" does not necessarily mean that the insulating layer A and the electrode B are formed in direct contact with each other, and does not exclude the case where another component is placed between the insulating layer A and the electrode B.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator." In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor." In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are regarded as being electrically short-circuited (also referred to as a "conducting state"). Furthermore, an "off state" of a transistor refers to a state in which a source and a drain of the transistor are regarded as being electrically disconnected (also referred to as a "non-conducting state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS," "L potential," or "L"). VSS refers to a power supply potential at a potential lower than VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

Unless otherwise specified, transistors described in this specification and the like are enhancement (normally-off) n-channel field-effect transistors. Thus, the threshold voltage (also referred to as "Vth") is higher than 0 V. Furthermore, unless otherwise specified, "an H potential is supplied to a gate of a transistor" means that "the transistor is brought into an on state" in some cases. Also, unless otherwise specified, "an L potential is supplied to a gate of a transistor" means that "the transistor is brought into an off state" in some cases.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potential of a wiring, an electrode, a conductor, or the like, "H" representing an H potential or "L" representing an L potential is sometimes written near the wiring, the electrode, the conductor, or the like. In addition, enclosed "H" or "L" is sometimes written near a wiring, an electrode, a conductor, or the like whose potential has changed. Moreover, a symbol "×" is sometimes written on a transistor in an off state.

In general, a "capacitor" has a structure in which two electrodes face each other with an insulator (dielectric) therebetween. This specification and the like include a case where a "capacitor element" is the above-described "capacitor." That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, when a plurality of components are denoted by the same reference sign, and in particular need to be distinguished from each other, an identification numeral such as "a", "A", "_1", "_2", or "[m,n]" is sometimes added to the reference sign. For example, one of two wirings GL may be expressed as a wiring GLa and the other may be expressed as a wiring GLb.

Embodiment 1

Figure 2:
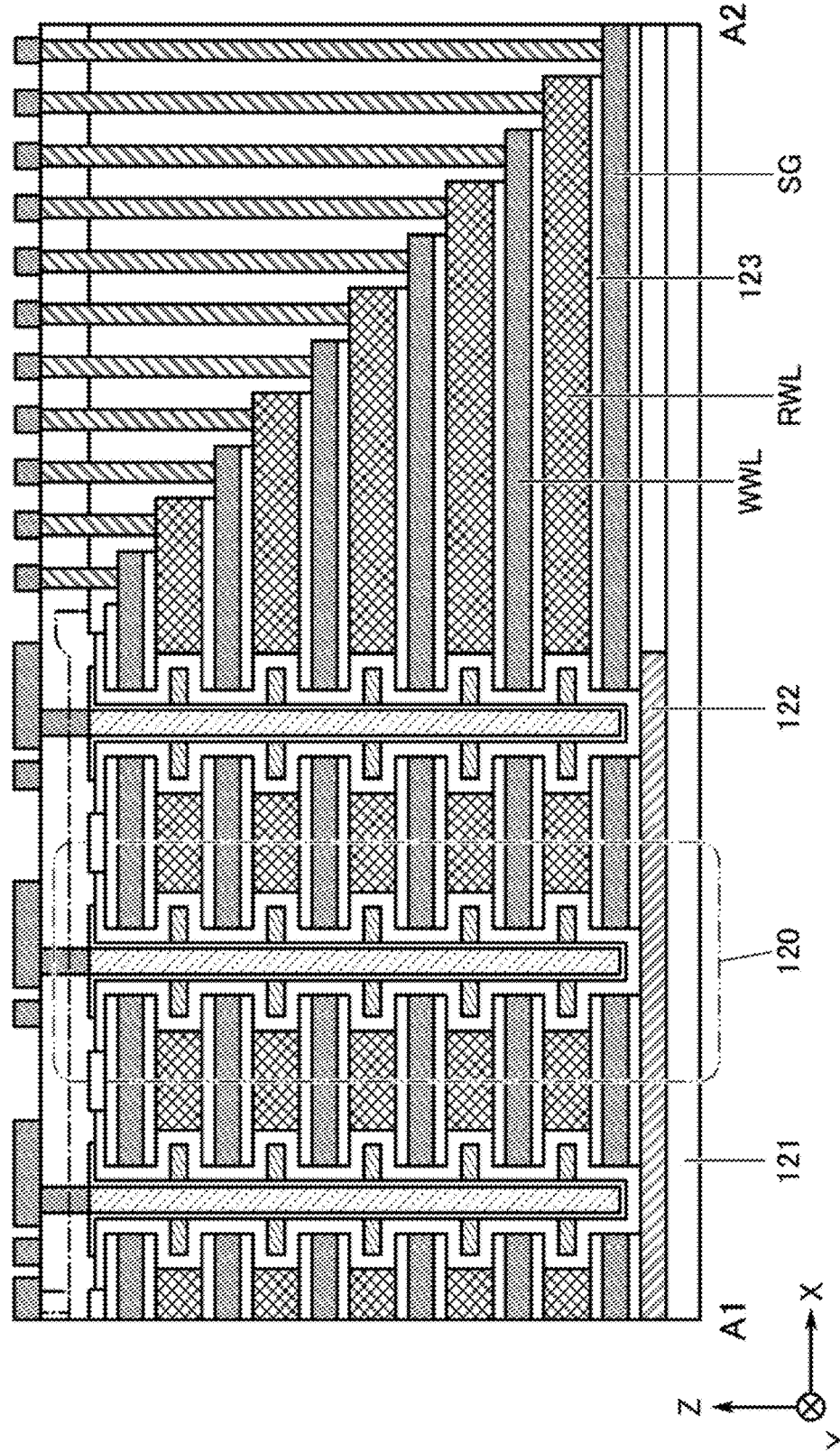
FIG. 2 is a cross-sectional view of a memory device.

FIG. 1 is a perspective view of a memory device 100 of one embodiment of the present invention. The memory device 100 is a memory device having a three-dimensional stacked-layer structure. FIG. 2 is a cross-sectional view of a portion A1-A2 indicated by a dashed-dotted line in FIG. 1. Note that arrows indicating the X direction, the Y direction, and the Z direction are illustrated in some drawings such as FIG. 1. The X direction, the Y direction, and the Z direction are directions orthogonal to each other. In this specification and the like, a direction perpendicular to a top surface of a base 121 described later is the Z direction.

In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

FIG. 2 illustrates a cross section along the X-Z plane. As described above, some components might be omitted in FIG. 1, FIG. 2, and the like to make the explanation easier to understand.

<Structure Example of Memory Device>

Figure 3:
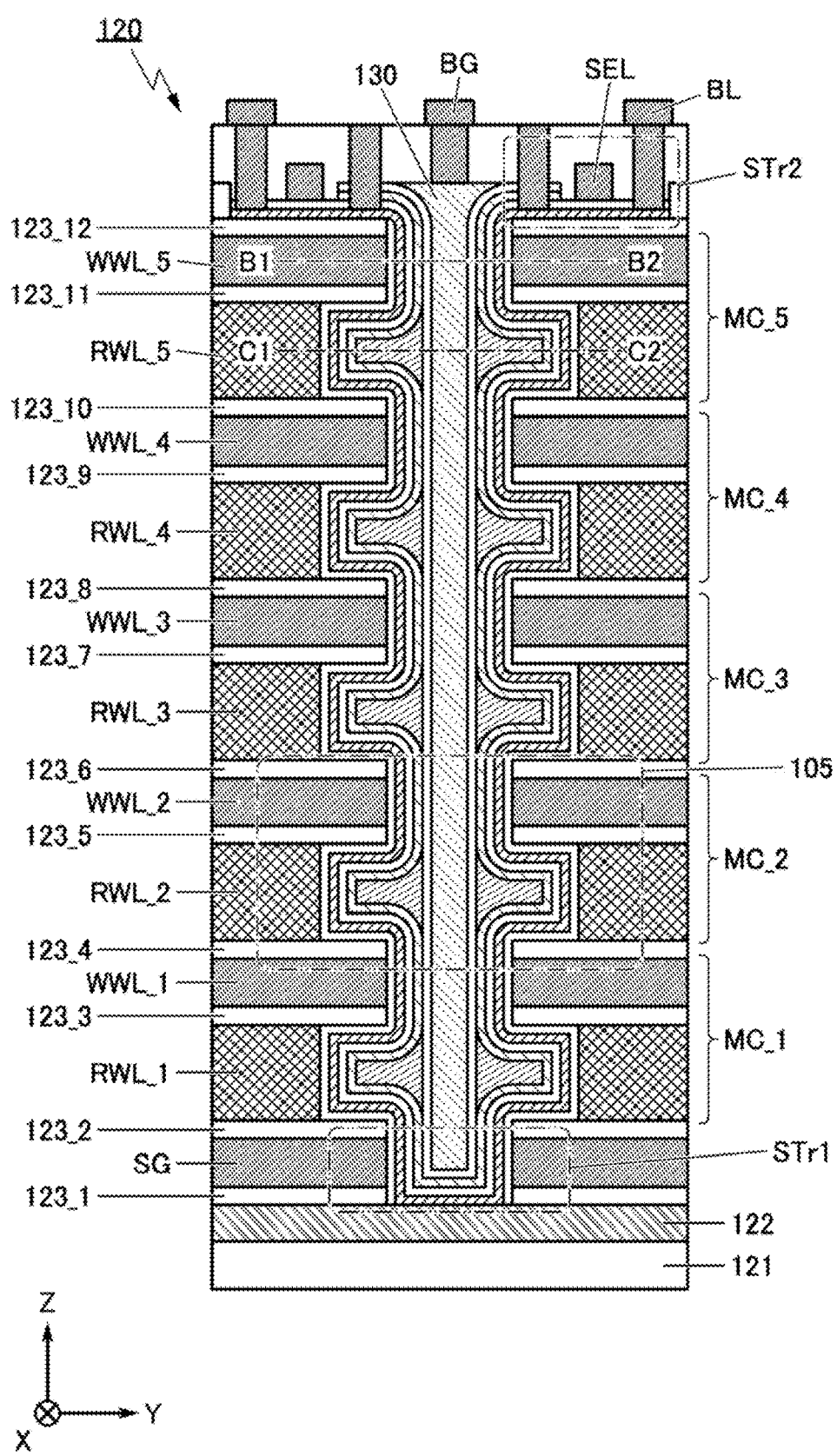
FIG. 3 is a cross-sectional view of a memory string.

The memory device 100 of one embodiment of the present invention includes a memory cell array 110 (see FIG. 1). The memory cell array 110 includes a plurality of memory strings 120. The memory strings 120 extend in the Z direction and are arranged in a matrix on the X-Y plane. FIG. 3 illustrates a cross-sectional structure example of the memory string 120.

The memory string 120 includes a plurality of memory elements MC (also referred to as memory cells) lined up in the Z direction. In other words, the memory string 120 includes a plurality of memory elements MC connected in series. Although the case where five memory elements MC are connected in series is shown in FIG. 3, the number of memory elements MC provided in the memory string 120 is not limited to five. Given that the number of memory elements MC provided in the memory string 120 is n, n is an integer of 2 or greater.

FIG. 3 illustrates five memory elements MC as a memory element MC_1 to a memory element MC_5. Note that the memory element MC_1 to the memory element MC_5 are simply referred to as the "memory element MC" when matters common to these memory elements are explained. The same applies to other components such as a conductor WWL, a conductor RWL, and an insulator 123.

The memory string 120 includes a transistor STr1 electrically connected to the memory element MC_1 and a transistor STr2 electrically connected to the memory element MC_5.

The memory device 100 also includes a plurality of conductors WWL, a plurality of conductors RWL, and a conductor SG over the base 121. The plurality of conductors WWL, the plurality of conductors RWL, and the conductor SG extend in the X direction (see FIGS. 1 and FIG. 2). The conductors WWL, the conductors RWL, and the conductor SG include a region overlapping with the memory cell array 110. The conductors WWL, the conductors RWL, and the conductor SG are stacked stepwise outside the memory cell array 110.

The conductor SG is provided in a layer below the plurality of conductors WWL and the plurality of conductors RWL. In FIG. 3, a layer 122 is provided over the base 121, an insulator 123_1 is provided over the layer 122, and the conductor SG is provided over the insulator 123_1. The conductors WWL and the conductors RWL are alternately stacked with insulators 123 therebetween. In FIG. 3, for example, an insulator 123_2 is provided over the conductor SG, a conductor RWL_1 is provided over the insulator 123_2, an insulator 123_3 is provided over the conductor RWL_1, a conductor WWL_1 is provided over the insulator 123_3, and an insulator 123_4 is provided over the conductor WWL_1. Note that the layer 122 functions as a gettering layer, as will be described in detail later.

Figure 4:
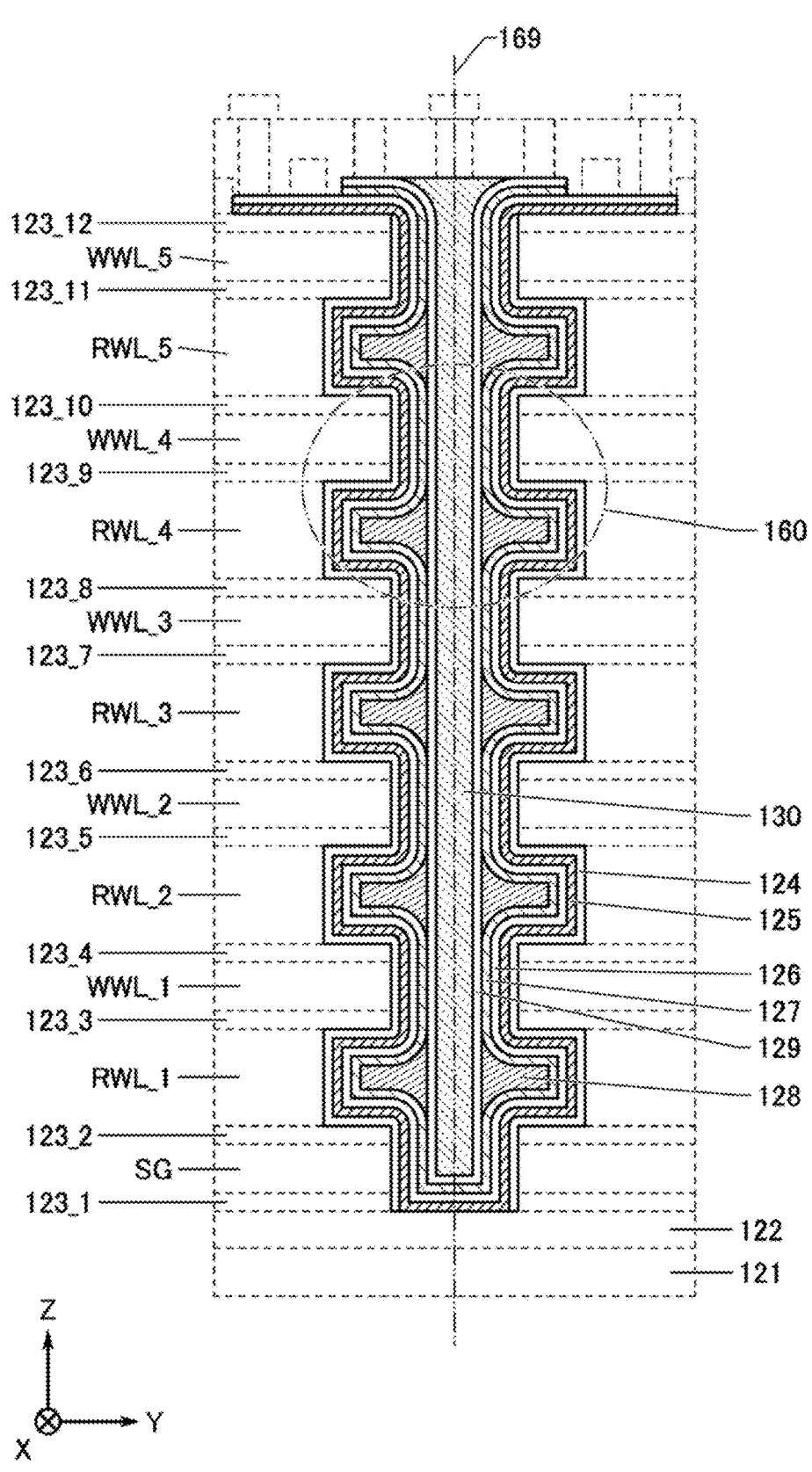
FIG. 4 is a cross-sectional view of a memory string.

The memory string 120 includes a structural body 160. The structural body 160 is provided to penetrate through the conductor WWL, the conductor RWL, the conductor SG, and the insulator 123. The structural body 160 includes a region in contact with the layer 122. A cross-sectional structure example of the structural body 160 is shown in FIG. 4. Note that FIG. 4 and FIG. 3 are cross-sectional views of the same portion. In FIG. 4, the conductor WWL, the conductor RWL, the conductor SG, the insulator 123, the layer 122, the base 121, and the like are indicated by dashed lines.

The structural body 160 has a columnar structure including a conductor 130, an insulator 129, a semiconductor 127, an insulator 126, a semiconductor 125, an insulator 124, and a plurality of conductors 128. In FIG. 4, a central axis 169 of the memory string 120 extending in the Z direction is indicated by a dashed double-dotted line. More specifically, the conductor 130 extends along the central axis 169, and the insulator 129 is provided to be adjacent to a side surface of the conductor 130. The semiconductor 127 is provided to be adjacent to the insulator 129, and the insulator 126 is provided to be adjacent to the semiconductor 127. The semiconductor 125 is provided to be adjacent to the insulator 126, and the insulator 124 is provided to be adjacent to the semiconductor 125. The semiconductor 125 includes a region in contact with the layer 122. In the structural body 160, the conductor 128 is provided between the insulator 129 and the semiconductor 127 in a portion where the conductor RWL and the structural body 160 intersect with each other.

Figure 5A:
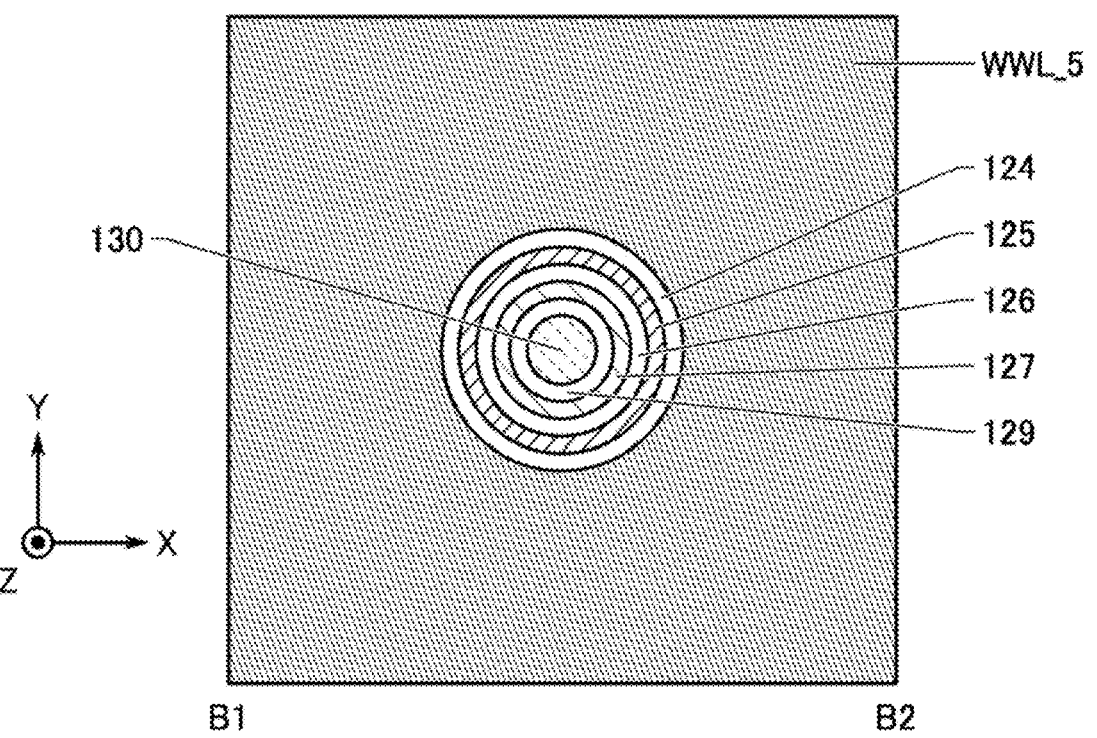
FIG. 5A and FIG. 5B are each a cross-sectional view of a memory string.

FIG. 5A shows a cross-section view of a portion B1-B2 indicated by a dashed-dotted line in FIG. 3 seen from the Z direction. FIG. 5A is a cross-sectional view of a portion where the conductor WWL and the structural body 160 intersect with each other. In this intersecting portion, each of the insulator 129, the semiconductor 127, the insulator 126, the semiconductor 125, and the insulator 124 is provided outside the conductor 130 in a concentric manner.

Figure 5B:
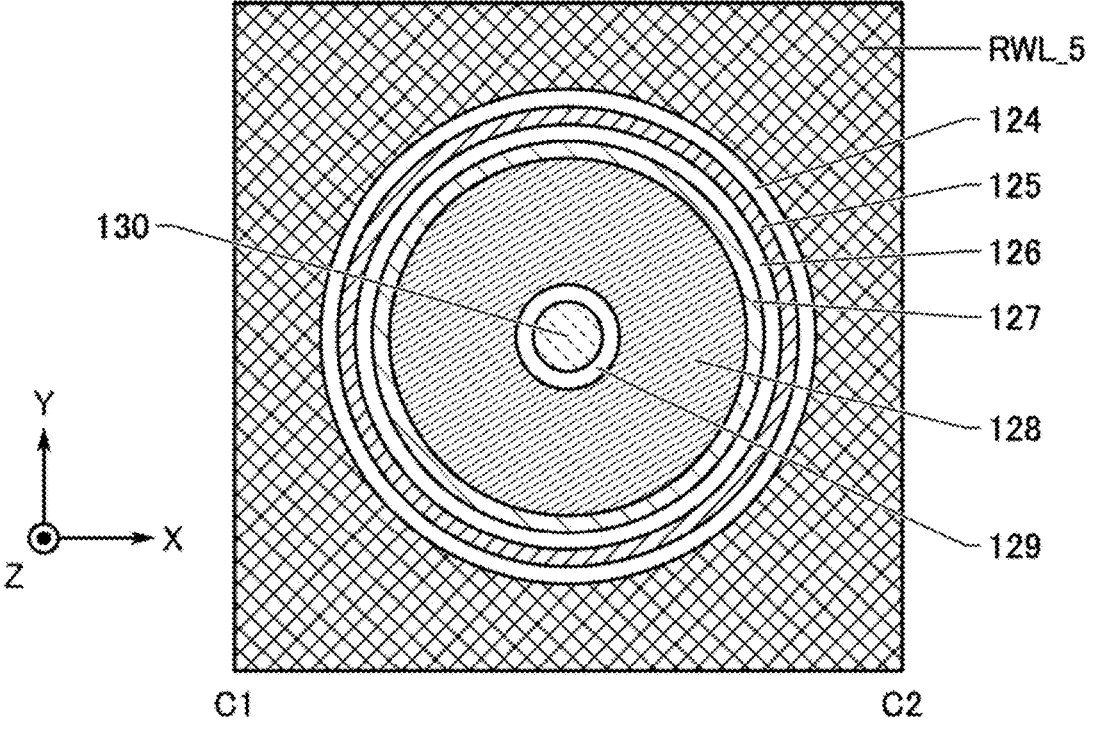

FIG. 5B shows a cross-sectional view of a portion C1-C2 indicated by a dashed-dotted line in FIG. 3 seen from the Z direction. FIG. 5B is a cross-sectional view of a portion where the conductor RWL and the structural body 160 intersect with each other. In this intersecting portion, each of the insulator 129, the conductor 128, the semiconductor 127, the insulator 126, the semiconductor 125, and the insulator 124 is provided outside the conductor 130 in a concentric manner.

Figure 6A:
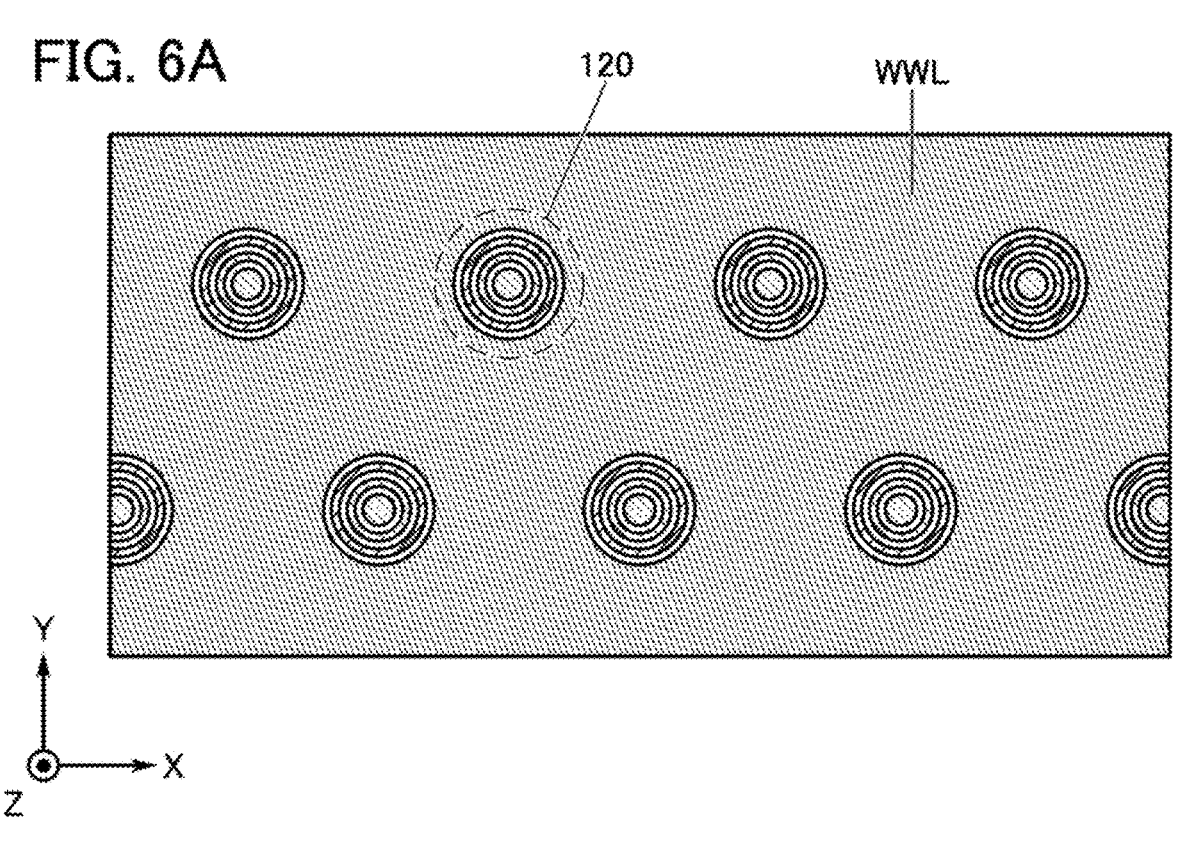
FIG. 6A and FIG. 6B are each a cross-sectional view of memory strings.
Figure 6B:
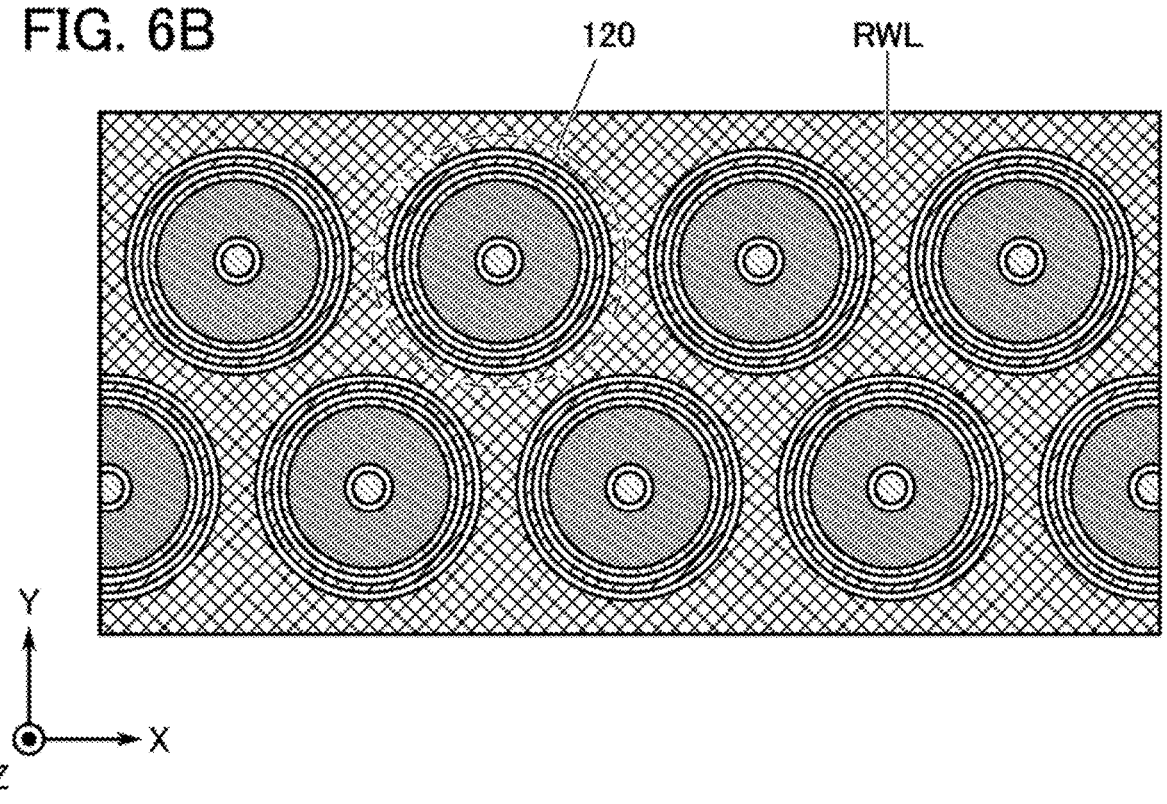

FIG. 5A and FIG. 5B illustrate cross sections (X-Y cross sections) of one memory string 120, while FIG. 6A and FIG. 6B illustrate an example where the plurality of memory strings 120 are provided. The plurality of memory strings 120 may be arranged in the X direction, in the Y direction, or in a matrix.

Figures 7A, 7B:
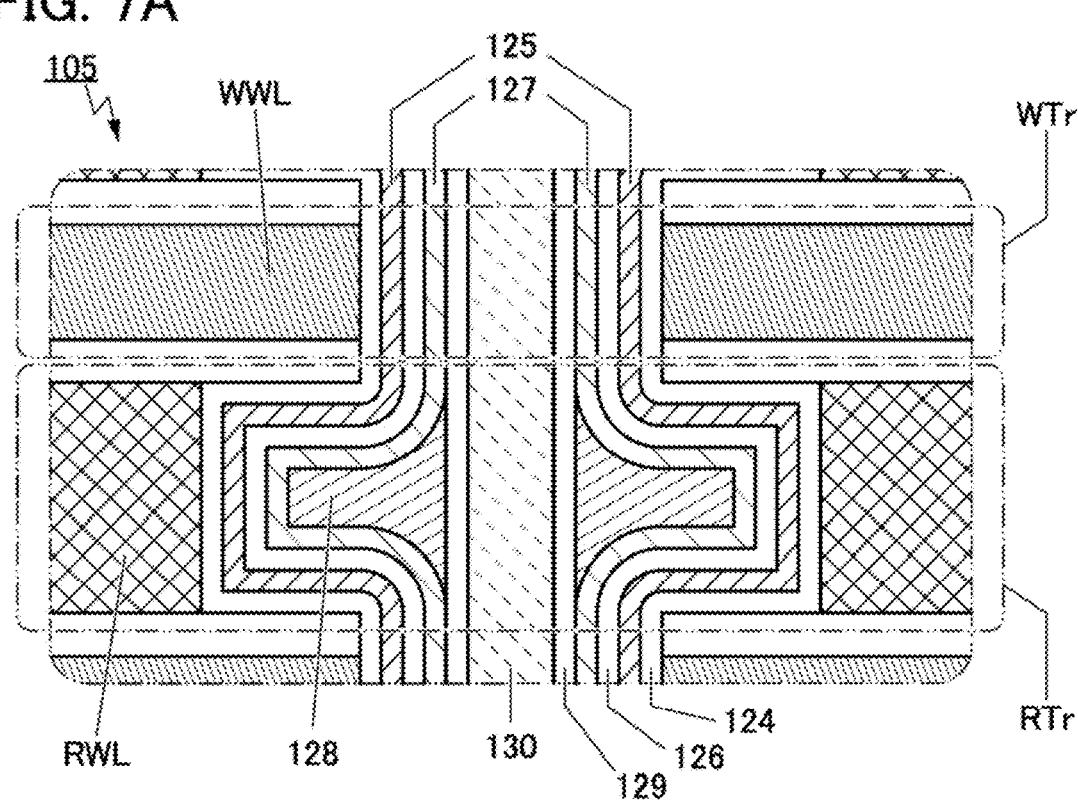
FIG. 7A is a cross-sectional view of a memory element.
FIG. 7B is a cross-sectional perspective view of the memory element.

FIG. 7A illustrates an enlarged diagram of a region 105 indicated by a dashed double-dotted line in FIG. 3. FIG. 7A corresponds to a cross-sectional view of the memory element MC. FIG. 7B is a perspective cross-sectional view of the memory element MC. For easy understanding of the structure of the memory element MC, the insulator 123 is not illustrated in FIG. 7B.

A portion where the conductor WWL and the structural body 160 intersect with each other functions as a transistor WTr. A portion where the conductor RWL and the structural body 160 intersect with each other functions as a transistor RTr. Specifically, the conductor WWL functions as a gate electrode of the transistor WTr, and the conductor 130 functions as a back gate electrode of the transistor WTr. Part of the semiconductor 127 functions as a semiconductor layer where a channel of the transistor WTr is formed. The semiconductor layer where the channel of the transistor WTr is formed overlaps with the gate electrode (the conductor WWL) with part of each of the insulator 126, the semiconductor 125, and the insulator 124 therebetween. Note that although part of the conductor WWL functions as the gate electrode in the example described in this embodiment and the like, the gate electrode and the conductor WWL may be provided independently and they may be electrically connected to each other.

The conductor 128 functions as a gate electrode of the transistor RTr. The conductor RWL functions as a back gate electrode of the transistor RTr. Part of the semiconductor 125 functions as a semiconductor layer where a channel of the transistor RTr is formed. The semiconductor layer where the channel of the transistor RTr is formed overlaps with the gate electrode (the conductor 128) with part of the insulator 126 therebetween. The semiconductor layer where the channel of the transistor RTr is formed overlaps with the back gate electrode (the conductor RWL) with part of the insulator 124 therebetween. Note that although part of the conductor RWL functions as the back gate electrode in the example described in this embodiment and the like, the back gate electrode and the conductor RWL may be provided independently and they may be electrically connected to each other.

It is preferable that the memory string 120 be divided along the Z direction, in which case the storage capacity per unit area can be increased. In the case where the memory strings 120 is divided along the Z direction, the conductor WWL and the conductor RWL may also be divided.

Figure 8A:
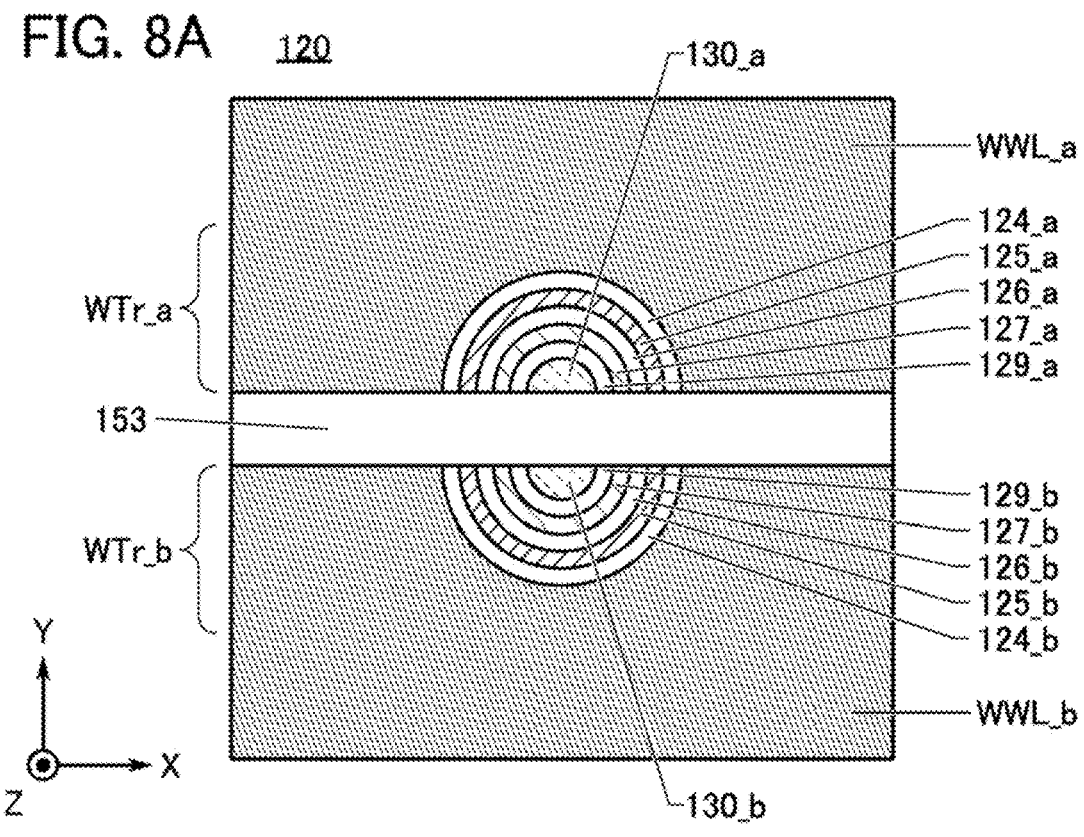
FIG. 8A and FIG. 8B are each a cross-sectional view of a memory string.
Figure 8B:
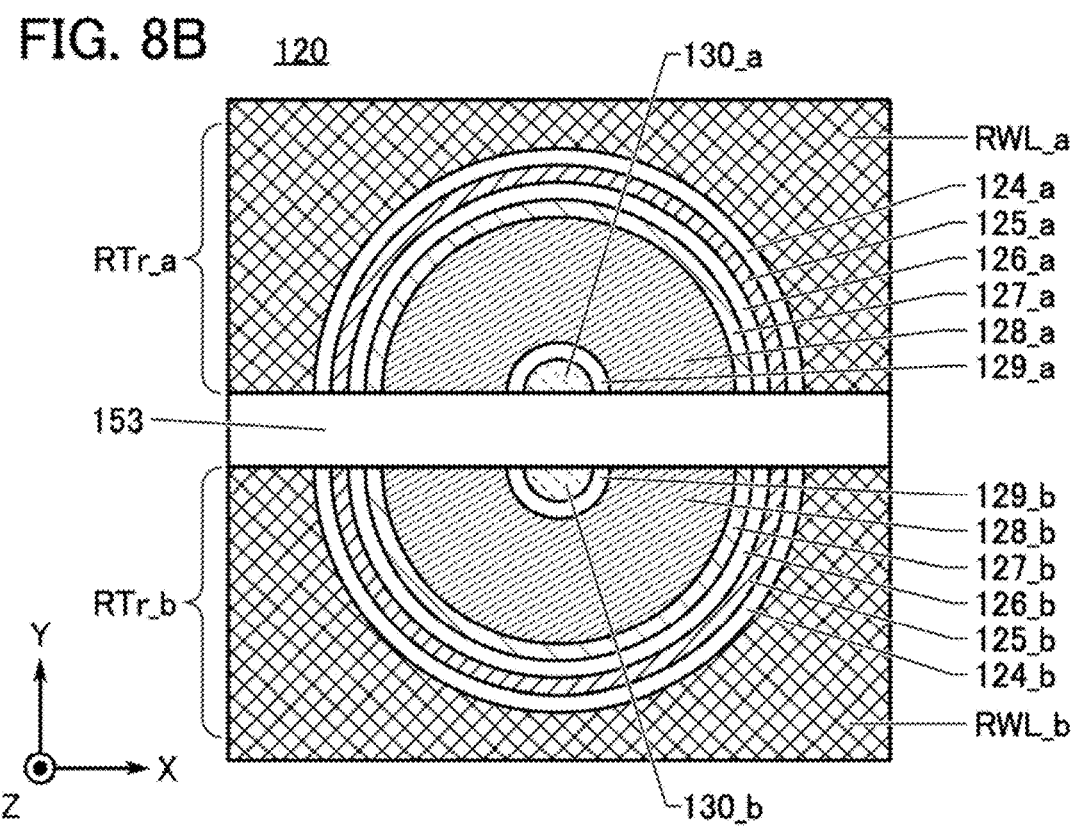

FIG. 8A illustrates a state where the conductor WWL and the memory string 120 are divided by an insulator 153 provided along the X-Z plane, and FIG. 8B illustrates a state where the conductor RWL and the memory string 120 are divided by the insulator 153 provided along the X-Z plane. Note that FIG. 8A corresponds to a variation of the cross section illustrated in FIG. 5A. FIG. 8B corresponds to a variation of the cross section illustrated in FIG. 5B. In FIG. 8 and the like, divided components are denoted with a orb added to the end of the reference numerals.

As illustrated in FIG. 8A, a region where a conductor WWL_a and a conductor 130_a overlap each other functions as a transistor WTr_a. Specifically, a region where the conductor WWL_a, an insulator 124_a, a semiconductor 125_a, an insulator 126_a, a semiconductor 127_a, an insulator 129_a, and the conductor 130_a overlap each other functions as the transistor WTr_a. The conductor WWL_a functions as a gate electrode of the transistor WTr_a, and the conductor 130_a functions as a back gate electrode of the transistor WTr_a. Part of the semiconductor 127_a functions as a semiconductor layer where a channel of the transistor WTr_a is formed. The semiconductor layer where the channel of the transistor WTr_a is formed overlaps with the gate electrode (the conductor WWL_a) with part of the insulator 124_a, part of the semiconductor 125_a, and part of the insulator 126_a therebetween.

A region where a conductor WWL_b and a conductor 130_b overlap with each other functions as a transistor WTr_b. Specifically, a region where the conductor WWL_b, an insulator 124_b, a semiconductor 125_b, an insulator 126_b, a semiconductor 127_b, an insulator 129_b, and the conductor 130_b overlap each other functions as the transistor WTr_b. The conductor WWL_b functions as a gate electrode of the transistor WTr_b, and the conductor 130_b functions as a back gate electrode of the transistor WTr_b. Part of the semiconductor 127_b functions as a semiconductor layer where a channel of the transistor WTr_b is formed. The semiconductor layer where the channel of the transistor WTr_b is formed overlaps with the gate electrode (the conductor WWL_a) with part of the insulator 124_b, part of the semiconductor 125_b, and part of the insulator 126_b therebetween.

As illustrated in FIG. 8B, a region where a conductor RWL_a and the conductor 130_a overlap each other functions as a transistor RTr_a. Specifically, RWL_a, the insulator 124_a, the semiconductor 125_a, the insulator 126_a, the semiconductor 127_a, a conductor 128_a, the insulator 129_a, and the conductor 130_a function as the transistor RTr_a. The conductor RWL_a functions as a gate electrode of the transistor RTr_a. The conductor 130_a functions as a back gate electrode of the transistor RTr_a. Part of the semiconductor 125_a functions as a semiconductor layer where a channel of the transistor RTr_a is formed. The semiconductor layer where the channel of the transistor RTr_a is formed overlaps with the gate electrode (the conductor RWL_a) with the insulator 124_a therebetween. The semiconductor layer where the channel of the transistor RTr_a is formed overlaps with the back gate electrode (the conductor 130_a) with part of the insulator 126_a, part of the semiconductor 127_a, part of the conductor 128_a, and part of the insulator 129_a therebetween.

Furthermore, a region where a conductor RWL_b and the conductor 130_b overlap each other functions as a transistor RTr_b. Specifically, RWL_b, the insulator 124_b, the semiconductor 125_b, the insulator 126_b, the semiconductor 127_b, a conductor 128_b, the insulator 129_b, and the conductor 130_b function as the transistor RTr_b. The conductor RWL_b functions as a gate electrode of the transistor RTr_b. The conductor 130_b functions as a back gate electrode of the transistor RTr_b. Part of the semiconductor 125_b functions as a semiconductor layer where a channel of the transistor RTr_b is formed. The semiconductor layer where the channel of the transistor RTr_b is formed overlaps with the gate electrode (the conductor RWL_b) with the insulator 124_b therebetween. The semiconductor layer where the channel of the transistor RTr_b is formed overlaps with the back gate electrode (the conductor 130_b) with part of the insulator 126_b, part of the semiconductor 127_b, part of the conductor 128_b, and part of the insulator 129_b therebetween.

Figure 9A:
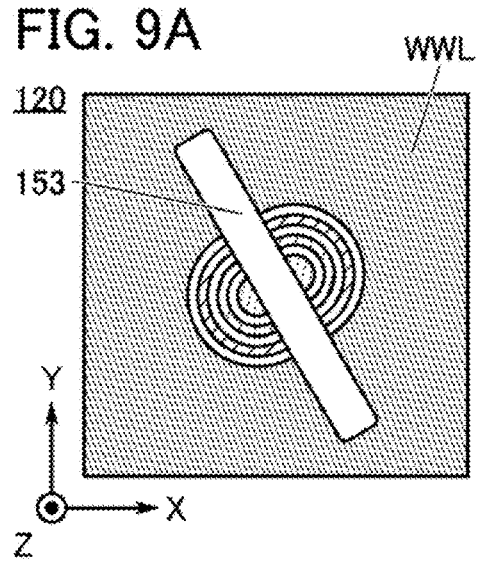
FIG. 9A to FIG. 9F are each a cross-sectional view of a memory string.
Figure 9B:
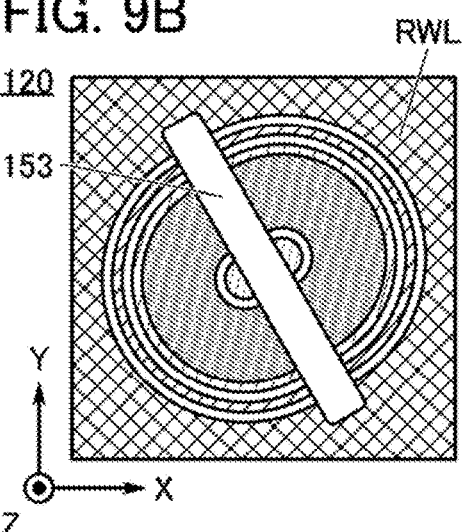
Figure 9C:
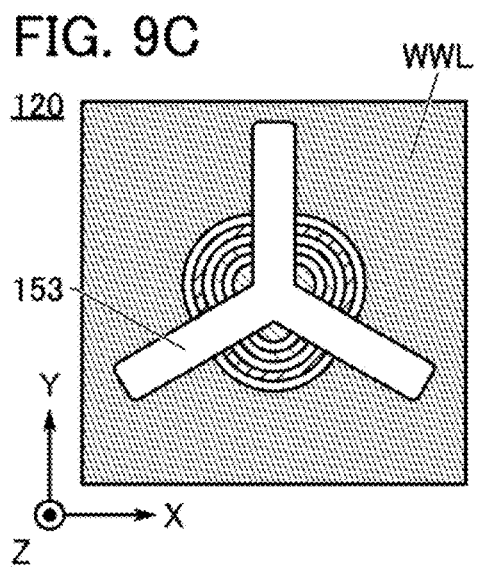
Figure 9D:
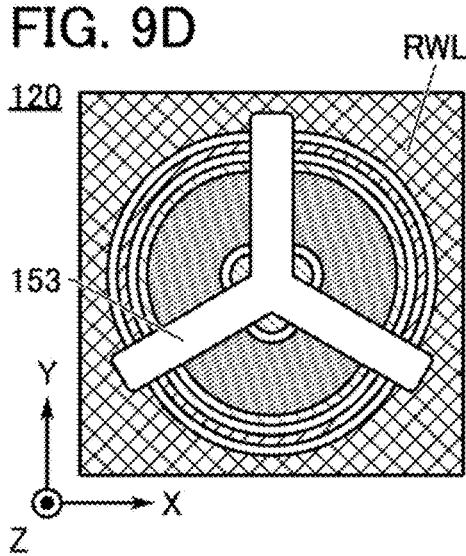
Figure 9E:
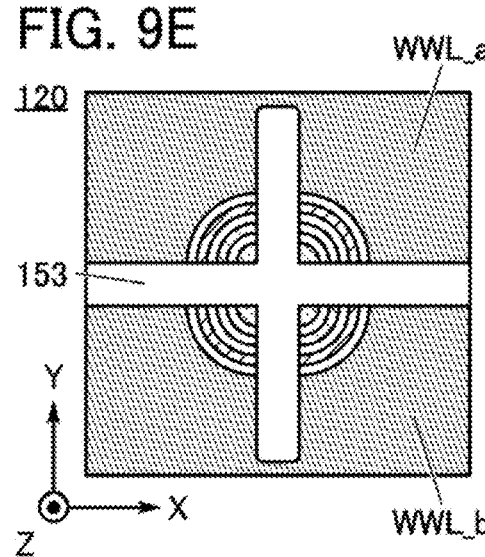
Figure 9F:
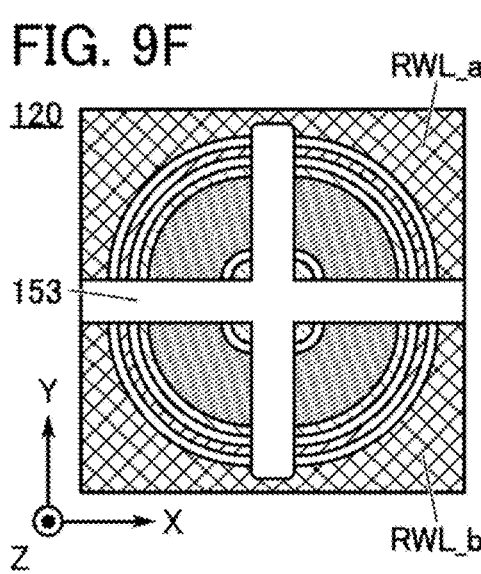

Dividing the conductor WWL, the conductor RWL, and the memory string 120 in the above-described manner can double the storage capacity per unit area. Note that the method for dividing the memory string 120 is not limited to the one described above. Although the memory string 120 is divided by the insulator 153 extending in the X direction in FIG. 8A and FIG. 8B, the insulator 153 may extend in a direction different from the X direction as illustrated in FIG. 9A and FIG. 9B. Furthermore, as illustrated in FIG. 9C to FIG. 9F, the memory string 120 may be divided into three or more parts. FIG. 9C and FIG. 9D each illustrate an example in which the memory string 120 is divided into three parts, and FIG. 9E and FIG. 9F each illustrate an example in which the memory string 120 is divided into four parts. In this manner, the storage capacity per unit area can be increased.

In FIG. 9A to FIG. 9F, the insulator 153 is preferably placed so as not to inhibit the conduction of the conductor WWL and the conductor RWL in the X direction.

Here, a back gate is described. A gate and a back gate are placed so as to overlap with each other with a channel formation region of a semiconductor layer therebetween. The back gate can function like the gate. By changing the potential of the back gate, the threshold voltage of the transistor can be changed. One of the gate and the back gate is referred to as a "first gate" and the other is referred to as a "second gate," in some cases.

The gate and the back gate are formed using conductive layers, semiconductor layers with low resistivity, or the like and thus each have a function of preventing an electric field generated outside the transistor from influencing the semiconductor layer where a channel is formed (particularly, a function of preventing static electricity). Specifically, a variation in the electrical characteristics of the transistor due to the influence of an external electric field such as static electricity can be prevented.

Controlling the potential of the back gate can control the threshold voltage of the transistor. The potential of the back gate may be the same as the potential of the gate or may be a ground potential (GND potential) or a given potential.

For the semiconductor layers where the channels of the transistor WTr and the transistor RTr are formed, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used. The same applies to the transistor STr1 and the transistor STr2.

Note that the semiconductor layers may be stacked in the transistor. In the case of stacking semiconductor layers, semiconductors having different crystal states may be used or different semiconductor materials may be used.

The transistor RTr is turned on when data retained in the memory device 100 is read. Thus, it is preferable to use a semiconductor material with high mobility as the semiconductor layer of the transistor RTr. It is preferable to use a semiconductor whose crystallinity is improved with the use of a catalytic element disclosed in Patent Document 2, for example, as such a semiconductor. A semiconductor whose crystallinity is improved with the use of a catalytic element includes less grain boundaries, and is capable of improving the operation speed of the transistor. In addition, variations in transistor characteristics are reduced, which stabilizes the operation of a semiconductor device and increases the reliability. Furthermore, a reduction of variations in transistor characteristics enables more memory elements MC to be provided in a memory string. Thus, the storage capacity per unit area can be increased. Thus, the area occupied by the semiconductor device can be reduced.

In this embodiment and the like, silicon whose crystallinity is improved (i.e., grain boundaries are reduced) with the use of nickel (Ni) as a catalytic element is used for the semiconductor layer of the transistor RTr. The manufacturing method will be described later.

The transistor WTr is a transistor for writing data to the memory device 100 and retaining the written data. The transistor WTr is mainly used in an off state, although it is turned on at the time of data writing operation. Thus, it is preferable that the transistor RTr be a transistor with a low off-state current. An oxide semiconductor, which is a kind of metal oxide, is preferably used as a semiconductor material used for the transistor having a low off-state current.

An oxide semiconductor has a band gap of 2 eV or more; thus, a transistor with an oxide semiconductor used as a semiconductor where a channel is formed (also referred to as an "OS transistor") has an extremely low off-state current. When an OS transistor is used as the transistor Wtr, data written to the memory element MC can be retained for a long period. When an OS transistor is used as the transistor included in the memory element MC, the memory element MC can be referred to as an "OS memory". The memory string 120 including such a memory element MC can also be referred to as an "OS memory". The memory device 100 can also be referred to as an "OS memory". An OS memory is a type of memory devices. Thus, each of the memory element MC and the memory string 120 is also a type of memory devices.

An OS memory can retain written data for a period of one year or longer, or 10 years or longer even after power supply is stopped. Thus, an OS memory can be regarded as a nonvolatile memory.

In an OS memory, the written data (charge amount) is less likely to change over a long period of time; hence, the OS memory can hold multilevel (multibit) data or analog value data as well as binary (1-bit) data.

Furthermore, an OS memory employs a method in which charge is written to a node through the transistor; hence, a high voltage, which is required for a conventional flash memory, is unnecessary and a high-speed writing operation is possible. In addition, an OS memory does not require erasing operation before data rewriting, which is performed in a flash memory. Moreover, an OS memory does not conduct charge injection and extraction to and from a floating gate or a charge-trap layer, substantially allowing an unlimited number of times of data write and read. An OS memory is less likely to degrade than a conventional flash memory and can have high reliability.

Unlike a magneto-resistive memory (MRAM), a resistance-change memory (ReRAM), and the like, an OS memory does not undergo a structure change at the atomic level. Hence, an OS memory has higher rewrite endurance than a magneto-resistive memory and a resistance-change memory.

The off-state current of an OS transistor hardly increases even in a high-temperature environment. Specifically, the off-state current hardly increases even at an environment temperature ranging from room temperature to 200° C. Furthermore, the on-state current is less likely to decrease even in a high-temperature environment. A memory device including an OS memory achieves stable operation and high reliability even in a high-temperature environment. Moreover, an OS transistor has high breakdown voltage between its source and drain. When OS transistors are used as transistors included in a semiconductor device, the semiconductor device achieves stable operation and high reliability even in a high temperature environment.

In this embodiment and the like, IGZO (a metal oxide containing In, Ga, and Zn) is used as an oxide semiconductor used for the semiconductor layer of the transistor WTr. As the oxide semiconductor used for the transistor WTr, a variety of crystalline oxide semiconductors such as CAAC-OS, nc-OS, and a-like OS can be used. An oxide semiconductor will be described in detail later.

The transistor WTr which performs data write and retention is preferably an enhancement type (normally-off type) transistor, in order to create an off state more reliably. The transistor RTr which performs data read is preferably a depletion type (normally-on type) transistor with a low threshold voltage, in order to achieve higher speed operation. Thus, it is preferable that the threshold voltage of the transistor RTr be lower than the threshold voltage of the transistor WTr.

In accordance with the purpose, use, or the like, the semiconductor 125 and the semiconductor 127 may contain the same material or different materials. For example, the semiconductor 125 and the semiconductor 127 may each be an oxide semiconductor. The semiconductor 125 and the semiconductor 127 may each be a semiconductor in which grain boundaries are reduced with the use of a catalytic element. It is also possible that the semiconductor 125 is an oxide semiconductor and the semiconductor 127 is a semiconductor in which grain boundaries are reduced with the use of a catalytic element.

It is possible to use, as the transistor STr1 and the transistor STr2, OS transistors or Si transistors (transistors in which silicon is used for the semiconductor layer where a channel is formed) that can operate at higher speed than OS transistors.

Note that FIG. 5A corresponds to the X-Y plane of the center of the transistor WTr or the vicinity of the center, and FIG. 5B corresponds to the X-Y plane of the center of the transistor RTr or the vicinity of the center. In the case where the cross-sectional shape of the conductor 130 seen from the Z direction is a circular shape in FIG. 5A and FIG. 5B, the insulator 129 is concentrically provided outside the conductor 130, the semiconductor 127 is concentrically provided outside the insulator 129, the insulator 126 is concentrically provided outside the semiconductor 127, the semiconductor 125 is concentrically provided outside the insulator 126, and the insulator 124 is concentrically provided outside the semiconductor 125. Furthermore, the conductor 128 is concentrically provided between the insulator 129 and the semiconductor 127.

Figure 10A:
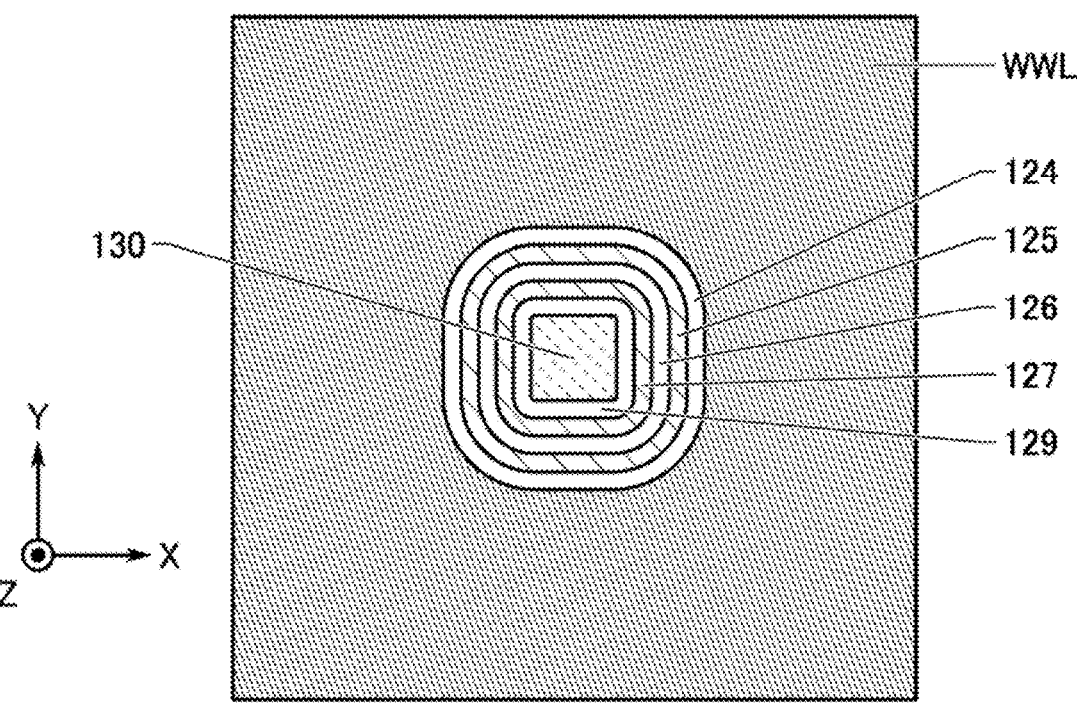
FIG. 10A and FIG. 10B are each a cross-sectional view of a memory string.
Figure 10B:
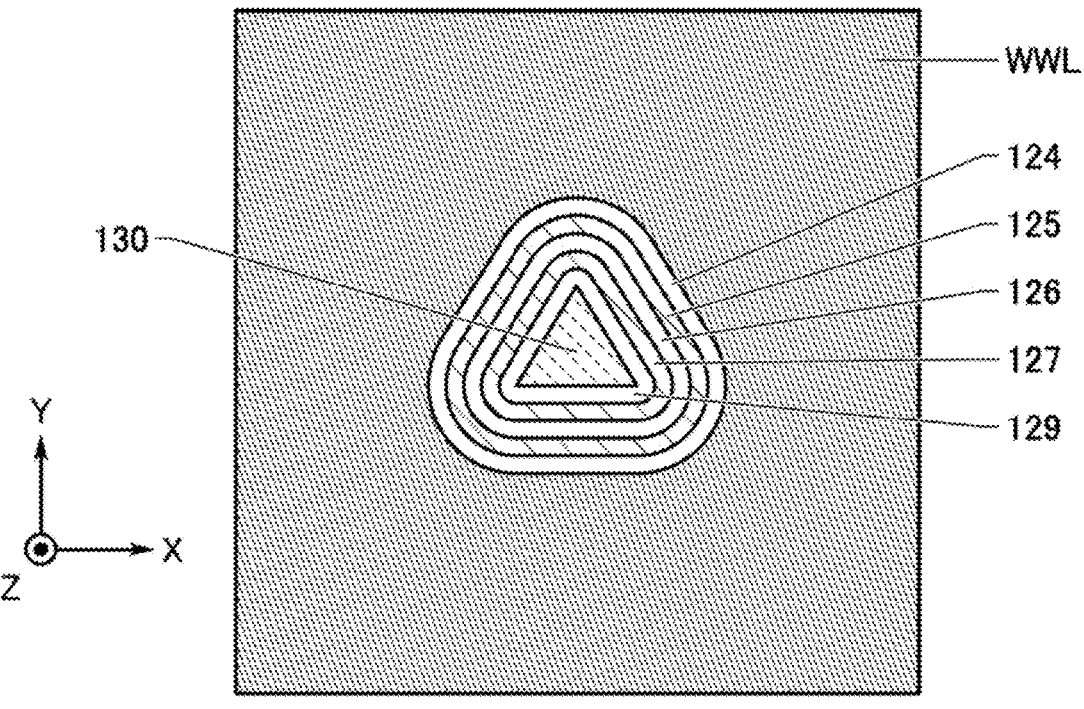

The cross-sectional shape of the conductor 130 is not limited to a circular shape. As illustrated in FIG. 10A, the cross-sectional shape of the conductor 130 may be a rectangular shape. Alternatively, as illustrated in FIG. 10B, the cross-sectional shape of the conductor 130 may be a triangular shape. Thus, the cross-sectional shape of the structural body 160 seen from the Z direction is not limited to a circular shape.

[Constituent Materials for Semiconductor Device]

Next, constituent materials that can be used for the memory device 100 are described.

[Substrate]

The memory device 100 can be provided over a substrate. As the substrate, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor, a switching element, a light-emitting element, and a memory element.

[Insulator]

Examples of the insulator include an oxide, a nitride, an oxynitride, a nitride oxide, a metal oxide, a metal oxynitride, and a metal nitride oxide, each of which has an insulating property.

Note that in this specification and the like, "oxynitride" refers to a material that contains more oxygen than nitrogen. For example, "silicon oxynitride" refers to a silicon material that contains more oxygen than nitrogen. Moreover, in this specification and the like, "nitride oxide" refers to a material that contains more nitrogen than oxygen, and "aluminum nitride oxide" refers to an aluminum material that contains more nitrogen than oxygen.

As miniaturization and high integration of transistors progress, for example, a problem such as a leakage current may arise because of a thinner gate insulator. When a high-k material is used for the insulator functioning as a gate insulator, the voltage during the operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When an OS transistor is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

In the case where an oxide semiconductor is used as the semiconductor 125 and/or the semiconductor 127, the insulator functioning as a gate insulator preferably includes a region containing oxygen that is released by heating. For example, when a structure is employed in which silicon oxide or silicon oxynitride including a region containing oxygen that is released by heating is in contact with the semiconductor 125 and/or the semiconductor 127, oxygen vacancies included in the semiconductor 125 and/or the semiconductor 127 can be compensated for.

[Conductor]

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or a silicide such as nickel silicide may be used.

It is also possible to use, as the conductor, a semiconductor whose electrical conductivity is increased by a p-type impurity or an n-type impurity being added. In the case where silicon is used as the conductor, for example, a silicide containing titanium, cobalt, nickel, or the like may be used.

A stack of a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

In the case where an oxide semiconductor, which is a kind of metal oxide, is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in the oxide semiconductor where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the oxide semiconductor where the channel is formed can be captured in some cases. Alternatively, hydrogen entering from an external insulator or the like can be captured in some cases.

[Oxide Semiconductor]

The oxide semiconductor preferably contains at least one of indium and zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In-M-Zn oxide that contains indium, the element M, and zinc is considered. Note that the element M represents one or more elements selected from aluminum, gallium, yttrium, and tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

[Classification of Crystal Structure]

First, the classification of the crystal structures of an oxide semiconductor will be described with reference to FIG. 11A. FIG. 11A is a diagram showing the classification of crystal structures of an oxide semiconductor, typically IGZO.

As shown in FIG. 11A, an oxide semiconductor is roughly classified into "Amorphous," "Crystalline," and "Crystal." The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 11A are in an intermediate state between "Amorphous" and "Crystal," and belong to a new crystalline phase. That is, these structures are completely different from "Crystal" or "Amorphous," which is energetically unstable.

A crystal structure of a film or a substrate can be evaluated with an X-ray diffraction (XRD) spectrum. FIG. 11B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 11B and obtained by GIXD measurement is hereinafter simply referred to as an XRD spectrum. The CAAC-IGZO film in FIG. 11B has a composition in the vicinity of In:Ga:Zn=4:2:3 [atomic ratio]. The CAAC-IGZO film in FIG. 11B has a thickness of 500 nm.

As shown in FIG. 11B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 11B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 11C shows a diffraction pattern of the CAAC-IGZO film. FIG. 11C shows a diffraction pattern obtained with the NBED method in which an electron beam is incident in the direction parallel to the substrate. The composition of the CAAC-IGZO film in FIG. 11C is In:Ga:Zn=4:2:3 [atomic ratio] or the neighborhood thereof. In the nanobeam electron diffraction method, electron diffraction is performed with a probe diameter of 1 nm.

As shown in FIG. 11C, a plurality of spots indicating c-axis alignment are observed in the diffraction pattern of the CAAC-IGZO film.

[Structure of Oxide Semiconductor]

Oxide semiconductors might be classified in a manner different from that in FIG. 11A when classified in terms of the crystal structure. Oxide semiconductors are classified into a single crystal oxide semiconductor and a non-single-crystal oxide semiconductor, for example.

Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface on which the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide, the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

[Structure of Oxide Semiconductor]

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

Furthermore, an oxide semiconductor with a low carrier concentration is preferably used for a channel formation region of the transistor. For example, the carrier concentration of the channel formation region of the oxide semiconductor is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor. A highly purified intrinsic or substantially highly purified intrinsic state may be referred to as an i-type or a substantially i-type.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in a film provided in proximity be also reduced. Examples of impurities include hydrogen, nitrogen, an alkali metal, an alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentrations of silicon and carbon in the channel formation region of the oxide semiconductor and the concentrations of silicon and carbon in the vicinity of an interface with the channel formation region of the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor, which is obtained by SIMS, is lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region of the oxide semiconductor is preferably reduced as much as possible. Specifically, the hydrogen concentration in the channel formation region of the oxide semiconductor, which is obtained by SIMS, is set lower than $1 \times 10^{20}$ atoms/cm$^3$, preferably lower than $5 \times 10^{19}$ atoms/cm$^3$, further preferably lower than $1 \times 10^{19}$ atoms/cm$^3$, still further preferably lower than $5 \times 10^{18}$ atoms/cm$^3$, further preferably lower than $1 \times 10^{18}$ atoms/cm$^3$.

When an oxide semiconductor with sufficiently reduced impurities is used for the channel formation region of the transistor, stable electrical characteristics can be given.

[Other Semiconductor Materials]

Semiconductor materials that can be used for the semiconductor 125 and the semiconductor 127 are not limited to the above-described oxide semiconductors. A semiconductor material having a bandgap (a semiconductor material that is not a zero-gap semiconductor) may be used for the semiconductor 125 and the semiconductor 127. For example, a single element semiconductor such as silicon, a compound semiconductor such as gallium arsenide, or a layered material (also referred to as an atomic layered material or a two-dimensional material) may be used as a semiconductor material. In particular, a layered material functioning as a semiconductor is preferably used as a semiconductor material.

In this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the semiconductor 125 and the semiconductor 127, a transition metal chalcogenide functioning as a semiconductor is preferably used, for example. Specific examples of the transition metal chalcogenide which can be used for the semiconductor 125 and the semiconductor 127 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), and zirconium selenide ($ZrSe_2$).

<Example of Method for Manufacturing Memory Device>

Next, an example of a method for manufacturing a memory device according to the present invention is described with reference to FIG. 12 to FIG. 34. Note that in FIG. 12 to FIG. 34, A in the drawings is a top view seen from the Z direction and B in the drawings is a cross-sectional view of a portion indicated by a dashed-dotted line A1-A2 in A. Furthermore, in FIG. 12 to FIG. 34, C in the drawings is a cross-sectional view of a portion indicated by a dashed-dotted line A3-A4 in A. FIG. 25D is an enlarged cross-sectional view of a portion surrounded by a dashed-dotted line in FIG. 25B. Although one memory string 120 including two (two stages of) memory elements MC is described as an example in this manufacturing method, this embodiment is not limited to the example. The memory string 120 may include three or more stages of memory elements MC. For example, the memory string 120 may include 32 or more, preferably 64 or more, further preferably 128 or more, still further preferably 256 or more stages of memory elements MC.

Figure 12A:
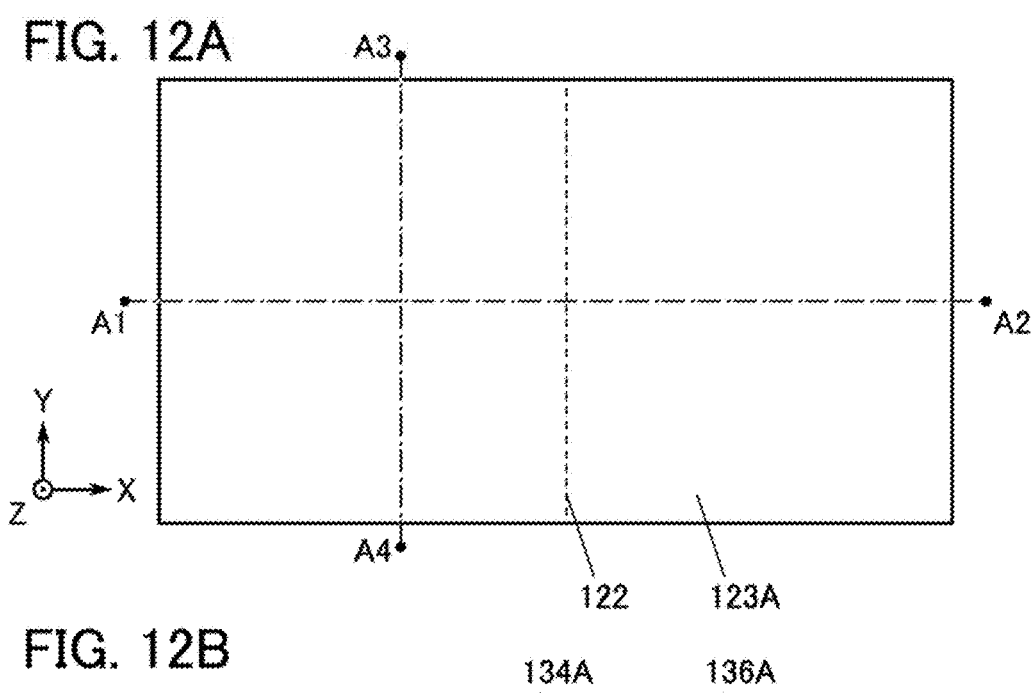
FIG. 12A to FIG. 12C are cross-sectional views illustrating a process for manufacturing a semiconductor device of one embodiment of the present invention.
Figure 12B:
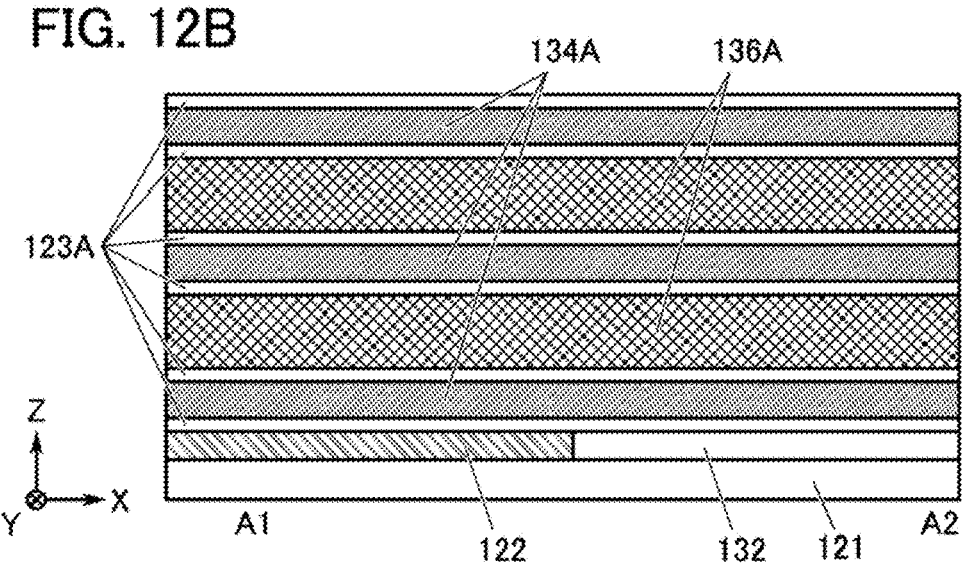
Figure 12C:
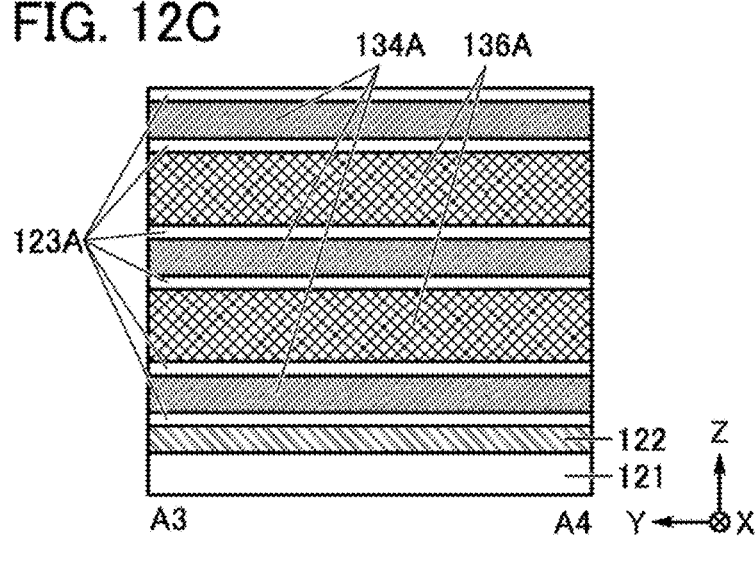

First, the layer 122 is formed over the base 121 having an insulating surface, and an insulator 132 is formed around the layer 122 (see FIG. 12A to FIG. 12C).

First, a conductive film is formed and processed by a lithography technique, whereby the layer 122 is formed. Then, an insulating film is formed over the base 121 so as to cover the layer 122. Next, the insulating film is preferably subjected to planarization treatment. In the planarization treatment, the insulating film is preferably polished until a surface of the layer 122 is exposed. By the above-described method, the insulator 132 can be formed. Note that the method for forming the layer 122 and the insulator 132 is not limited to this method. The insulator 132 may be formed over the base 121 and an unnecessary portion of the insulator 132 may be removed to form a groove and an opening, and the layer 122 may be embedded in the groove and the opening portion. Such a formation method of a conductor is referred to as a damascene method (a single damascene method or a dual damascene method) in some cases. By the above-described method, structures of the layer 122 and the insulator 132 illustrated in FIG. 12A to FIG. 12C can be obtained.

The layer 122 and the insulator 132 can be formed by a sputtering method, a CVD method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

Using a plasma CVD method, a high-quality film can be obtained at a relatively low temperature. A thermal CVD method is a deposition method that does not use plasma and thus enables less plasma damage to a processed object. For example, a wiring, an electrode, an element (a transistor, a capacitor element, or the like), or the like included in a semiconductor device might be charged up by receiving charge from plasma. In that case, accumulated charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

An ALD method is also a deposition method that enables less plasma damage to a processed object. An ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of a processed object. Thus, a CVD method and an ALD method are deposition methods that enable favorable step coverage almost regardless of the shape of a processed object. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the use of the flow rate ratio of the source gases. For example, using a CVD method and an ALD method, a film with a certain composition can be formed depending on the flow rate ratio of the source gases. Moreover, for example, by a CVD method and an ALD method, a film whose composition is continuously changed can be formed by changing the flow rate ratio of the source gases during the deposition. In the case of forming a film while changing the flow rate ratio of the source gases, as compared with the case of forming a film with use of a plurality of deposition chambers, the time taken for the deposition can be shortened because the time taken for transfer and pressure adjustment is omitted. Thus, the productivity of the semiconductor device can be increased in some cases.

Note that in the lithography technique, first, a resist is exposed to light through a photomask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a photomask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film, forming a resist mask thereover, and then etching the hard mask material.

For the processing, a dry etching method or a wet etching method can be employed. Processing using a dry etching method is suitable for microfabrication.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

In the case where a hard mask is used for etching of the conductive film, the etching treatment may be performed after the resist mask used for formation of the hard mask is removed or with the resist mask left. In the latter case, the resist mask sometimes disappears during the etching. The hard mask may be removed by etching after the etching of the conductive film. Meanwhile, the hard mask is not necessarily removed when the hard mask material does not affect subsequent steps or can be utilized in subsequent steps.

As the layer 122, a conductive film containing a metal element, which is formed by a sputtering method, can be used, for example. The conductive film can also be formed by a CVD method. The layer 122 may be a semiconductor.

When performing gettering treatment that is related to crystallinity improvement treatment with the use of a catalytic element (also referred to as "catalyst crystallization"), which will be described later, for example, a conductive film with many crystal defects is preferably used as the layer 122. Note that the layer 122 can also be referred to as a "gettering layer".

In order to more effectively perform the gettering treatment that will be described later, it is preferable that an impurity element be contained in the layer 122. As the impurity element, Group 15 elements such as phosphorus (P), arsenic (As), nitrogen (N), antimony (Sb), and bismuth (Bi) may be used, for example. In addition to Group 15 elements, Group 13 elements (typically, boron (B), aluminum (Al), gallium (Ga), indium (In), and the like) may be used. The concentration of the impurity contained in the layer 122 may be higher than or equal to $1\times10^{19}$ atoms/cm$^3$ and lower than or equal to $1\times10^{21}$ atoms/cm$^3$. Note that addition of an impurity element to the layer 122 for the purpose of gettering treatment is not necessarily required. As the impurity element contained in the layer 122, Group 18 elements (typically, helium (He), neon (Ne), argon (Ar), krypton (Kr), xenon (Xe), and the like) can also be used. Group 15 elements, Group 13 elements, and Group 18 elements may be combined and used as the impurity elements contained in the layer 122.

In this embodiment, amorphous silicon containing phosphorus is used for the layer 122. Phosphorus may be introduced, after an amorphous silicon film is formed, into the amorphous silicon film by a plasma doping method or an ion implantation method, for example. In the case where the layer 122 is formed by a CVD method or the like, a gas containing an impurity element may be mixed into a material gas.

A surface of the insulator 132 is preferably subjected to planarization treatment as needed. A chemical mechanical polishing (CMP) method or a reflow method can be used as the planarization treatment.

Insulating films 123A, conductive films 134A, and conductive films 136A are alternately stacked over the layer 122 and the insulator 132. In this embodiment, an example where an insulating film 123A is formed over the insulator 132, a conductive film 134A is formed over the insulating film 123A, another insulating film 123A is formed over the conductive film 134A, and a conductive film 136A is formed over the insulating film 123A is described (see FIG. 12A to FIG. 12C). A CVD method can be used for the formation of the conductive films 134A, the conductive films 136A, and the insulating films 123A. Alternatively, a sputtering method may be employed.

The above-described conductor can be used for the conductive film 134A and the conductive film 136A. The conductive film 136A is preferably formed using a material different from those of the layer 122 and the conductive film 134A since the conductive film 136A needs to be etched selectively with respect to the layer 122 and the conductive film 134A in a subsequent step. Meanwhile, the layer 122 and the conductive film 134A may be formed using the same material or different materials. The layer 122, the conductive film 134A, and the conductive film 136A may be conductors with different crystallinities.

The above-described insulator can be used as the insulator 132 and the insulating film 123A. An insulating oxide, an insulating nitride, an insulating oxynitride, an insulating nitride oxide, an insulating metal oxide, an insulating metal oxynitride, an insulating metal nitride oxide, or the like can be used, for example.

Although an example where six insulating films 123A, three conductive films 134A, and two conductive films 136A are formed is described in this embodiment, the number of stacked layers is not limited thereto. Each of the films can be formed in accordance with the required performance of the semiconductor device. Assuming that the number of stacked conductive films 134A is m (m is an integer greater than or equal to 2), the number of stacked insulating films 123A is 2×m and the number of stacked conductive films 136A is m−1. For example, m can be greater than or equal to 33, preferably greater than or equal to 65, further preferably greater than or equal to 129, still further preferably greater than or equal to 257.

Figure 13A:
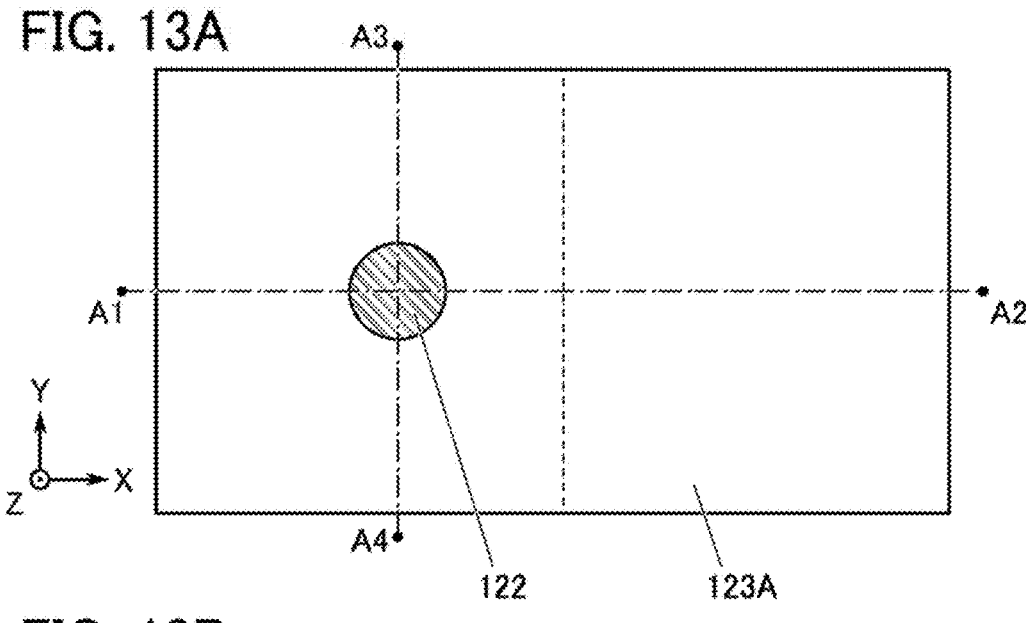
FIG. 13A to FIG. 13C are cross-sectional views illustrating a process for manufacturing a semiconductor device of one embodiment of the present invention.
Figure 13B:
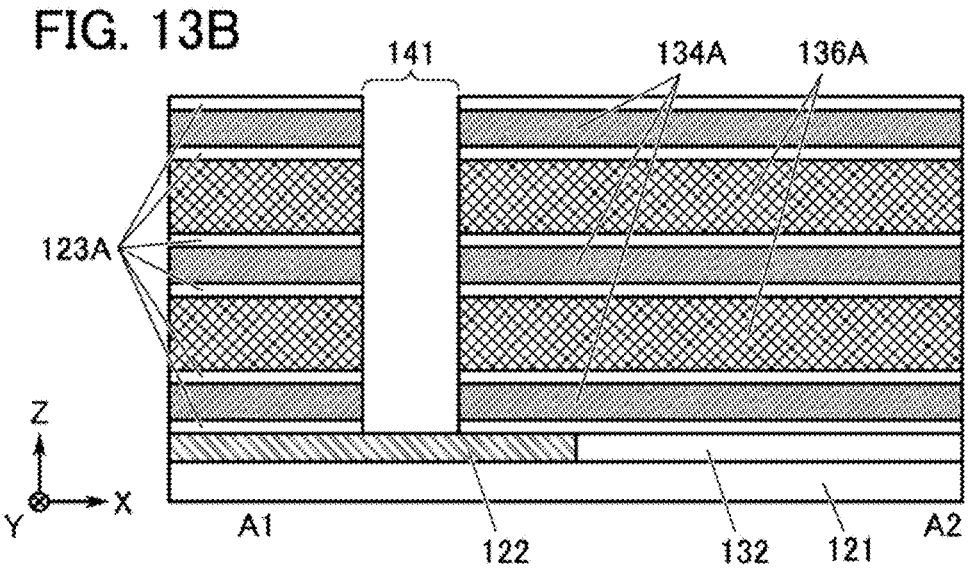
Figure 13C:
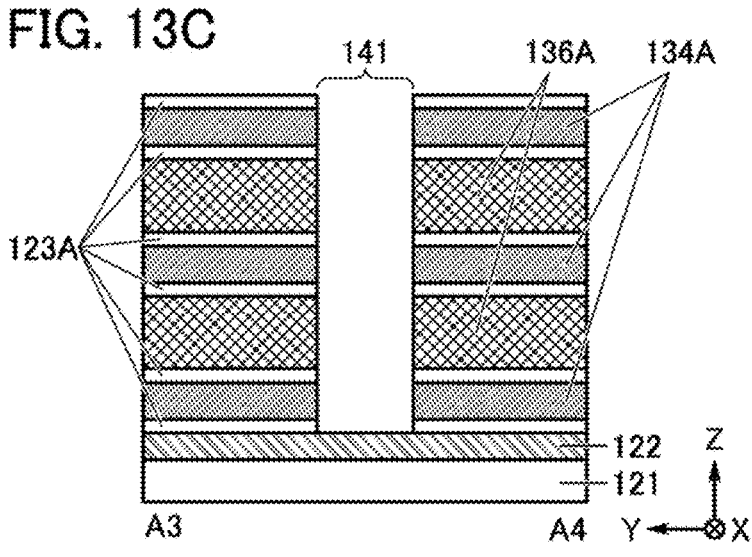

Next, a mask (not illustrated) is formed over the insulating films 123A; and the insulating films 123A, the conductive films 134A, and the conductive films 136A are processed by a lithography technique, so that a first opening 141 is formed so as to expose the layer 122 (see FIG. 13A to FIG. 13C).

Figure 14A:
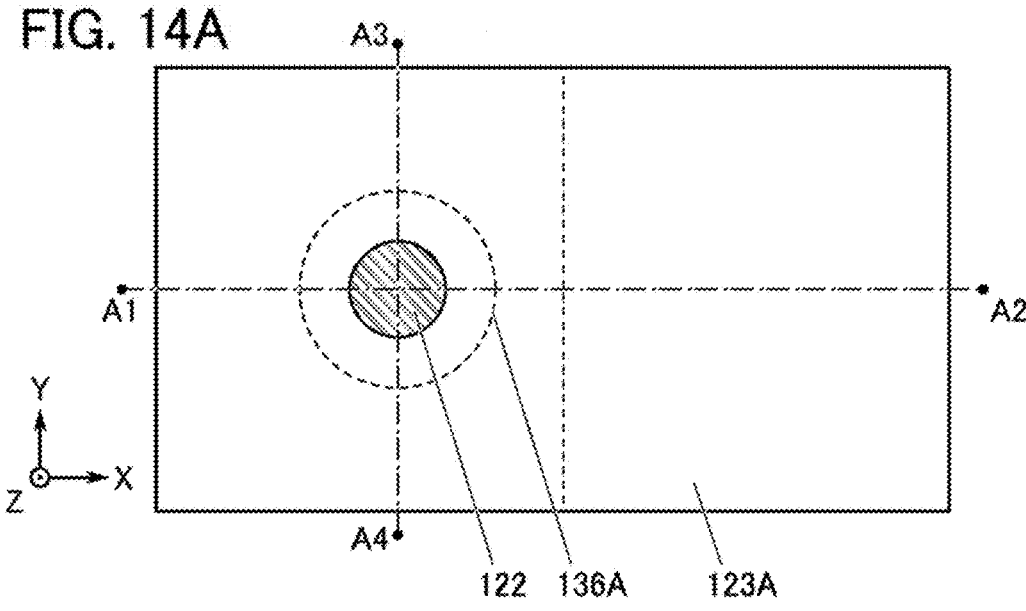
FIG. 14A to FIG. 14C are cross-sectional views illustrating a process for manufacturing a semiconductor device of one embodiment of the present invention.
Figure 14B:
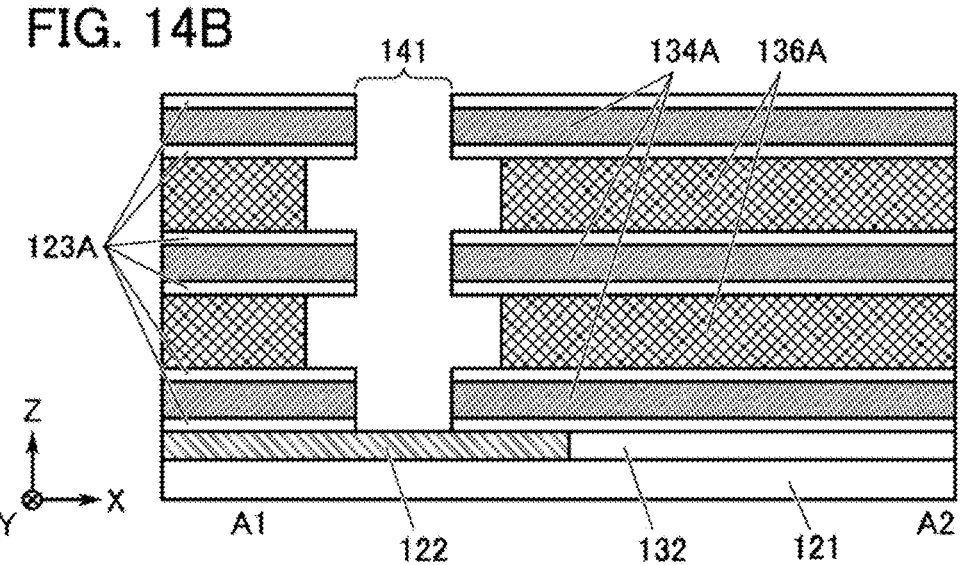
Figure 14C:
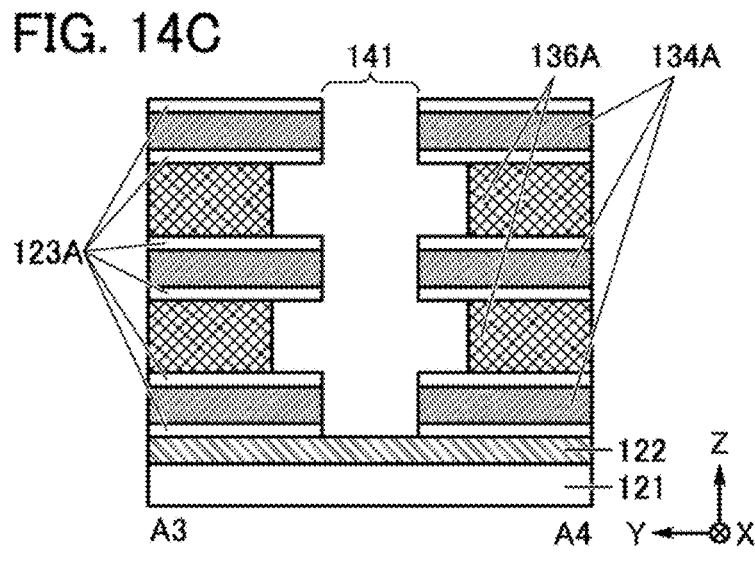

Next, isotropic etching is performed on the conductive films 136A so that side surfaces of the conductive films 136A in the first opening 141 recede from side surfaces of the insulating films 123A and side surfaces of the conductive films 134A (see FIG. 14A to FIG. 14C). By this processing, the diameter of the first opening 141 overlapping with the conductive films 136A in a direction perpendicular to the Z direction becomes larger than the diameter of the first opening 141 overlapping with the insulating films 123A and the diameter of the first opening 141 overlapping with the conductive films 134A in a direction perpendicular to the Z direction. Thus, projections and depressions are formed on a side surface of the first opening 141. As such processing, isotropic etching using dry etching with a gas, a radical, plasma, or the like, or isotropic etching using wet etching with a liquid can be used. A liquid used in wet etching may be referred to as an etchant. In the case where isotropic etching is performed using dry etching, a gas, a radical, plasma, or the like containing at least one of chlorine, bromine, and fluorine can be used. Isotropic etching is preferably performed without removal of the mask used for the formation of the first opening 141.

Figure 15A:
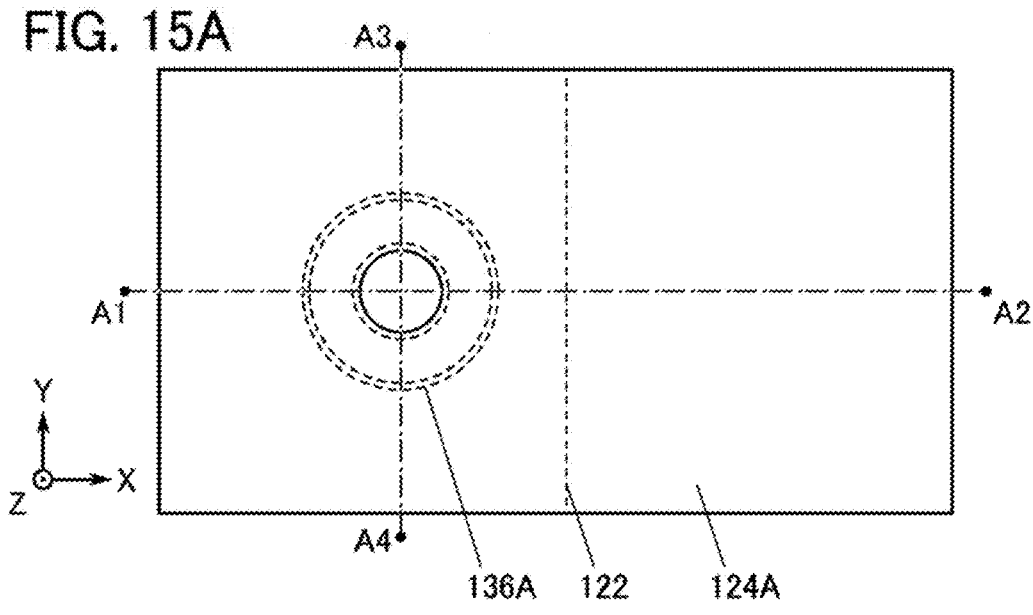
FIG. 15A to FIG. 15C are cross-sectional views illustrating a process for manufacturing a semiconductor device of one embodiment of the present invention.
Figure 15B:
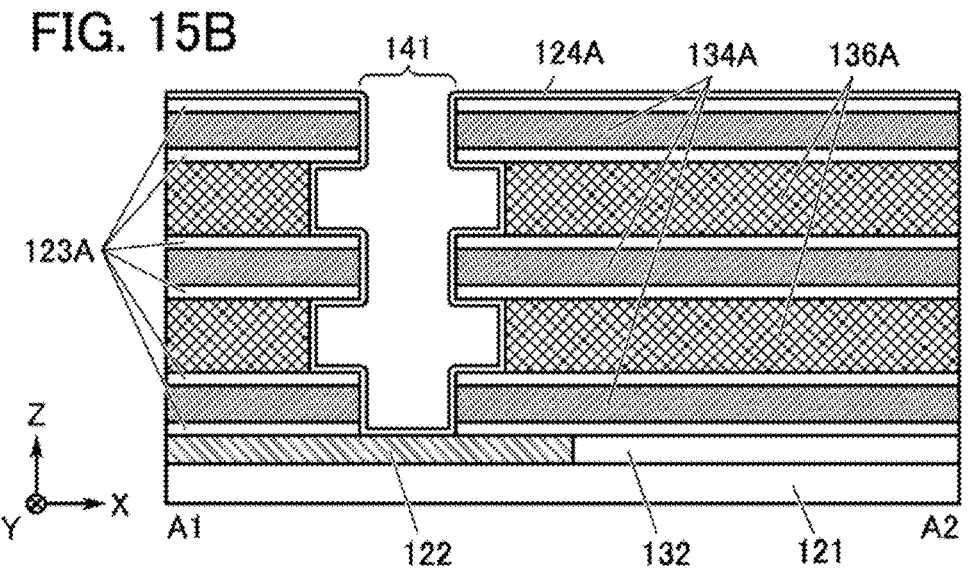
Figure 15C:
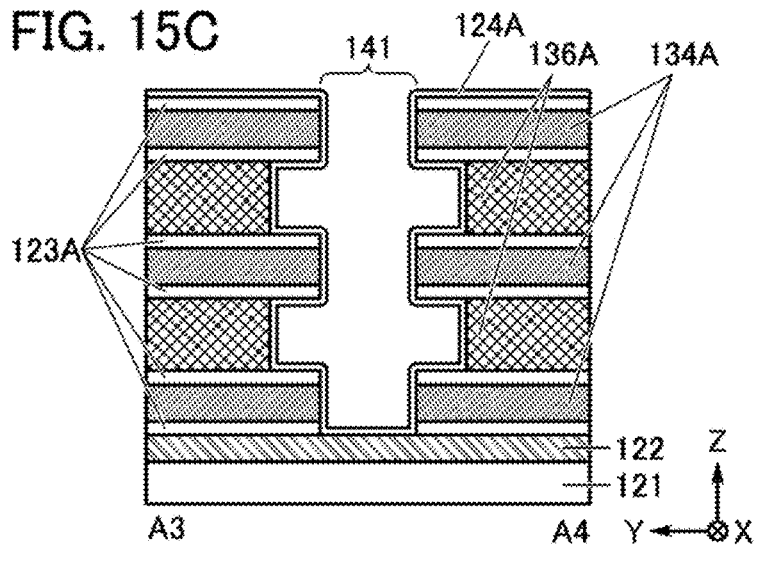
Figure 16A:
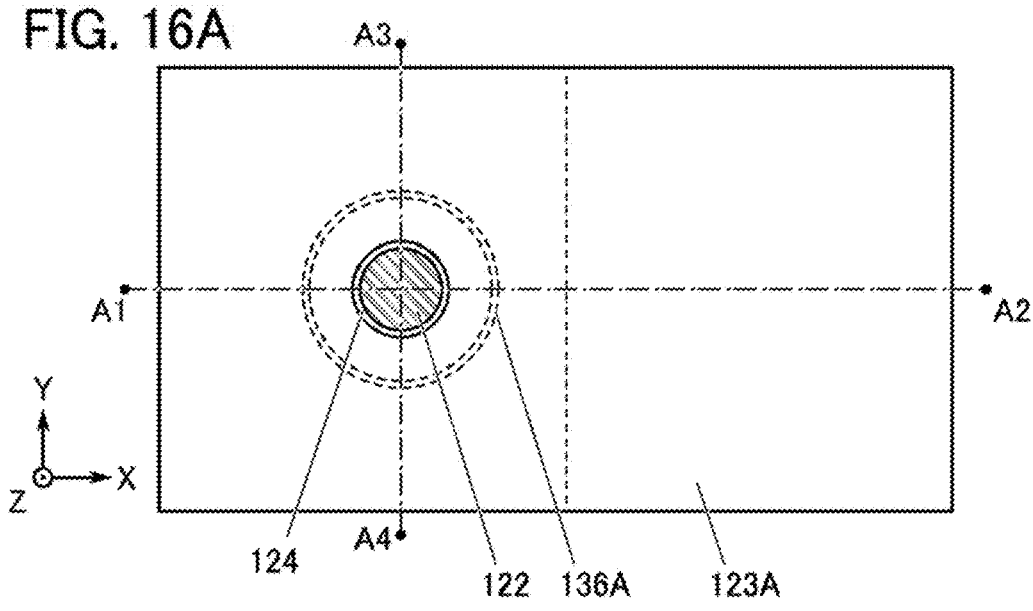
FIG. 16A to FIG. 16C are cross-sectional views illustrating a process for manufacturing a semiconductor device of one embodiment of the present invention.
Figure 16B:
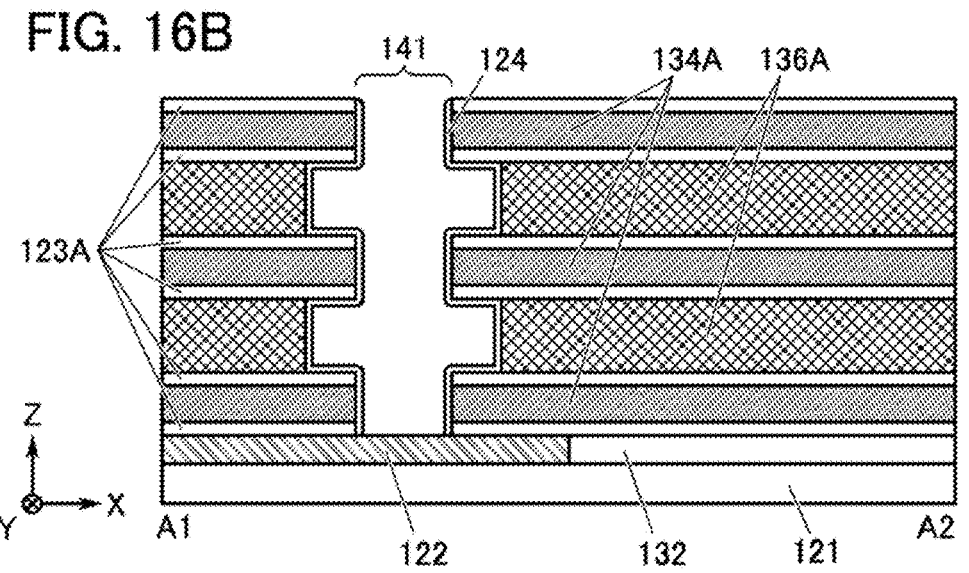
Figure 16C:
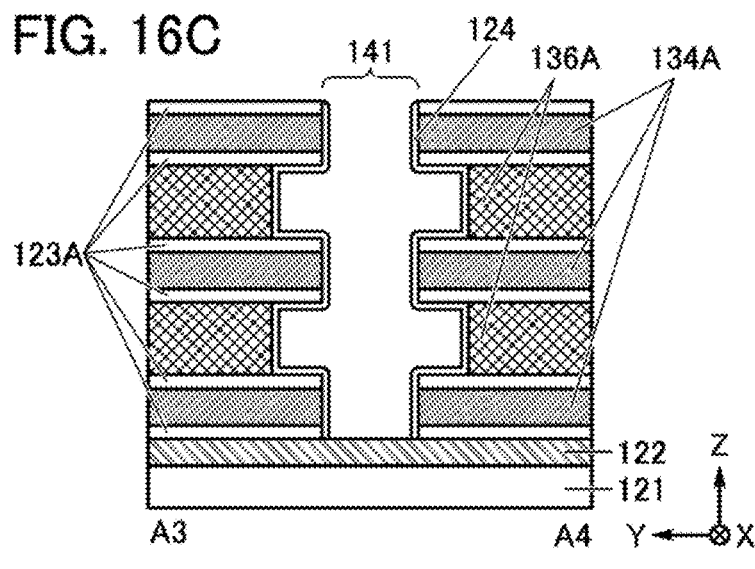

Next, an insulating film 124A is formed over the insulating film 123A and inside the first opening 141 (see FIG. 15A to FIG. 15C). Although not illustrated, the insulating film 124A may have a stacked-layer structure. The insulating film 124A can be formed by a CVD method or an ALD method. It is particularly preferable to employ an ALD method, in which case a film with a uniform thickness can be formed even in a groove or an opening portion having a high aspect ratio. Alternatively, the insulating film 124A may be formed by a combination of an ALD method and a CVD method. In the case where the insulating film 124A has a stacked-layer structure, insulating films may be formed in the same deposition apparatus or different deposition apparatuses.

The insulating film 124A formed by the above-described method has high coverage and can be formed on the projections and depressions of the side surface of the first opening 141. In other words, the insulating film 124A can be formed in contact with not only the side surfaces of the insulating films 123A, the conductive films 134A, and the conductive films 136A but also part of a top surface of the insulating films 123A and part of a bottom surface of the insulating films 123A.

Then, the insulating film 124A formed in a bottom portion of the first opening 141 is removed to obtain insulators 124. Anisotropic etching is preferably used to remove the insulating film 124A. At this time, the insulating film 124A over the insulating film 123A is also removed; thus, the insulator 124 is provided only on a sidewall of the first opening 141 (see FIG. 16A to FIG. 16C). The layer 122 is exposed again by removal of the insulating film 124A in the bottom portion of the first opening 141.

Figure 17A:
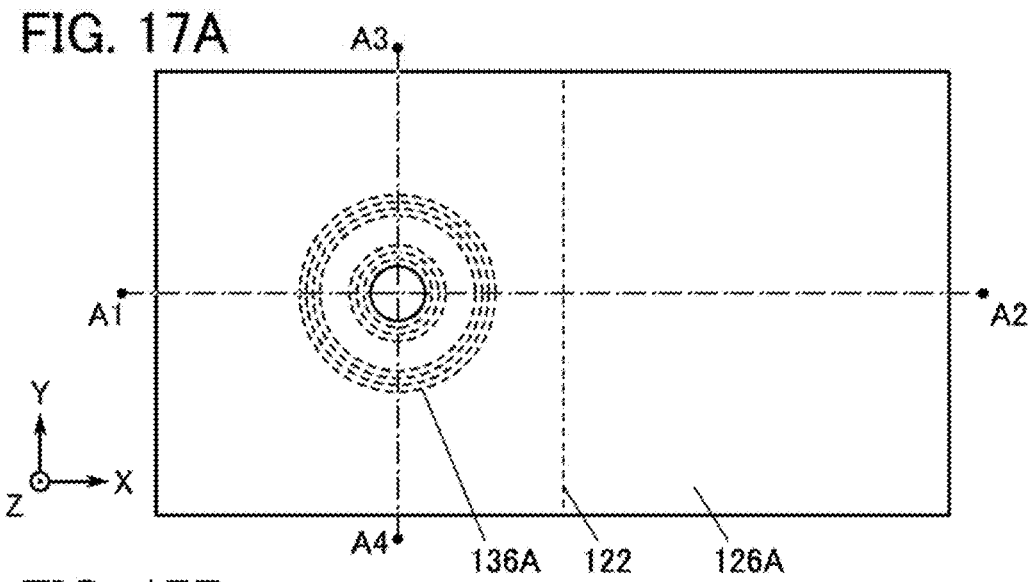
FIG. 17A to FIG. 17C are cross-sectional views illustrating a process for manufacturing a semiconductor device of one embodiment of the present invention.
Figure 17B:
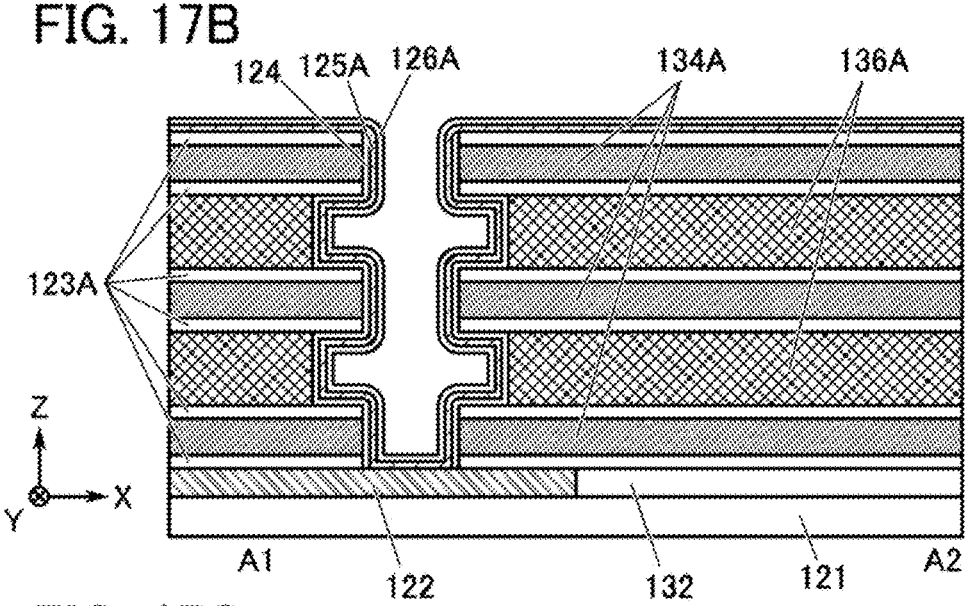
Figure 17C:
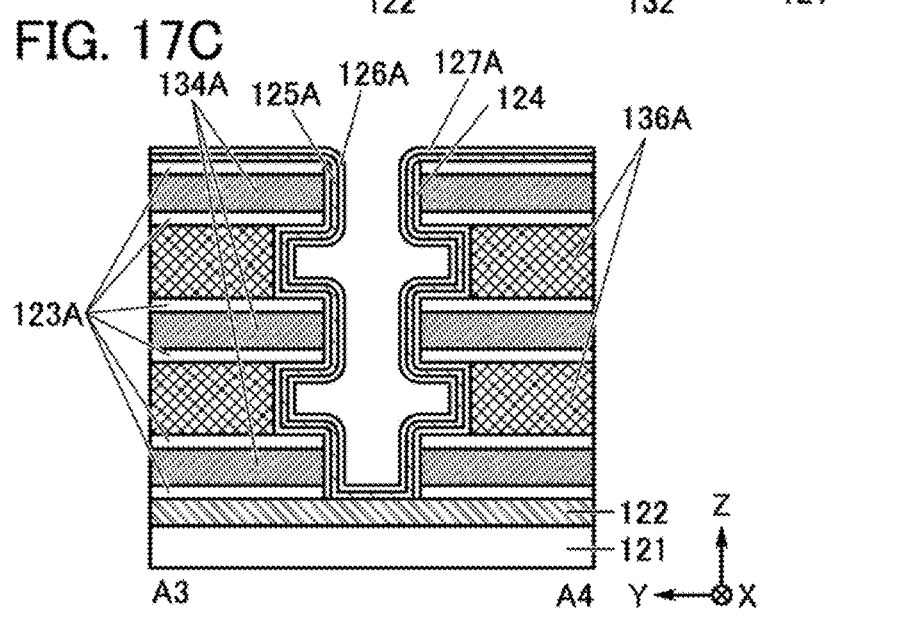

Next, a semiconductor film 125A and an insulating film 126A are formed inside the first opening (see FIG. 17A to FIG. 17C).

The semiconductor film 125A and the insulating film 126A can be formed by a CVD method or an ALD method. It is particularly preferable to employ an ALD method, in which case a film with a uniform thickness can be formed even in a groove or an opening portion having a high aspect ratio. Alternatively, the semiconductor film 125A and the insulating film 126A may each be formed by a combination of an ALD method and a CVD method. Alternatively, the films may be formed using different deposition methods or different deposition apparatuses.

In this embodiment, amorphous silicon is formed as the semiconductor film 125A, and silicon oxynitride is formed as the insulating film 126A.

Figure 18A:
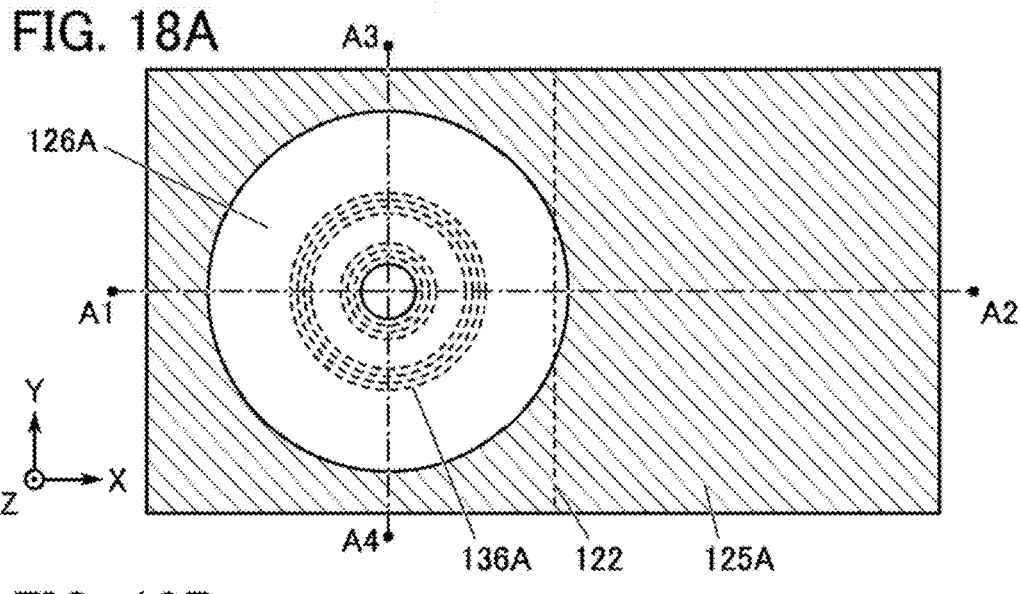
FIG. 18A to FIG. 18C are cross-sectional views illustrating a process for manufacturing a semiconductor device of one embodiment of the present invention.
Figure 18B:
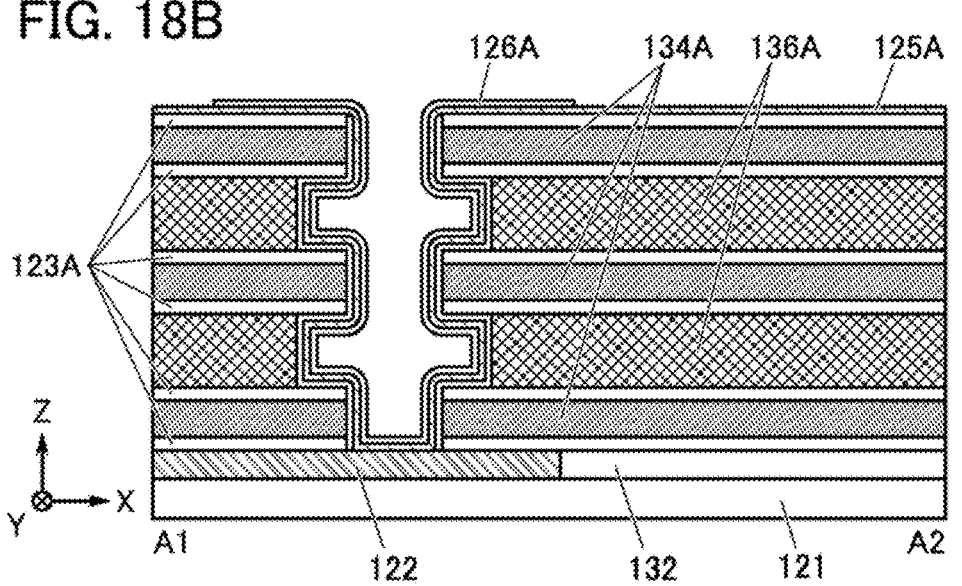
Figure 18C:
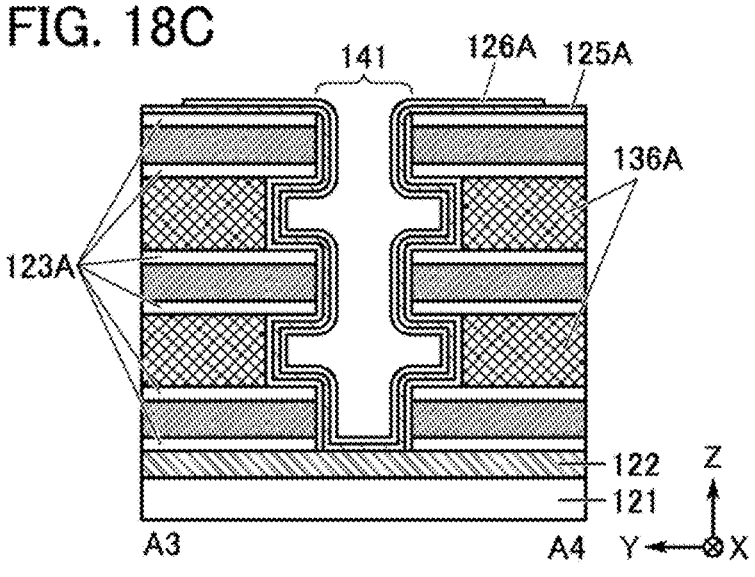

Next, part of the insulating film 126A is removed except for a region where the insulating film 126A overlaps with the first opening 141 and the vicinity of the region (see FIG. 18A to FIG. 18C). In this embodiment, part of the insulating film 126A is removed such that the region overlapping with the first opening 141 and a portion overlapping with a region functioning as the transistor STr2 later, seen from the Z direction, are left unremoved. The semiconductor film 125A is exposed in a region where the insulating film 126A is removed. This region may be referred to as a "catalytic element addition region".

Figure 19A:
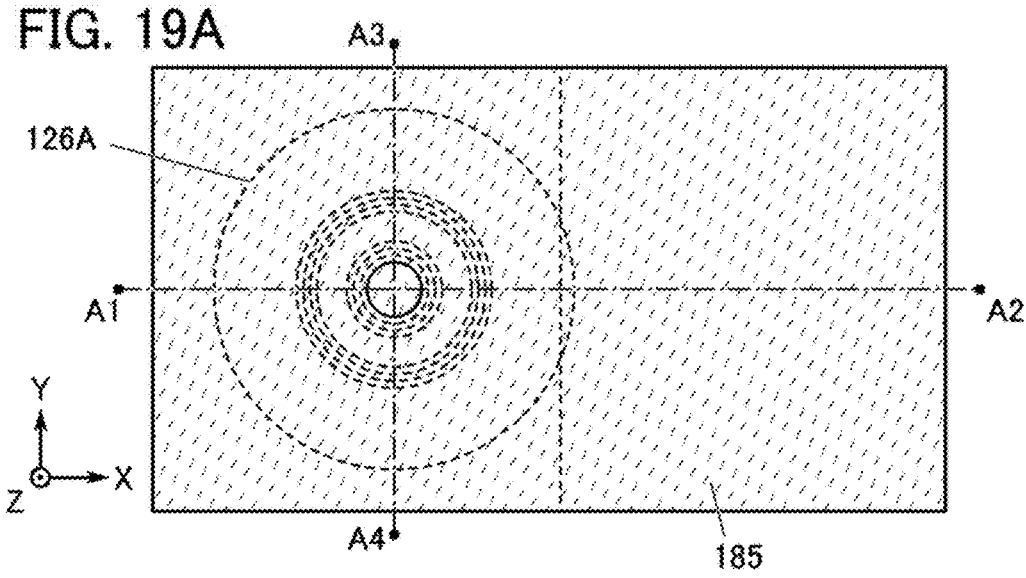
FIG. 19A to FIG. 19C are cross-sectional views illustrating a process for manufacturing a semiconductor device of one embodiment of the present invention.
Figure 19B:
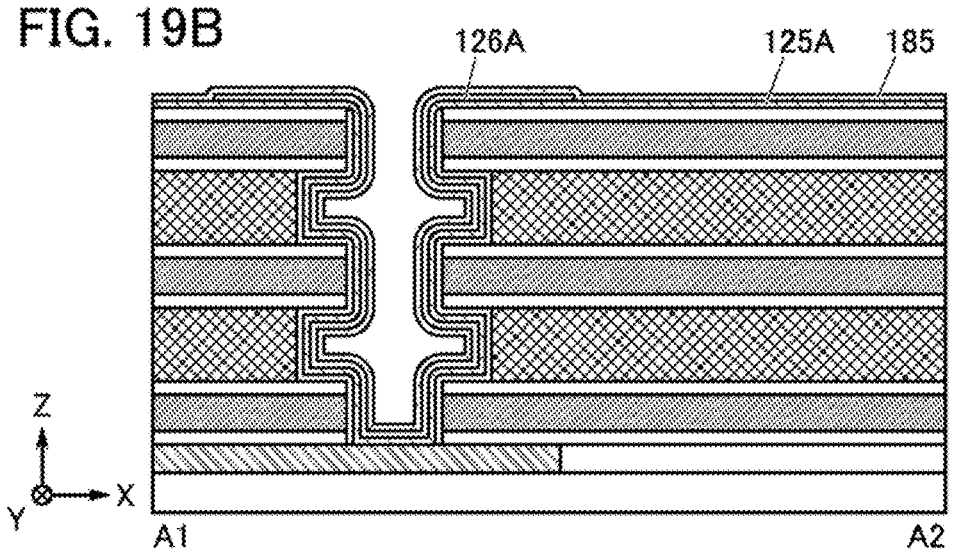
Figure 19C:
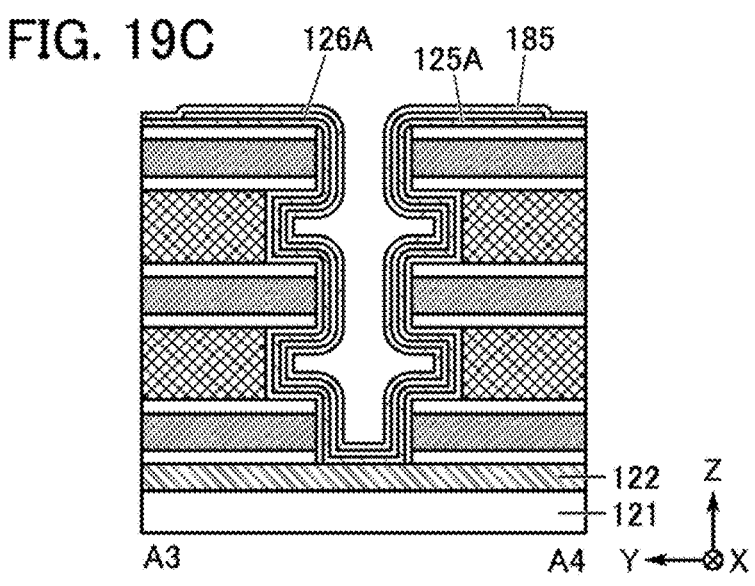

Then, a catalyst layer 185 that contains a catalytic element is formed over the semiconductor film 125A and the insulating film 126A (see FIG. 19A to FIG. 19C). The catalyst layer 185 may be formed by using a sputtering method, a CVD method, an ALD method, or the like, or may be formed by a coating method in which a solution containing a catalytic element is applied by a spin coating method or the like. The catalyst layer 185 may be a silicide containing a catalytic element, for example.

As the catalytic element, an element selected from metal elements such as nickel (Ni), iron (Fe), cobalt (Co), ruthenium (Ru), rhodium (Rh), palladium (Pd), osmium (Os), iridium (Ir), platinum (Pt), copper (Cu), gold (Au), and germanium (Ge) may be used.

In this embodiment, nickel is used as the catalytic element. Note that in the case where the catalyst layer 185 is formed by the coating method, a solution containing nickel salt such as nickel bromide, nickel acetate, nickel oxalate, nickel carbonate, nickel chloride, nickel iodide, nickel nitrate, or nickel sulfate as a solute, and containing water, alcohol, acid, or ammonia as a solvent can be used. Alternatively, a solution containing a nickel element as a solute, and containing a solvent selected from benzene, toluene, xylene, carbon tetrachloride, chloroform, and ether can be used. Further alternatively, a material like an emulsion in which nickel is not completely dissolved in a medium but is dispersed therein may be used.

Next, in order for the catalytic element to be diffused from the catalyst layer 185 containing the catalytic element into the semiconductor film 125A, heat treatment is performed at 450° to 650° inclusive, for four hours to 24 hours inclusive. Note that hydrogen releasing treatment may be performed at 450° for approximately one hour, prior to the heat treatment. The hydrogen releasing treatment reduces the hydrogen concentration in the semiconductor film 125A. A reduction in hydrogen concentration due to the heat treatment facilitates formation of a silicide.

Silicon that is in contact with a catalytic element is bound to the catalytic element to form a silicide. A catalytic element is likely to be bound to a portion with a number of defects, such as a portion in an amorphous state. Thus, a catalytic element contained in a silicide reacts with silicon in an amorphous state to form a new silicide. In this manner, crystallization proceeds while the silicide moves. This is because the atomic distance between the catalytic element and silicon is very close to the atomic distance of single crystal silicon; Ni—Si distance is the closest to Si—Si distance, being only shorter by approximately 0.6%. Crystallization with the use of the catalytic element increases the grain size and decreases defects in the semiconductor.

Figure 20A:
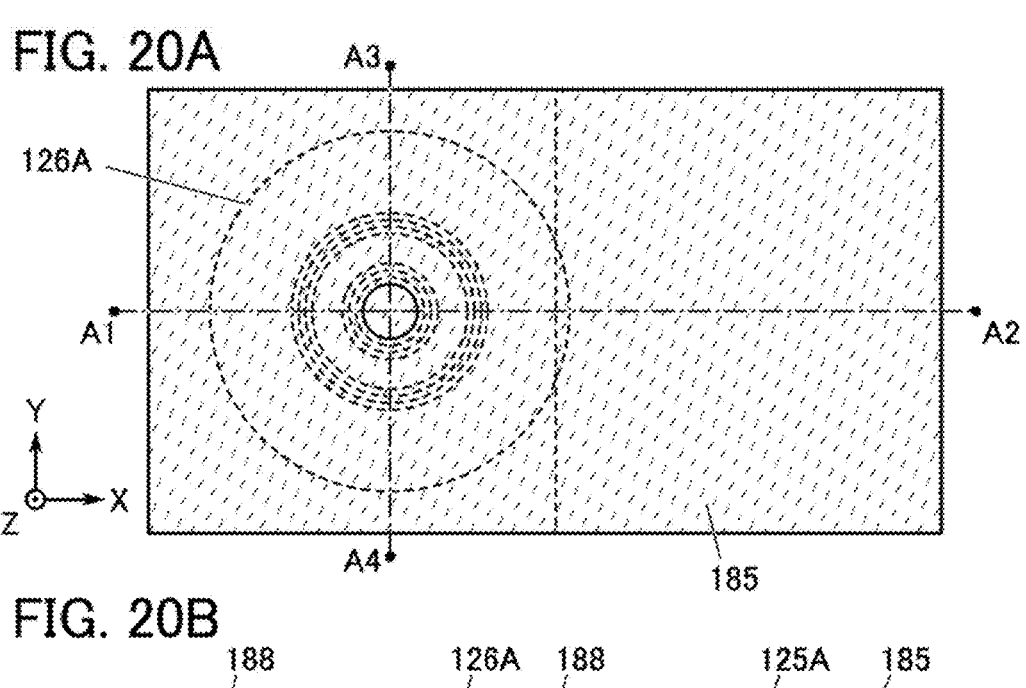
FIG. 20A to FIG. 20C are cross-sectional views illustrating a process for manufacturing a semiconductor device of one embodiment of the present invention.
Figure 20B:
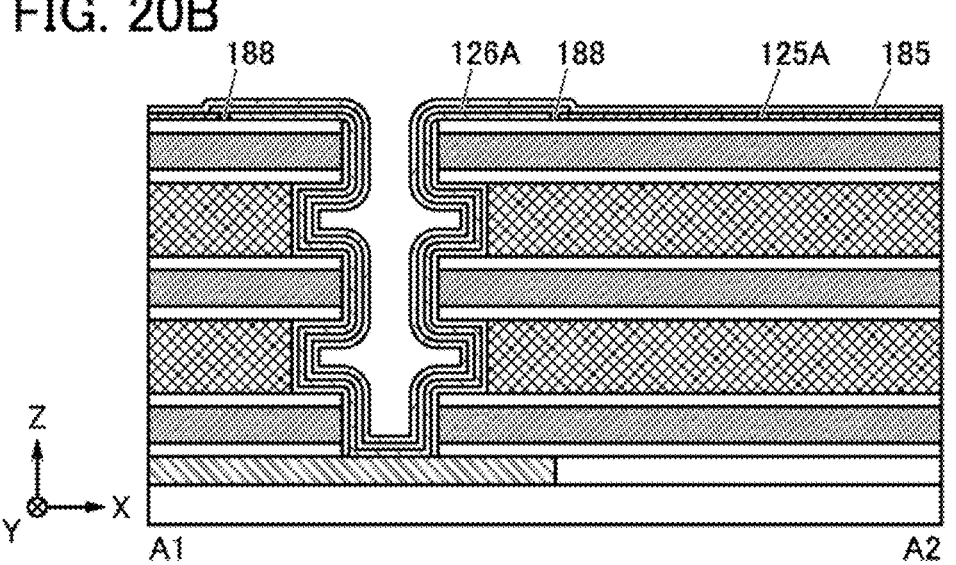
Figure 20C:
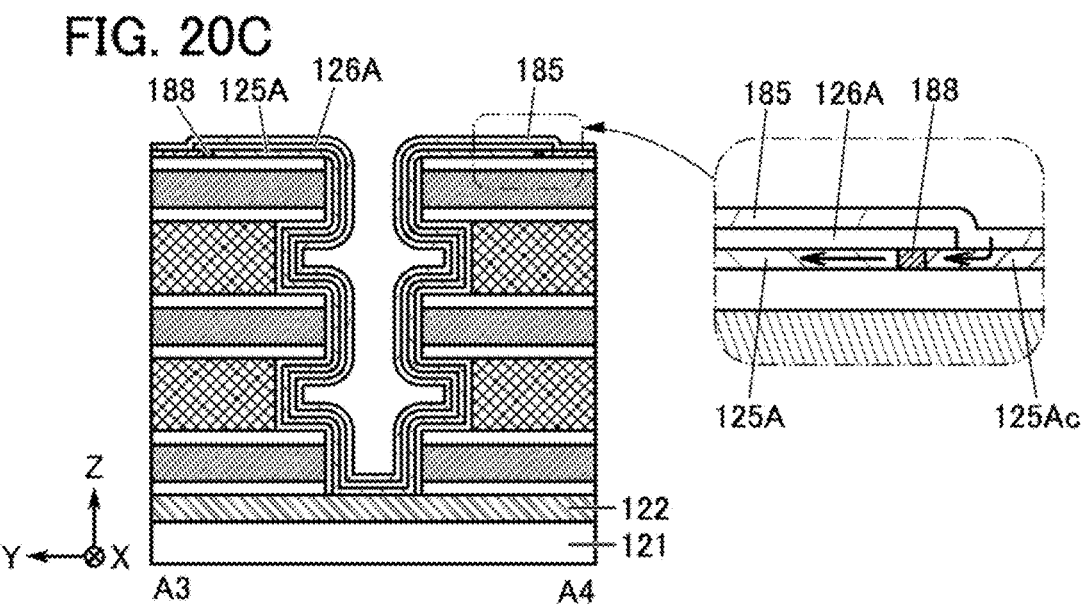
Figure 22A:
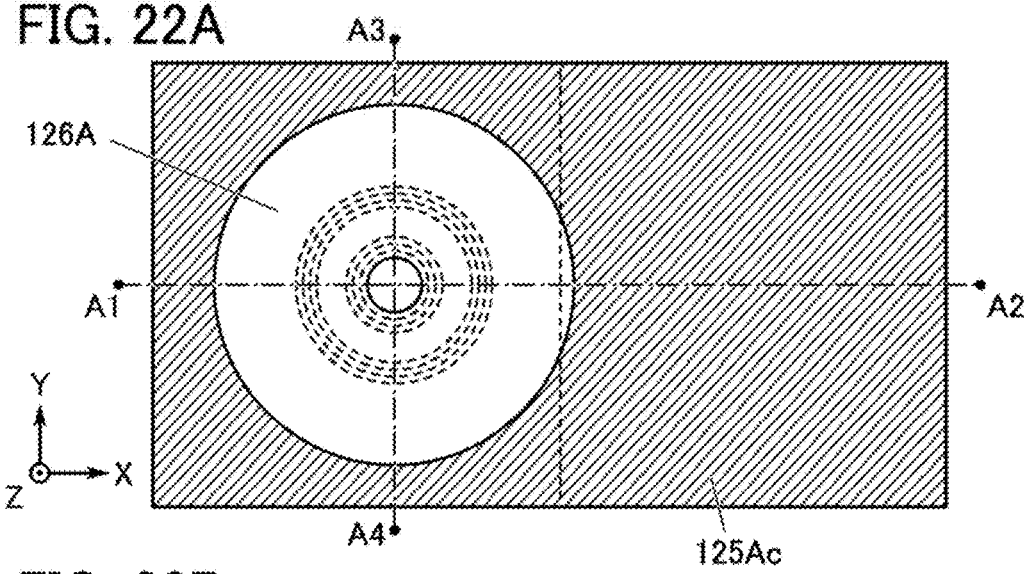
FIG. 22A to FIG. 22C are cross-sectional views illustrating a process for manufacturing a semiconductor device of one embodiment of the present invention.
Figure 22B:
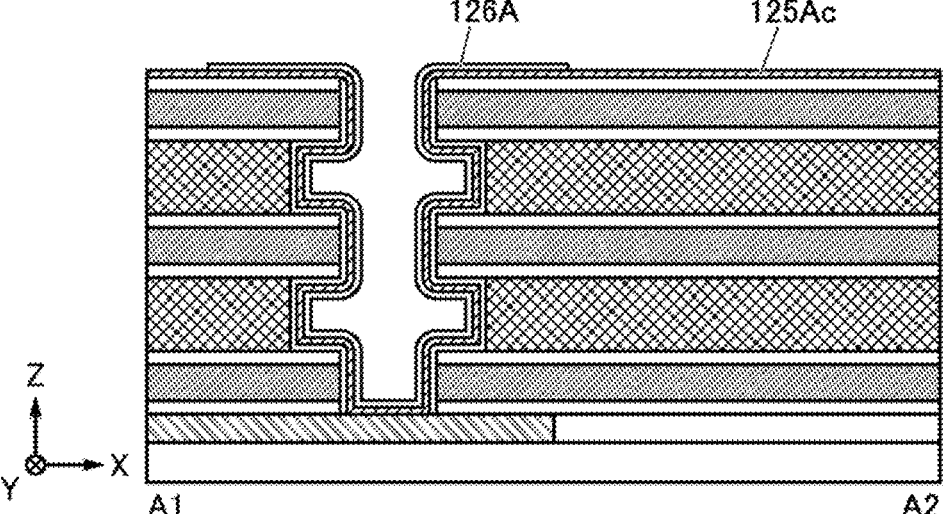
Figure 22C:
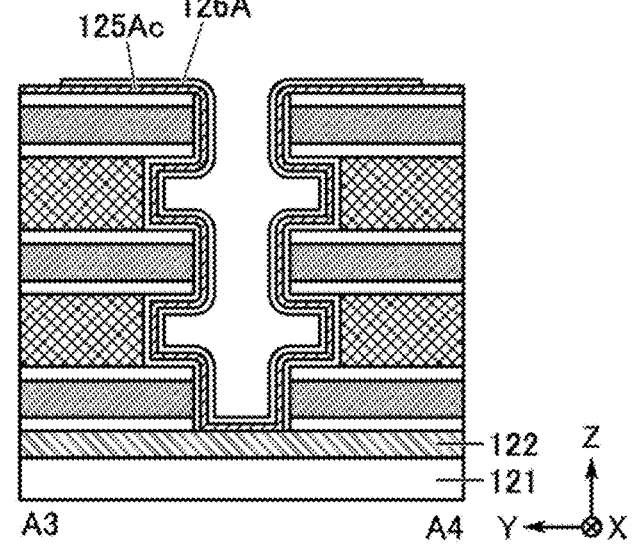

FIG. 20 and FIG. 21 show how a silicide 188 moves from the catalytic element addition region to the semiconductor film 125A. FIG. 20 shows the initial state of heat treatment. First, a silicide is formed in the semiconductor film 125A in contact with the catalytic element addition region. Since the insulating film 126A functions as a mask, the catalytic element is not added to the semiconductor film 125A in a region overlapping with the insulating film 126A. As the heat treatment proceeds, the silicide 188 moves away from the catalytic element addition region. In the semiconductor film 125A, a portion where catalytic crystallization took place (i.e., a portion whose crystallinity was increased by the catalytic element) is shown as a semiconductor film 125Ac. The semiconductor film 125A being an amorphous semiconductor is changed into a crystalline semiconductor by passage of the silicide 188.

FIG. 21 shows the middle state of the heat treatment. As the heat treatment proceeds, the silicide 188 moves toward the layer 122. Amorphous silicon containing phosphorus is used for the layer 122 in this embodiment; thus, crystallization of the layer 122 is facilitated when the silicide 188 reaches the layer 122 during the heat treatment.

Finally, the catalytic element contained in the silicide 188 becomes contained in the layer 122 (gettering treatment). When the layer 122 contains an impurity element such as a Group 15 element or a Group 13 element, re-diffusion of the catalytic element that has moved to the layer 122 can be reduced.

The concentration of the catalytic element remaining in the semiconductor film 125Ac is preferably $5 \times 10^{17}$ atoms/cm$^3$ or lower. In the case where the layer 122 contains an impurity element such as a Group 15 element, it is possible to make the catalytic element remaining in the semiconductor film 125Ac move to (become absorbed by) the layer 122 by performing heat treatment at an even higher temperature after the heat treatment of the semiconductor film 125A with the use of the catalytic element. When the layer 122 contains an impurity element, the effect of the gettering treatment can be enhanced.

Figure 23A:
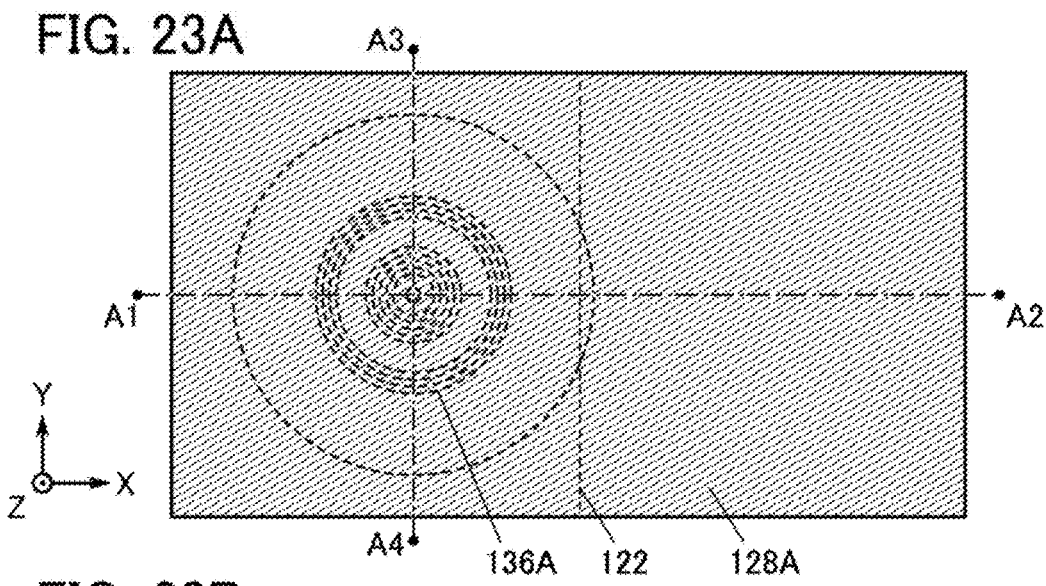
FIG. 23A to FIG. 23C are cross-sectional views illustrating a process for manufacturing a semiconductor device of one embodiment of the present invention.
Figure 23B:
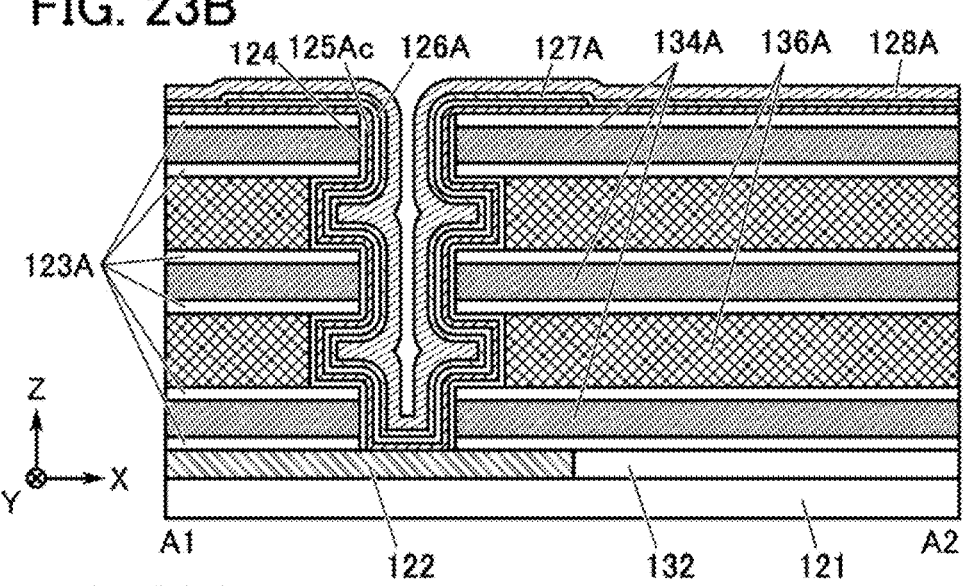
Figure 23C:
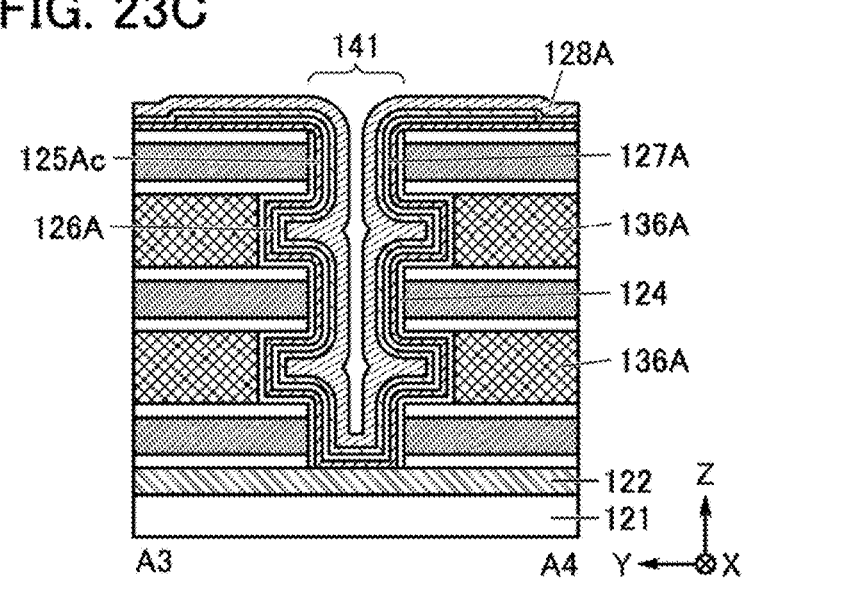

Next, the catalyst layer 185 is removed (see FIG. 22A to FIG. 22C), and a semiconductor film 127A and a conductive film 128A are formed in the first opening 141 (see FIG. 23A to FIG. 23C).

The semiconductor film 127A and the conductive film 128A can be formed by a CVD method or an ALD method. It is particularly preferable to employ an ALD method, in which case a film with a uniform thickness can be formed even in a groove or an opening portion having a high aspect ratio. Alternatively, the semiconductor film 127A and the conductive film 128A may each be formed by a combination of an ALD method and a CVD method. Alternatively, the films may be formed using different deposition methods or different deposition apparatuses.

The conductive film 128A is at least formed to fill the depressions of the side surface of the first opening 141 (a portion where the first opening 141 and the conductive film 136A cross each other, in a direction perpendicular to the Z direction) with the insulator 124, the semiconductor film 125Ac, the insulating film 126A, and the semiconductor film 127A positioned therebetween, and need not entirely fill the inside of the first opening. The insulating film 128A can be formed by a CVD method or an ALD method. It is particularly preferable to employ an ALD method, in which case a film with a uniform thickness can be formed even in a groove or an opening portion having a high aspect ratio. Alternatively, the conductive film 128A may be formed by a combination of an ALD method and a CVD method.

The semiconductor film 127A is preferably an oxide semiconductor. As an oxide semiconductor used for the semiconductor film 127A, an oxide semiconductor such as CAAC-OS, nc-OS, or a-like OS can be used.

Figure 24A:
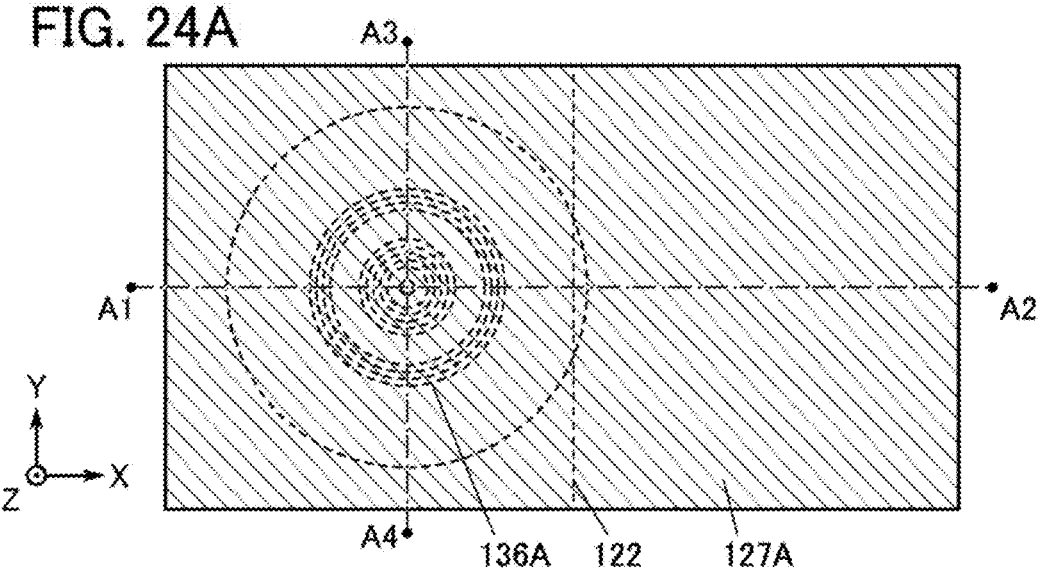
FIG. 24A to FIG. 24C are cross-sectional views illustrating a process for manufacturing a semiconductor device of one embodiment of the present invention.
Figure 24B:
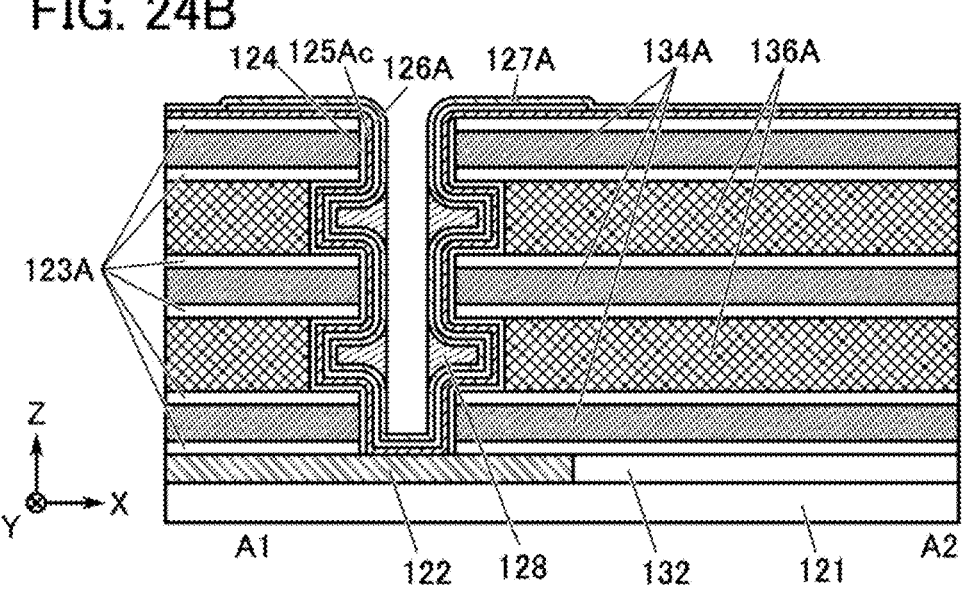
Figure 24C:
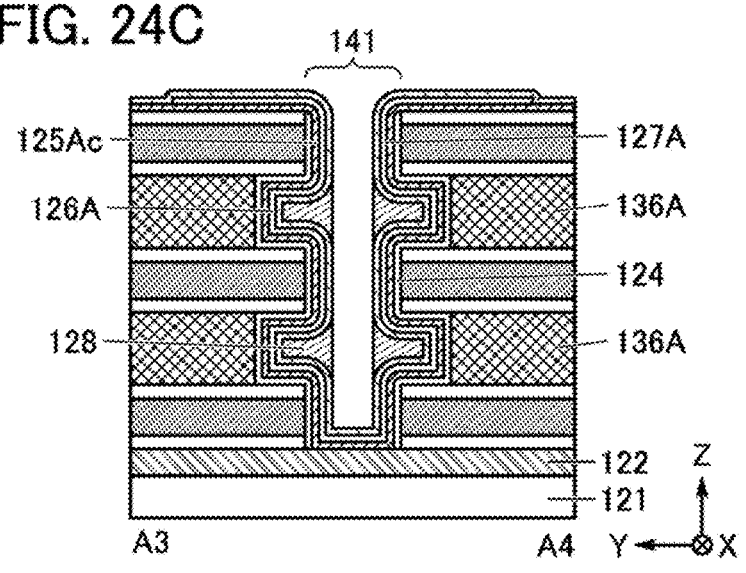

Next, the conductive film 128A is processed to form conductors 128 (see FIG. 24A to FIG. 24C). For the processing of the conductive film 128A, isotropic etching or anisotropic etching can be used. In the case where, although the formed conductive film 128A fills the depression on the side surface of the first opening 141, the conductive film 128A does not completely fill the first opening 141 (see FIG. 23), isotropic etching is preferably used for the processing of the conductive film 128A. By contrast, in the case where the conductive film 128A is formed to completely fill the first opening 141, anisotropic etching is preferably used. By the above-described processing, the conductor 128 can be formed in the depression on the side surface of the first opening 141.

Next, an insulating film 129A is formed inward from the semiconductor film 127A and the conductors 128. Then, the resistance of part of the semiconductor film 127A is increased using the conductors 128 as a mask to form high-resistance regions (I-type regions) (see FIG. 25A to FIG. 25D). As a formation method of the high-resistance regions, there is a method in which irradiation of the semiconductor film 127A with a microwave 144 through the insulating film 129A is performed to remove hydrogen contained in the semiconductor film 127A. The irradiation with the microwave 144 is preferably performed in an atmosphere containing oxygen, in which case oxygen is supplied to the semiconductor film 127A. In this embodiment, part of the semiconductor film 127A is irradiated with the microwave 144 through the insulating film 129A under an atmosphere containing oxygen and argon, whereby the resistance of a region 146 which is part of the semiconductor film 127A is increased (see FIG. 25D).

Here, heat treatment may be performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

The heat treatment reduces the resistance of the semiconductor film 127A in contact with the conductors 128, so that low-resistance regions (N-type regions) can be formed in regions 148. The heat treatment performed in the state where the semiconductor film 127A and the conductors 128 are in contact with each other sometimes forms a metal compound layer containing a metal element contained in the conductors 128 and a component of the semiconductor film 127A at an interface between the conductors 128 and the semiconductor film 127A. Formation of the metal compound layer is preferable because the resistance of the semiconductor film 127A is reduced in the regions in contact with the conductors 128. In addition, oxygen contained in the semiconductor film 127A is absorbed by the conductors 128 in some cases. When the heat treatment is performed in the state where the semiconductor film 127A and the conductors 128 are in contact with each other, the resistance of the semiconductor film 127A is further reduced. The heat treatment may be performed before the microwave treatment. Since the regions 148 whose resistance is reduced by the heat treatment are covered with the conductors 128, the regions 148 are not affected by the microwave 144 and can maintain the low resistance value even after the microwave treatment.

It is preferable that the carrier concentration of the region 146 after the above-described microwave treatment and heat treatment be lower than $1\times10^{18}$/cm$^3$, further preferably lower than or equal to $1\times10^{17}$/cm$^3$, still further preferably lower than or equal to $1\times10^{16}$/cm$^3$. The carrier concentration of the regions 148 is preferably higher than or equal to $1\times10^{18}$/cm$^3$, further preferably higher than or equal to $1\times10^{19}$/cm$^3$, still further preferably higher than or equal to $1\times10^{20}$/cm$^3$.

Next, a conductive film 130A is formed (see FIG. 26A to FIG. 26C). The conductive film 130A can be formed by a CVD method or an ALD method. It is particularly preferable to employ an ALD method, in which case a film with a uniform thickness can be formed even in a groove or an opening portion having a high aspect ratio. Alternatively, the conductive film 130A may be formed by a combination of an ALD method and a CVD method.

Then, heat treatment is performed. The heat treatment is preferably performed in an atmosphere containing nitrogen at 200° C. to 500° C. inclusive, preferably 300° C. to 400° C. inclusive. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

Next, the conductive film 130A is removed by a CMP method or the like until a surface of the insulating film 129A is exposed, whereby the conductor 130 is obtained (see FIG. 27A to FIG. 27C). Note that the above-described heat treatment may be performed after the formation of the conductor 130.

Next, the semiconductor film 125A, the insulating film 126A, the semiconductor film 127A, and the insulating film 129A are processed, whereby the semiconductor 125, the insulator 126, an oxide film 127B and an insulating film 129B are obtained (see FIG. 28A to FIG. 28C). For the processing, a dry etching method or a wet etching method can be employed.

Figure 29A:
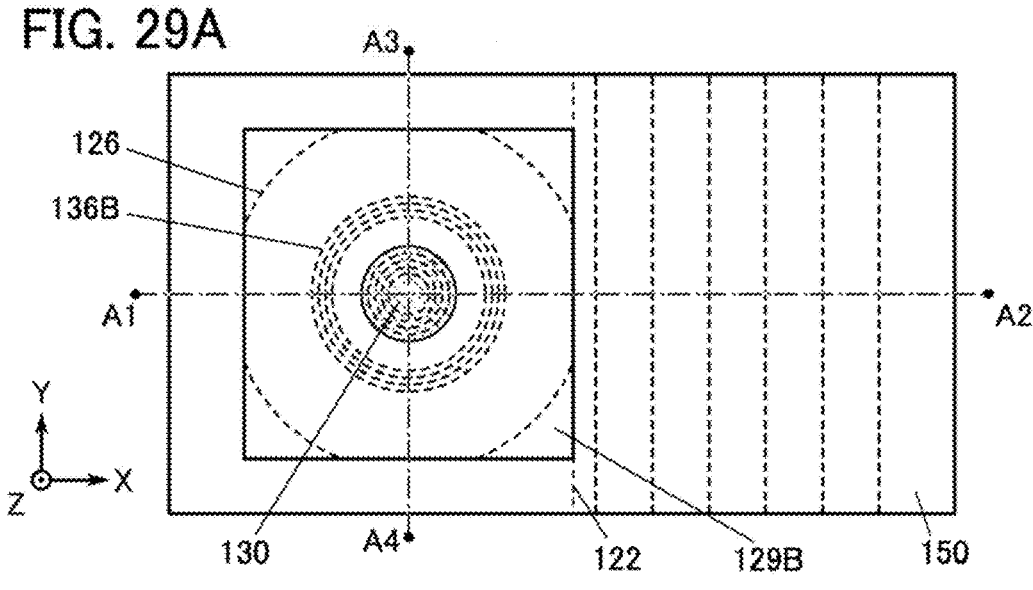
FIG. 29A to FIG. 29C are cross-sectional views illustrating a process for manufacturing a semiconductor device of one embodiment of the present invention.
Figure 29B:
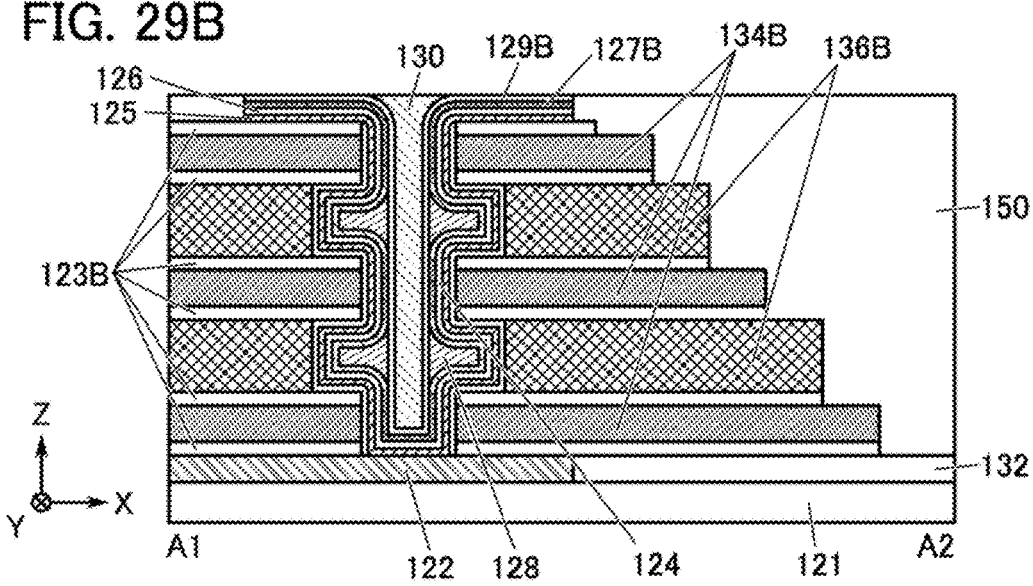
Figure 29C:
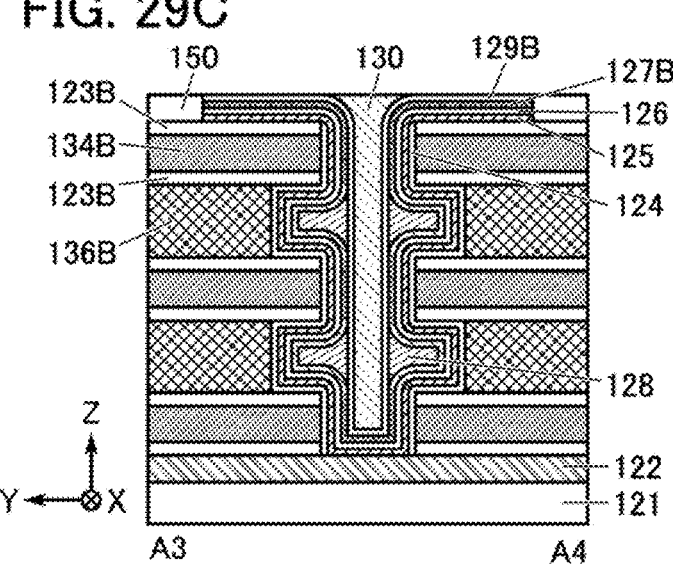
Figure 30A:
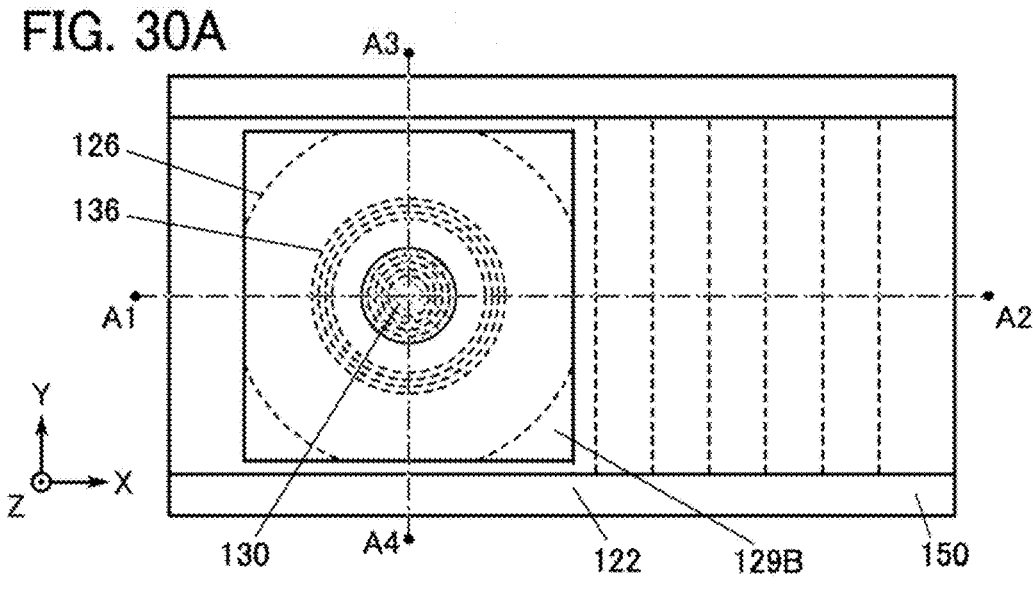
FIG. 30A to FIG. 30C are cross-sectional views illustrating a process for manufacturing a semiconductor device of one embodiment of the present invention.
Figure 30B:
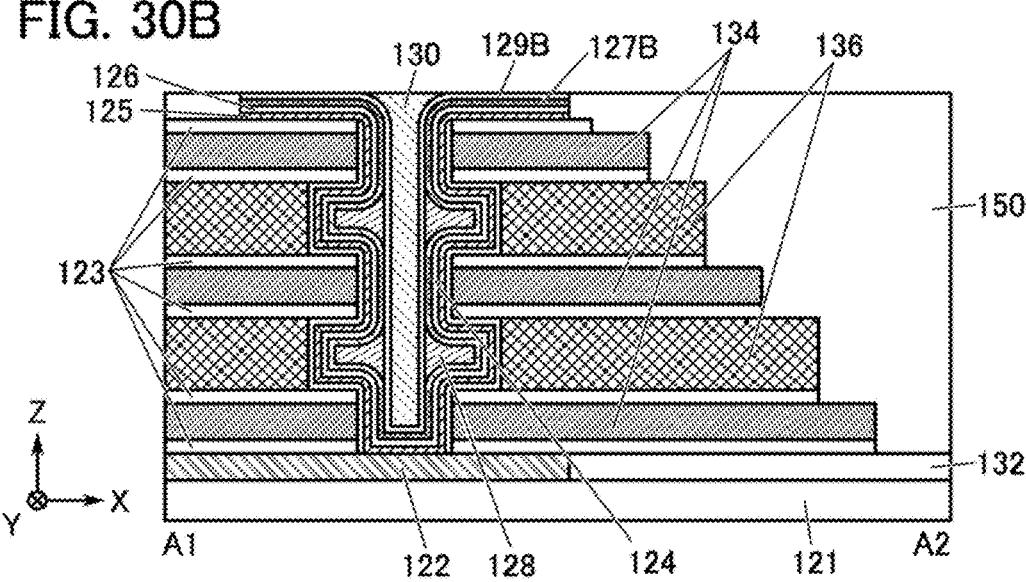
Figure 30C:
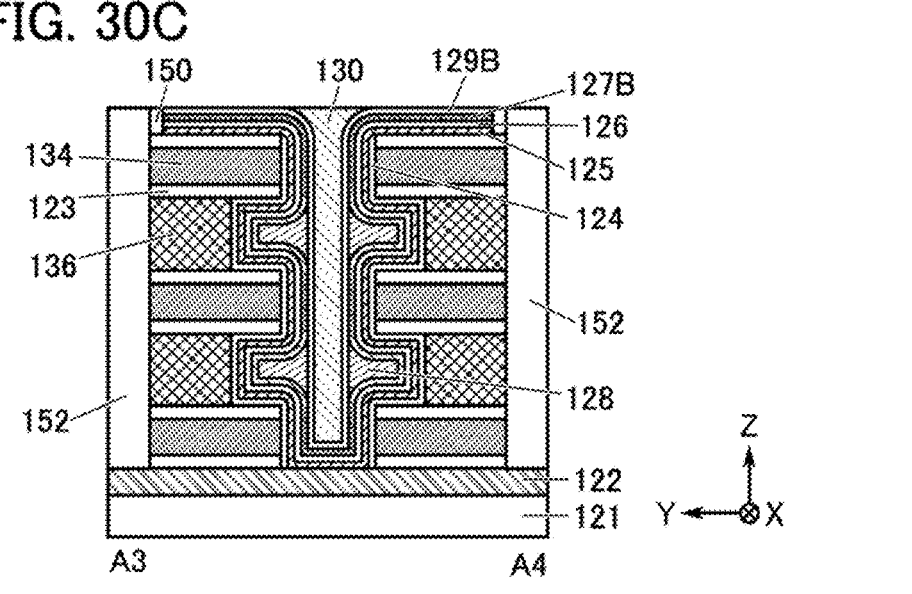

Next, the insulating films 123A, the conductive films 134A, and the conductive films 136A are processed, so that insulators 123B, conductors 134B, and conductors 136B overlapping with each other to have a step-like shape at an edge portion as illustrated in FIG. 29B are formed (see FIG. 29A to FIG. 29C). In the processing of the insulating films 123A, the conductive films 134A, and the conductive films 136A, etching of the insulating films 123A, the conductive films 134A, and the conductive films 136A and slimming of a mask are alternately performed, whereby the step-like edge portion can be formed.

Next, an insulator 150 is formed (see FIG. 29). The insulator 150 can be formed by a CVD method. The surface of the insulator 150 is preferably planarized by a CMP method or a reflow method.

Next, the insulator 150, the insulators 123B, the conductors 134B, and the conductors 136B are processed, so that the insulators 123, conductors 134, and conductors 136 are formed. (see FIG. 30A to FIG. 30C).

Next, an insulator 152 is formed to fill a portion removed at the time of formation of the insulator 123, the conductor 134, and the conductor 136 (see FIG. 30). The insulator 152 can be formed by a CVD method or an ALD method. It is particularly preferable to employ an ALD method, in which case a film with a uniform thickness can be formed even in a groove or an opening portion having a high aspect ratio. Alternatively, the insulator 152 may be formed by a combination of an ALD method and a CVD method. The insulator 152 is preferably subjected to planarization treatment by a CMP method or a reflow method.

Figure 31A:
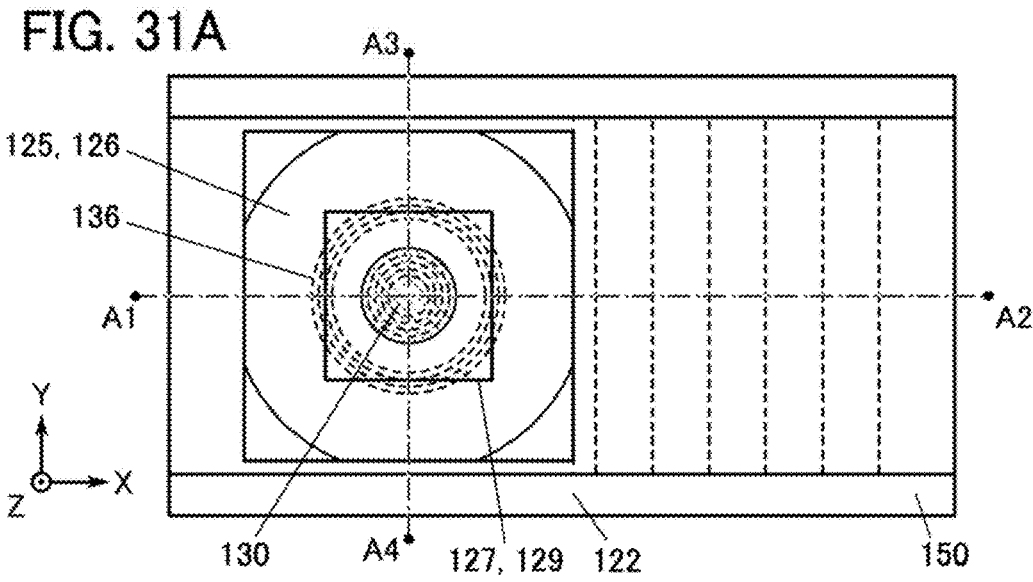
FIG. 31A to FIG. 31C are cross-sectional views illustrating a process for manufacturing a semiconductor device of one embodiment of the present invention.
Figure 31B:
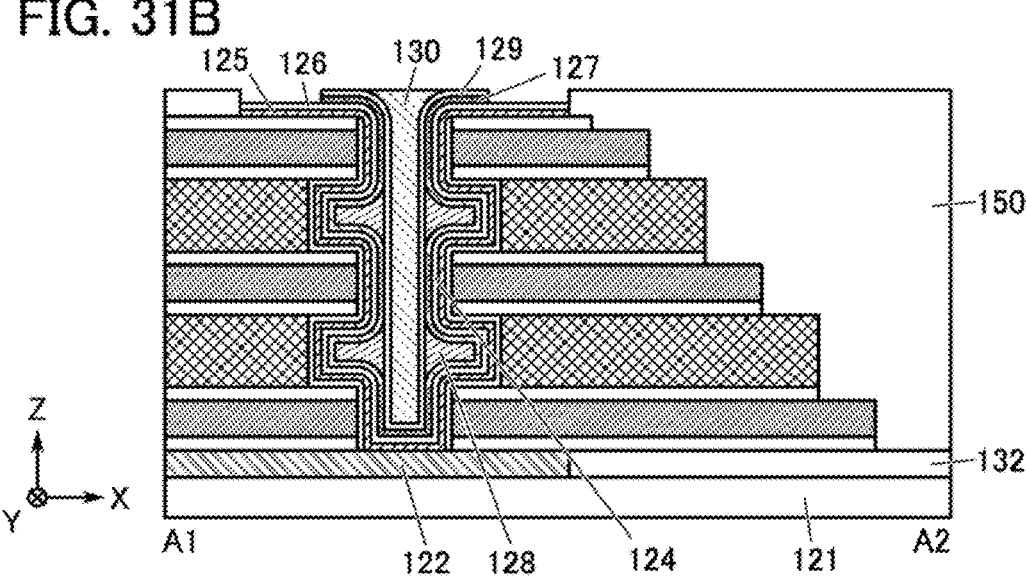
Figure 31C:
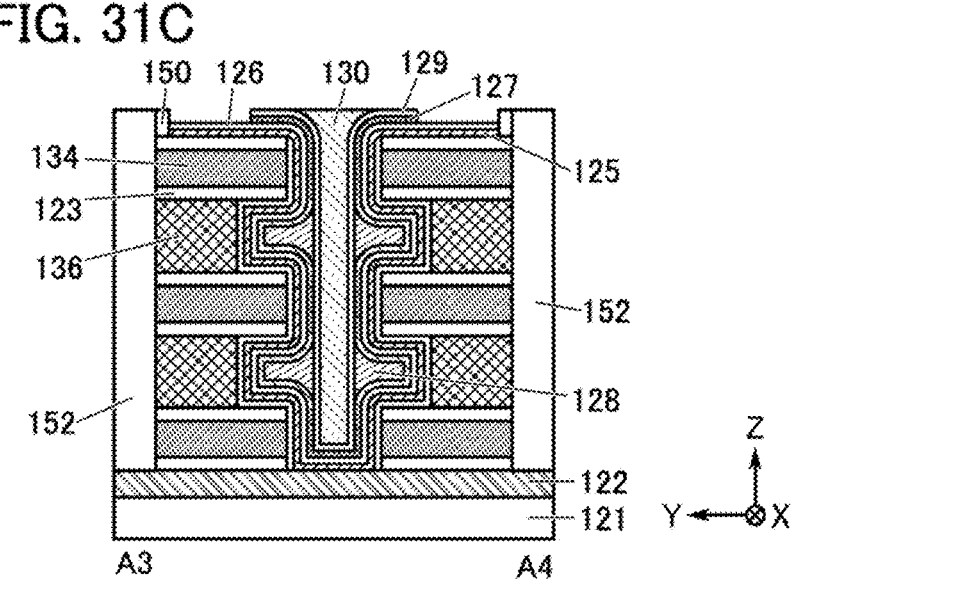

Next, the oxide film 127B and the insulating film 129B are processed by a lithography technique, so that the semiconductor 127 and the insulator 129 are obtained (see FIG. 31A to FIG. 31C). For the processing, a dry etching method or a wet etching method can be employed. At this time, part of the insulator 126 is exposed.

Figure 32A:
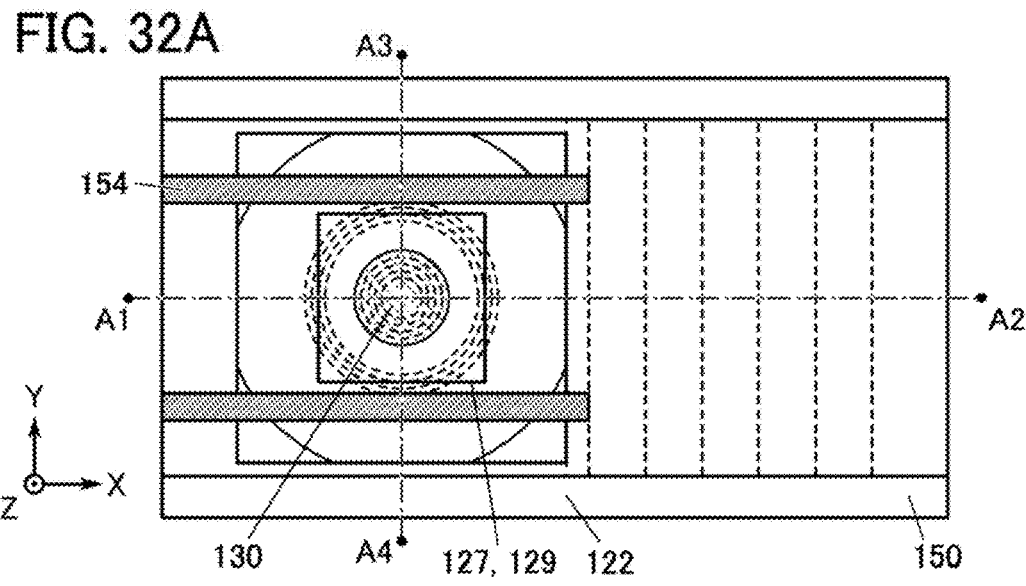
FIG. 32A to FIG. 32C are cross-sectional views illustrating a process for manufacturing a semiconductor device of one embodiment of the present invention.
Figure 32B:
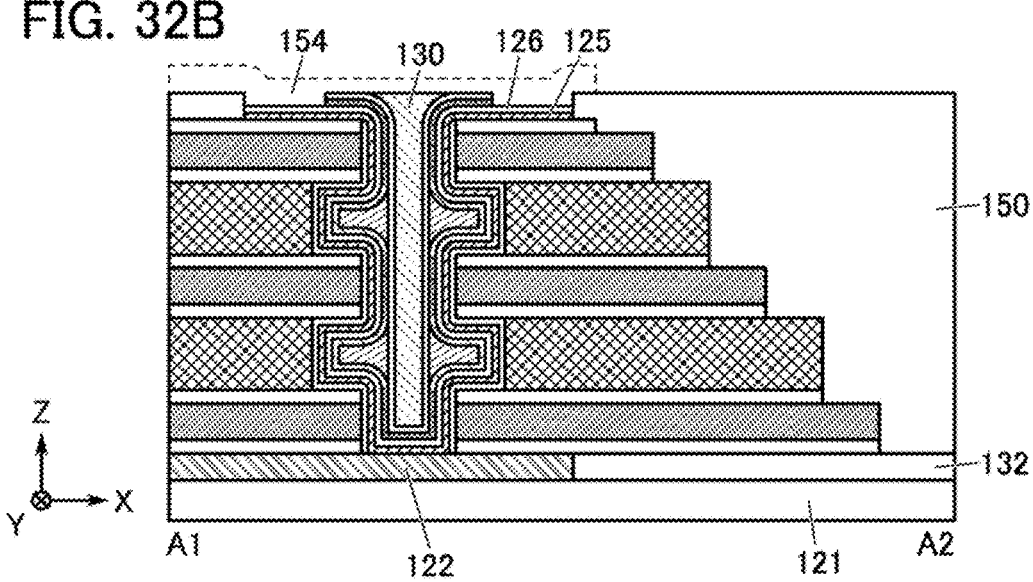
Figure 32C:
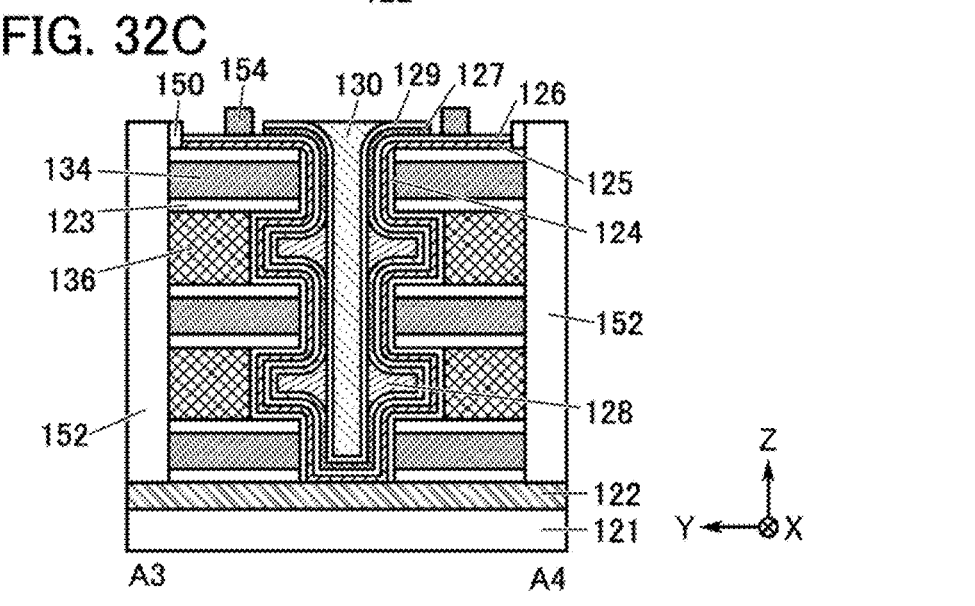

Next, conductors 154 are formed so as to overlap with part of the semiconductor 125 with the insulator 126 therebetween (see FIG. 32A to FIG. 32C). The conductors 154 are obtained in such a manner that a conductive film is formed over the insulator 126, the insulator 150, and the insulator 152 and processed by a lithography technique. Note that although the conductors 154 do not exist on the dashed-dotted line A1-A2 in FIG. 32A, the conductors 154 are illustrated with a dashed line in FIG. 32B. The conductors 154 are illustrated in a similar manner also in FIG. 33 and FIG. 34 described later.

Figure 33A:
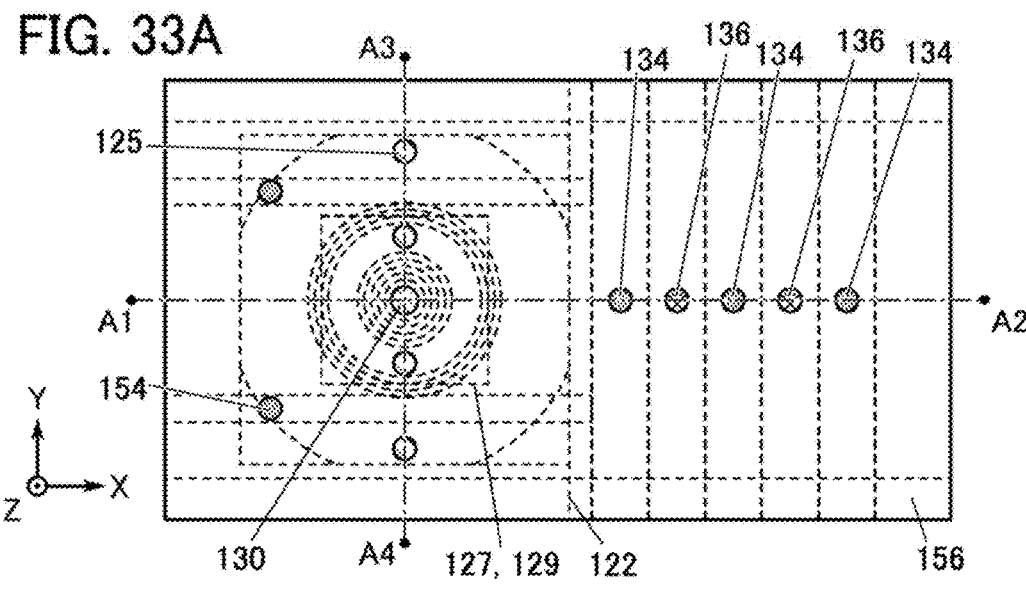
FIG. 33A to FIG. 33C are cross-sectional views illustrating a process for manufacturing a semiconductor device of one embodiment of the present invention.
Figure 33B:
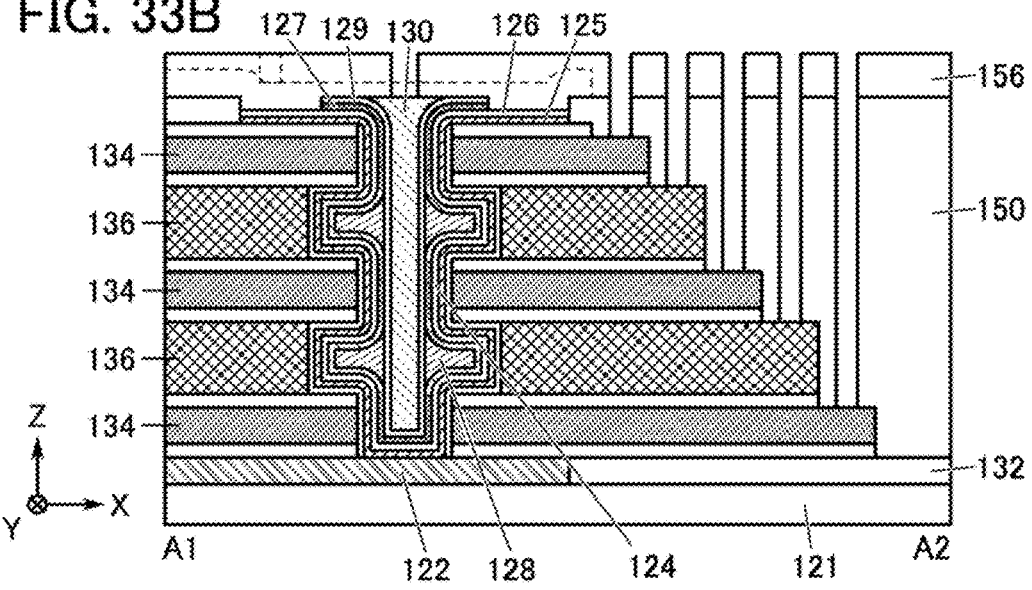
Figure 33C:
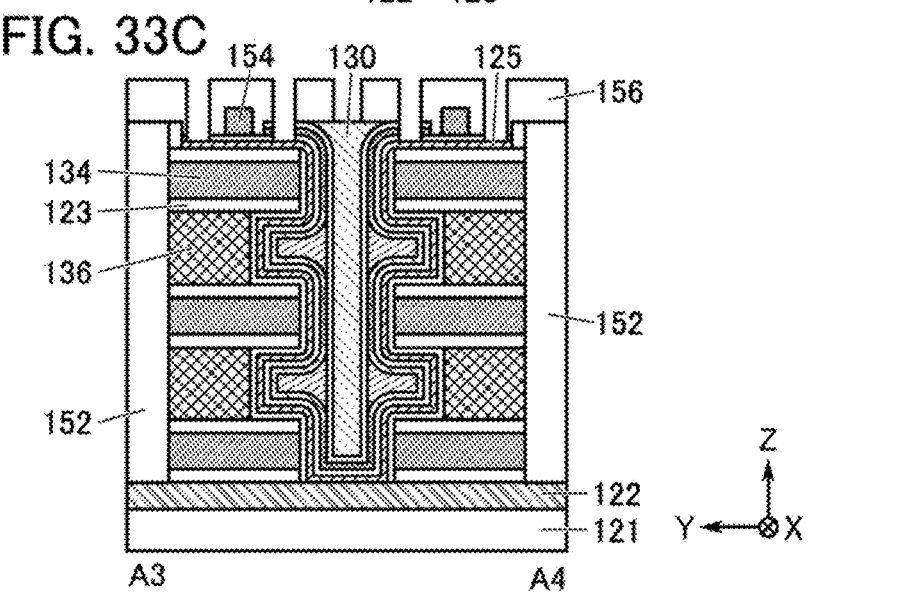

Next, an insulator 156 is formed so as to cover the conductors 154, the insulator 126, the insulator 150, and the insulator 152 (see FIG. 33A to FIG. 33C). The insulator 156 can be formed by a CVD method, an ALD method, a sputtering method, or the like.

Next, the insulator 156, the insulator 126, the insulator 129, the semiconductor 127, and the insulator 150 are processed by a lithography technique, whereby second openings are formed so as to expose the conductors 134, the conductors 136, the conductor 130, the conductors 154, and the semiconductor 125. The second opening is formed for each of the conductors 134 and the conductors 136 formed stepwise (see FIG. 33).

Figures 34A, 34B, 34C:
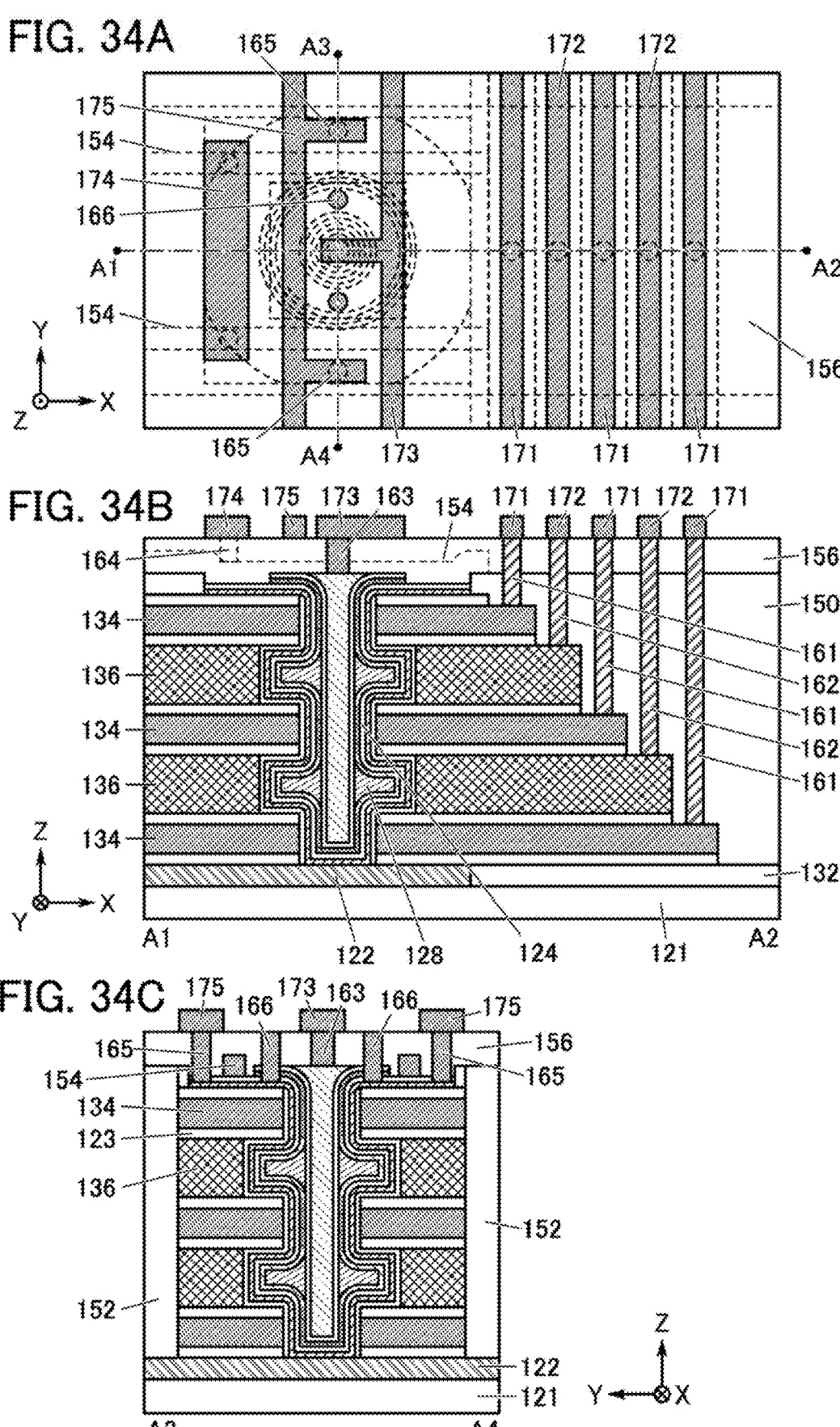
FIG. 34A to FIG. 34C are cross-sectional views illustrating a process for manufacturing a semiconductor device of one embodiment of the present invention.

Next, conductors 161 electrically connected to the conductors 134, conductors 162 electrically connected to the conductors 136, a conductor 163 electrically connected to the conductor 130, conductors 164 electrically connected to the conductors 154, conductors 165 electrically connected to the semiconductor 125, and conductors 166 electrically connected to the semiconductor 125 and the semiconductor 127 are formed so as to be embedded in the second openings (see FIG. 34A to FIG. 34C). The conductors 161, the conductors 162, the conductor 163, the conductors 164, the conductors 165, and the conductors 166 can be formed by a CVD method or an ALD method. It is particularly preferable to employ an ALD method, in which case a film with a uniform thickness can be formed even in a groove or an opening portion having a high aspect ratio. Alternatively, the above-described conductors may be formed by a combination of an ALD method and a CVD method. The conductors 161, the conductors 162, the conductor 163, the conductor 164, the conductors 165, and the conductors 166 may have a stacked-layer structure composed of a plurality of layers. The conductors 161, the conductors 162, the conductor 163, the conductor 164, the conductors 165, and the conductors 166 can be formed in such a manner that a conductive film is formed over the insulator 156 and inside the second openings and an unnecessary conductive film is removed by CHIP or the like.

Next, conductors 171 electrically connected to the conductors 161, conductors 172 electrically connected to the conductors 162, a conductor 173 electrically connected to the conductor 163, a conductor 174 electrically connected to the conductors 164, and a conductor 175 electrically connected to the conductors 165 are formed (see FIG. 34). The conductors 171, the conductors 172, the conductor 173, the conductor 174, and the conductor 175 can be formed in such a manner that a conductive film is formed over the insulator 156 and processed by a lithography technique. For the processing, a dry etching method or a wet etching method can be employed.

The conductors 171, the conductors 161, and the conductors 134 function as a conductor SG or the conductors WWL. The conductors 172, the conductors 162, and the conductors 136 function as the conductors RWL. The conductor 173, the conductor 163, and the conductor 130 function as a conductor BG. The conductor 174, the conductors 164, and the conductors 154 function as conductors SEL. The conductor 175 and the conductors 165 function as BL. Through the above-described steps, the memory device can be manufactured.

This embodiment can be implemented in an appropriate combination with the structures described in the other embodiments and the like.

Embodiment 2

Figure 35:
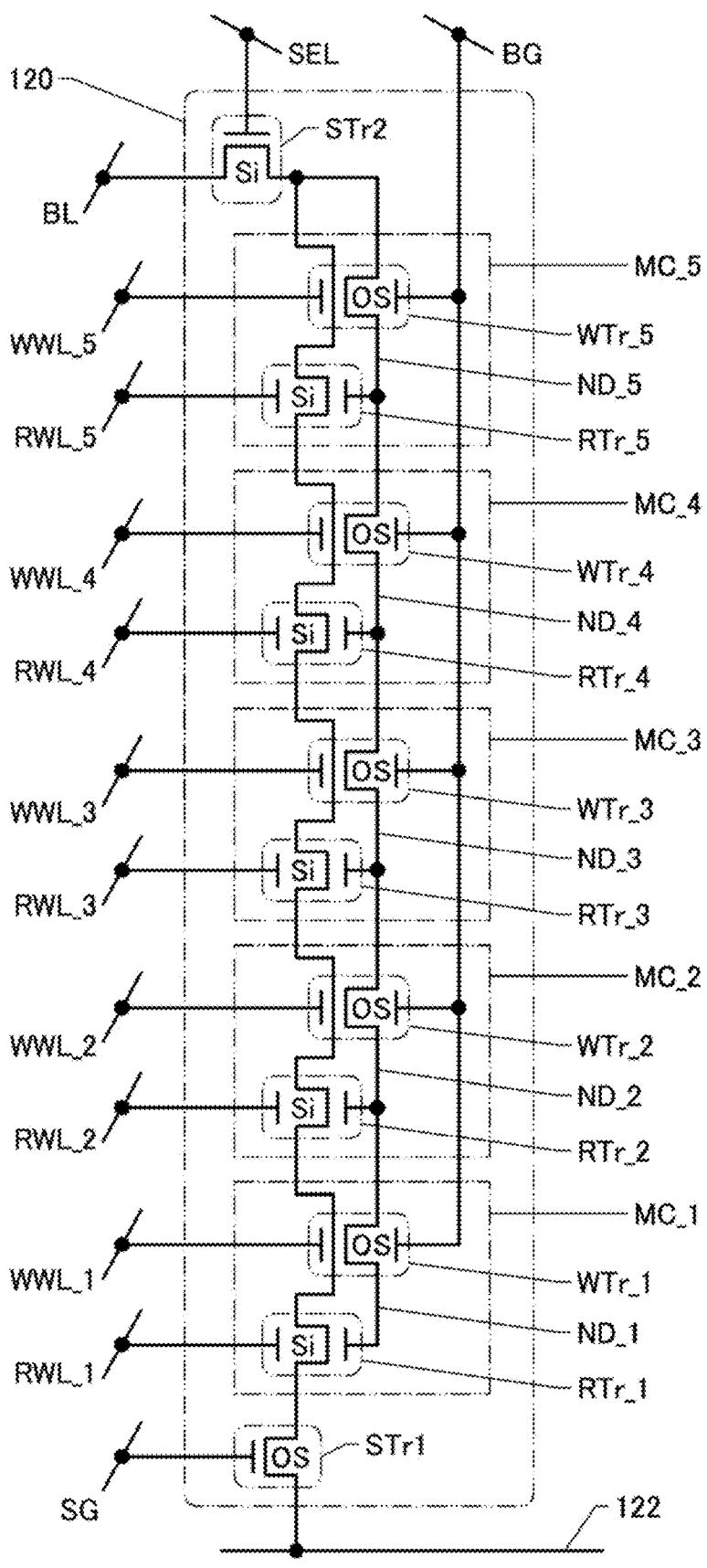
FIG. 35 is a diagram illustrating a circuit structure example of a memory string.

In this embodiment, a circuit structure and an operation of the memory string 120, which is a memory device, are described. FIG. 35 illustrates a circuit structure example of the memory string 120.

<Circuit Structure Example of Memory String>

In FIG. 35, a circuit structure example in the case where the number n of memory elements MC included in the memory string 120 is five is illustrated. As described in the above embodiment, the memory elements MC each include the transistor WTr and the transistor RTr.

To clarify that a transistor is an OS transistor in an equivalent circuit diagram and the like, "OS" is sometimes written beside a circuit symbol of the transistor. Similarly, to clarify that a transistor is a Si transistor (a transistor using silicon in a semiconductor layer in which a channel is formed), "Si" is sometimes written beside a circuit symbol of the transistor. FIG. 35 illustrates that the transistor WTr is an OS transistor and the transistor RTr is a Si transistor.

Figure 36:
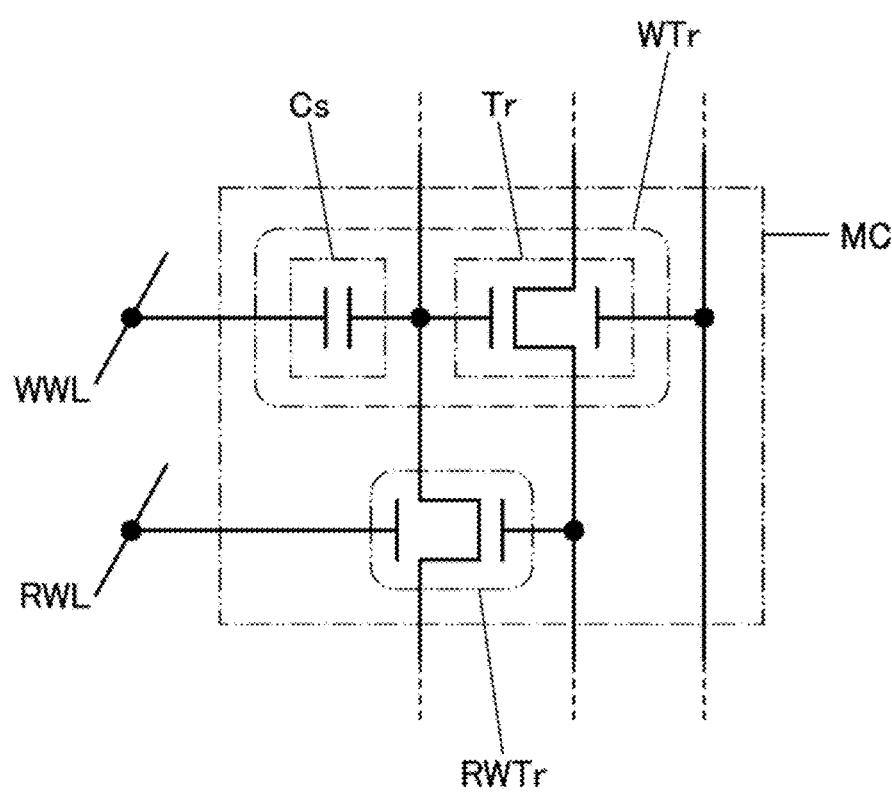
FIG. 36 is an equivalent circuit diagram of a memory element MC.

FIG. 36 is an equivalent circuit diagram of the memory element MC. As illustrated in FIG. 36, the transistor WTr can be represented by being replaced with a capacitor Cs and a transistor Tr. A gate of the transistor Tr is electrically connected to the conductor WWL through the capacitor Cs. The memory element MC described as an example in this embodiment is a "2Tr1C-type" memory cell made up of two transistors and one capacitor.

In FIG. 35, the transistor WTr included in a memory element MC_1 is represented by a transistor WTr_1, and the transistor RTr included in the memory element MC_1 is represented by a transistor RTr_1. Thus, the memory string 120 illustrated in FIG. 35 includes the transistor WTr_1 to a transistor WTr_5 and the transistor RTr_1 to a transistor RTr_5. Furthermore, the memory string 120 illustrated in FIG. 35 includes the transistor STr1 and the transistor STr2. The memory string 120 is a NAND memory device.

A NAND memory device including the OS memory is referred to as an "OS NAND type" or an "OS NAND memory device." An OS NAND memory device in which a plurality of OS memories are stacked in the Z direction is referred to as a "3D OS NAND type" or a "3D OS NAND memory device."

One of a source and a drain of the transistor RTr_1 is electrically connected to one of a source and a drain of the transistor STr1, and the other is electrically connected to one of a source and a drain of a transistor RTr_2. One of a source and a drain of the transistor WTr_1 is electrically connected to a gate of the transistor RTr_1, and the other is electrically connected to one of a source and a drain of a transistor WTr_2. A back gate of the transistor RTr_1 is electrically connected to the conductor RWL_1. A gate of the transistor WTr_1 is electrically connected to a conductor WWL_1. A back gate of the transistor WTr_1 is electrically connected to the conductor BG. Furthermore, the other of the source and the drain of the transistor STr1 is electrically connected to the layer 122, and a gate of the transistor STr1 is electrically connected to the conductor SG.

One of a source and a drain of the transistor RTr_5 is electrically connected to the other of a source and a drain of a transistor RTr_4, and the other is electrically connected to one of a source and a drain of the transistor STr2. A gate of the transistor RTr_5 is electrically connected to one of a source and a drain of the transistor WTr_5. The other of the source and the drain of the transistor WTr_5 is electrically connected to the one of the source and the drain of the transistor STr2. A back gate of the transistor RTr_5 is electrically connected to a conductor RWL_5. A gate of the transistor WTr_5 is electrically connected to a conductor WWL_5. A back gate of the transistor WTr_5 is electrically connected to the conductor BG. Furthermore, the other of the source and the drain of the transistor STr2 is electrically connected to a conductor BL, and a gate of the transistor STr2 is electrically connected to a conductor SEL.

In the case where the memory string 120 includes n memory elements MC, in an i-th (i is an integer greater than or equal to 1 and less than or equal to n) memory element MC_i except the first and n-th memory elements MC, one of a source and a drain of a transistor RTr_i is electrically connected to the other of a source and a drain of a transistor RTr_i−1, and the other is electrically connected to one of a source and a drain of a transistor RTr_i+1. A gate of the transistor RTr_i is electrically connected to one of a source and a drain of a transistor WTr_i. The other of the source and the drain of the transistor WTr_i is electrically connected to one of a source and a drain of a transistor WTr_i+1. A back gate of the transistor RTr_i is electrically connected to a conductor RWL_i. A gate of the transistor WTr_i is electrically connected to a conductor WWL_i. Furthermore, a back gate of the transistor WTr_i is electrically connected to the conductor BG.

A node where the gate of the transistor RTr and one of the source and the drain of the transistor WTr are electrically connected to each other is referred to as a node ND. In other words, a node where the gate of the transistor RTr_i and the one of the source and the drain of the transistor WTr_i are electrically connected to each other is referred to as a node ND_i. In FIG. 35, the node ND included in the memory element MC_1 is represented by a node ND_1.

The transistor STr1 and the transistor STr2 may be OS transistors or Si transistors, for example. One of the transistor STr1 and the transistor STr2 may be an OS transistor, and the other may be a Si transistor.

Figure 37:
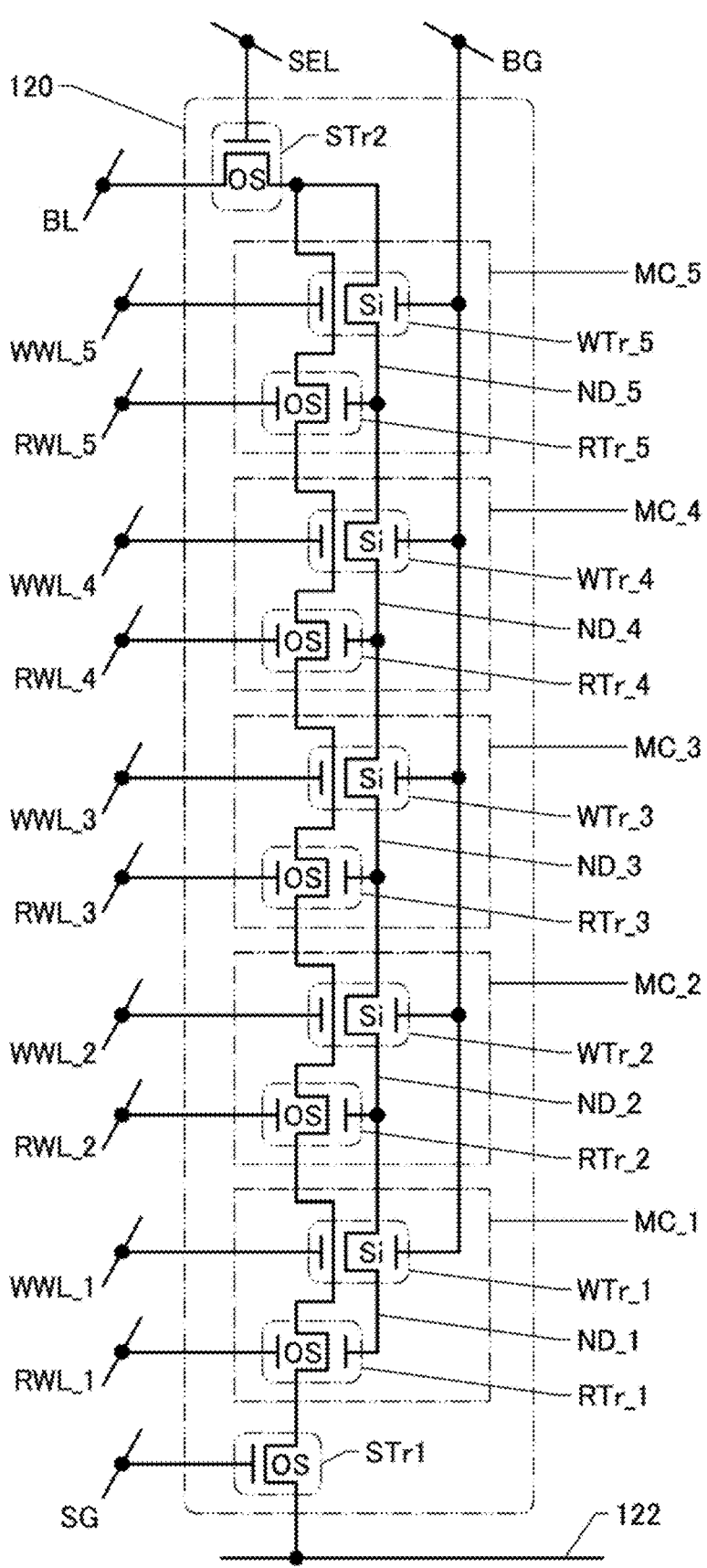
FIG. 37 is a diagram illustrating a circuit structure example of a memory string.

As illustrated in FIG. 37, Si transistors may be used as the transistors WTr and OS transistors may be used as the transistors RTr depending on the purpose, application, or the like. In FIG. 37, an example in which OS transistors are used as the transistor STr1 and the transistor STr2 is shown.

Figure 38:
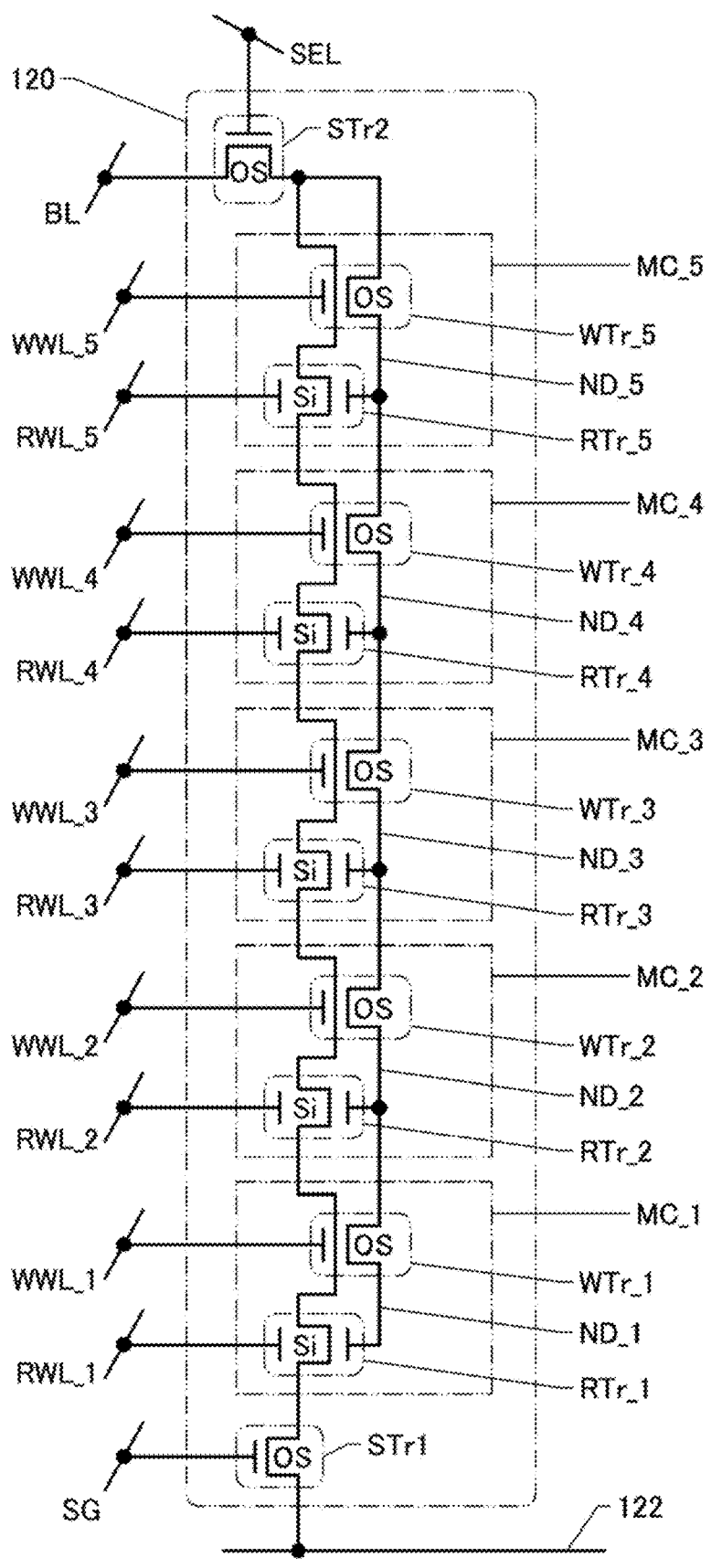
FIG. 38 is a diagram illustrating a circuit structure example of a memory string.

Depending on the purpose, application, or the like, a structure where the transistors WTr are not provided with a back gate may be employed, as shown in FIG. 38. FIG. 38 illustrates an example in which OS transistors are used as the transistor STr1 and the transistor STr2.

<Operation Example of Memory String>

Next, an operation example of the memory string 120 illustrated in FIG. 35 is described.

[Writing Operation]

Figure 39:
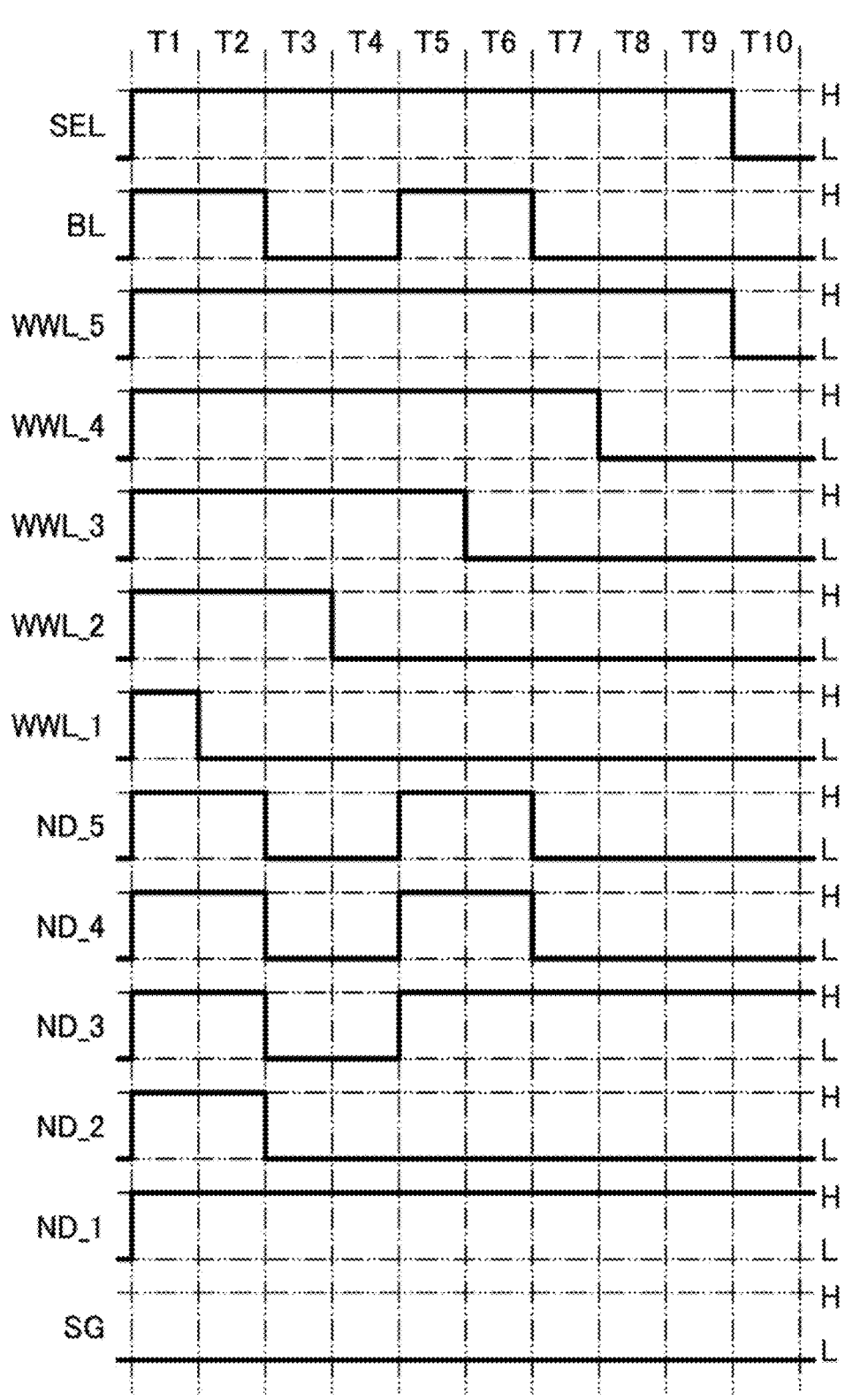
FIG. 39 is a timing chart illustrating a writing operation example of a memory string.

In this embodiment, an operation example of the case where the H potential is written to the memory element MC_1 and a memory element MC_3 and the L potential is written to the other memory elements MC is described. FIG. 39 is a timing chart illustrating a writing operation. FIG. 40A to FIG. 43B are circuit diagrams for explaining the writing operation. Note that FIG. 35 and the like can be referred to for reference numerals and the like not written in FIG. 40A to FIG. 43B.

In an initial state, it is assumed that the L potential is written to the memory element MC_1 to a memory element MC_5. Furthermore, it is assumed that the L potential is supplied to the conductor WWL_1 to the conductor WWL_5, the conductor RWL_1 to the conductor RWL_5, the conductor SEL, the conductor BG, the conductor BL, the conductor SG, and the layer 122. Note that by adjusting the potential supplied to the conductor BG, the threshold of the transistor RTr can be controlled. The potential supplied to the conductor BG may be adjusted appropriately so that the transistor RTr can be a desired normally-on transistor.

[Period T1]

Figure 40A:
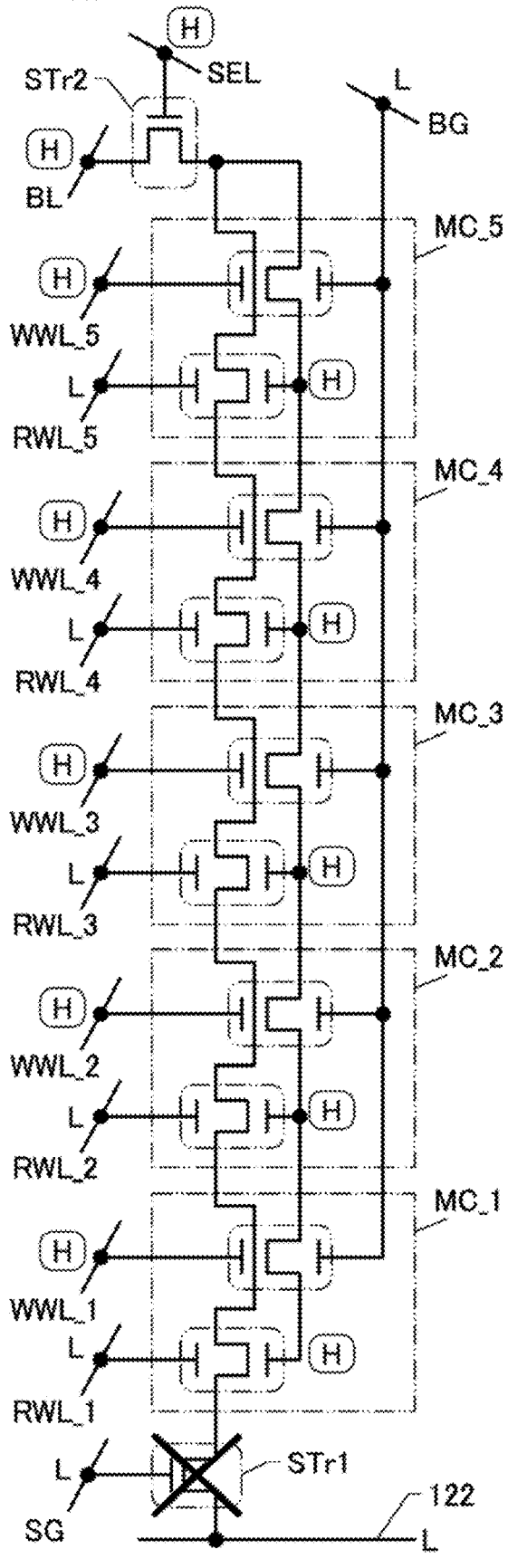
FIG. 40A and FIG. 40B are each a circuit diagram illustrating a writing operation example of a memory string.

In Period T1, the H potential is supplied to the conductor WWL_1 to the conductor WWL_5, the conductor BL, and the conductors SEL (see FIG. 40A). Then, the node ND_1 to a node ND_5 have the H potential.

[Period T2]

Figure 40B:
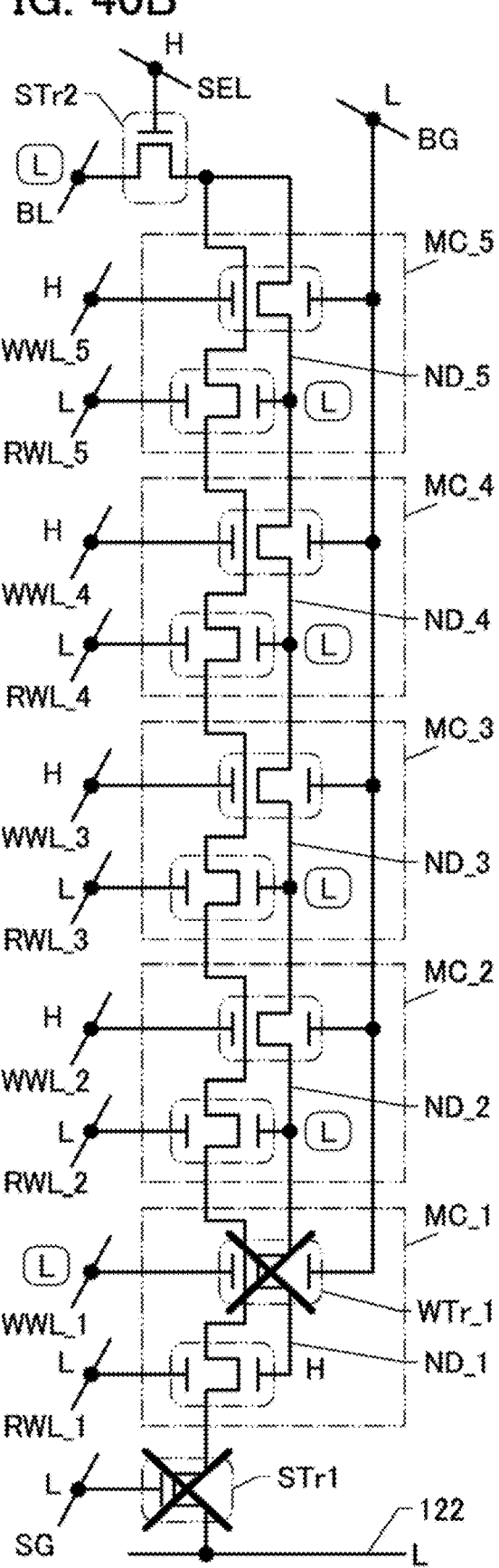

In Period T2, the L potential is supplied to the conductor WWL_1 (see FIG. 40B). This brings the transistor WTr_1 into an off state, and charge written to the node ND_1 is retained. Here, the charge corresponding to the H potential is retained.

[Period T3]

In Period T3, the L potential is supplied to the conductor BL (see FIG. 40B). This brings the potentials of a node ND_2 to the node ND_5 to the L potential. In this case, the gates of the transistor RTr_2 to the transistor RTr_5 are also brought to the L potential; however, since the transistors RTr are normally-on transistors, the transistor RTr_2 to the transistor RTr_5 are not brought into an off state.

[Period T4]

Figure 41A:
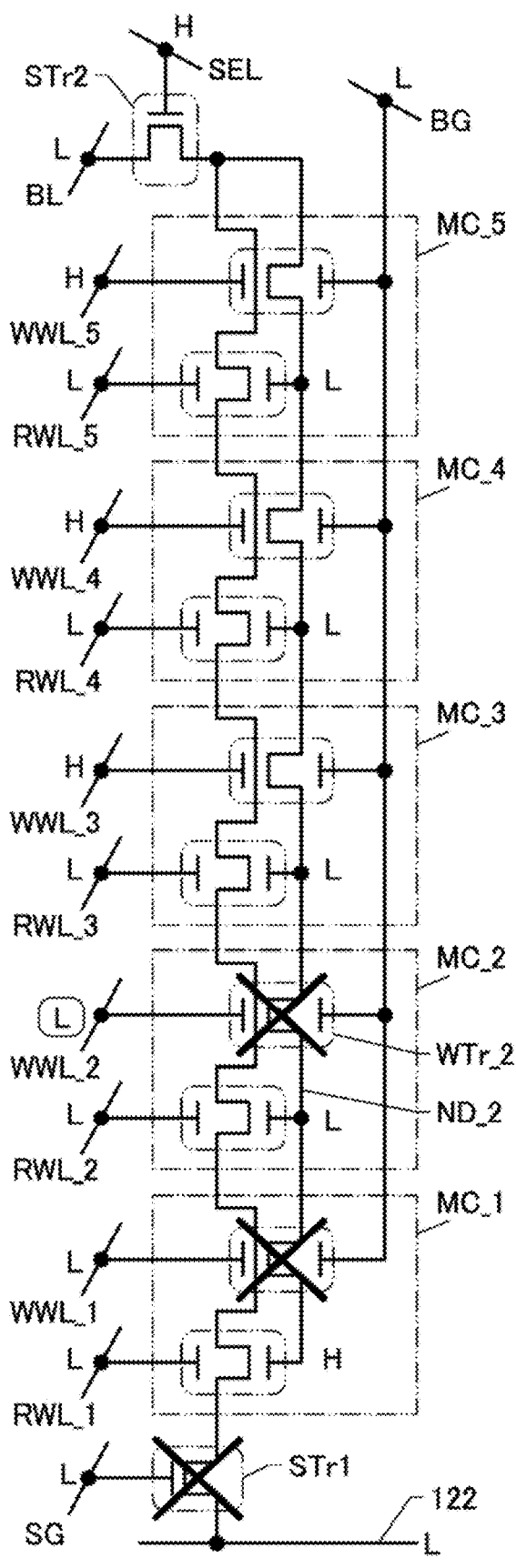
FIG. 41A and FIG. 41B are each a circuit diagram illustrating a writing operation example of a memory string.

In Period T4, the L potential is supplied to the conductor WWL_2 (see FIG. 41A). This brings the transistor WTr_2 into an off state, and charge written to the node ND_2 is retained. Here, the charge corresponding to the L potential is retained.

[Period T5]

Figure 41B:
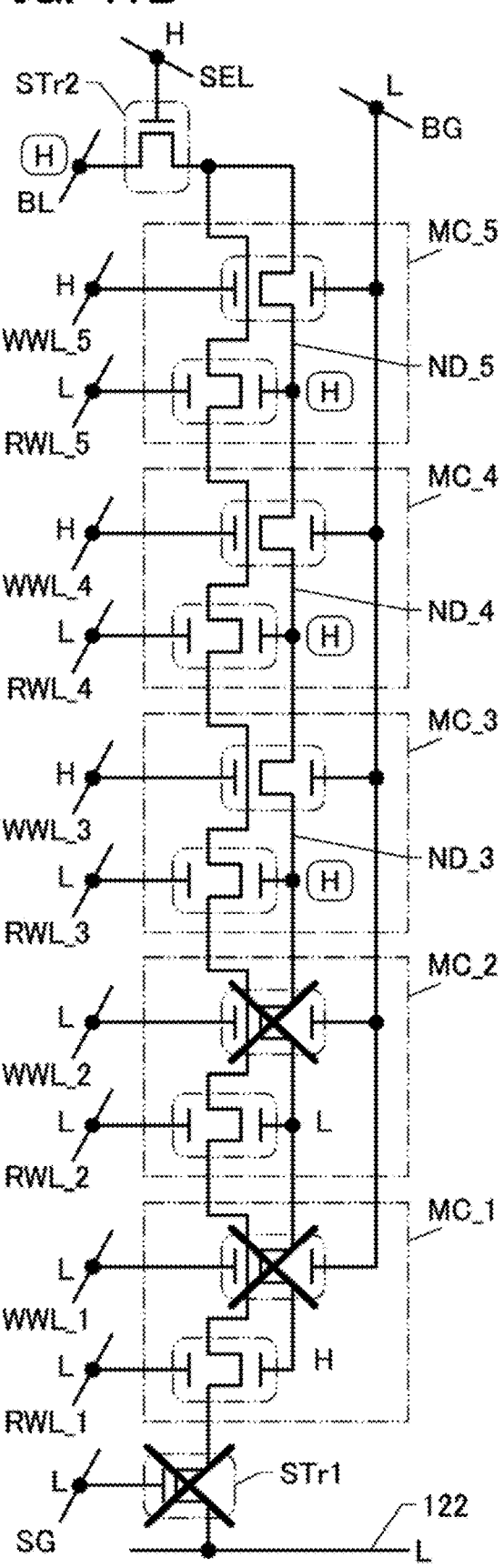

In Period T5, the H potential is supplied to the conductor BL (see FIG. 41B). This brings the potentials of a node_3 to the node_5 to the H potential.

[Period T6]

Figure 42A:
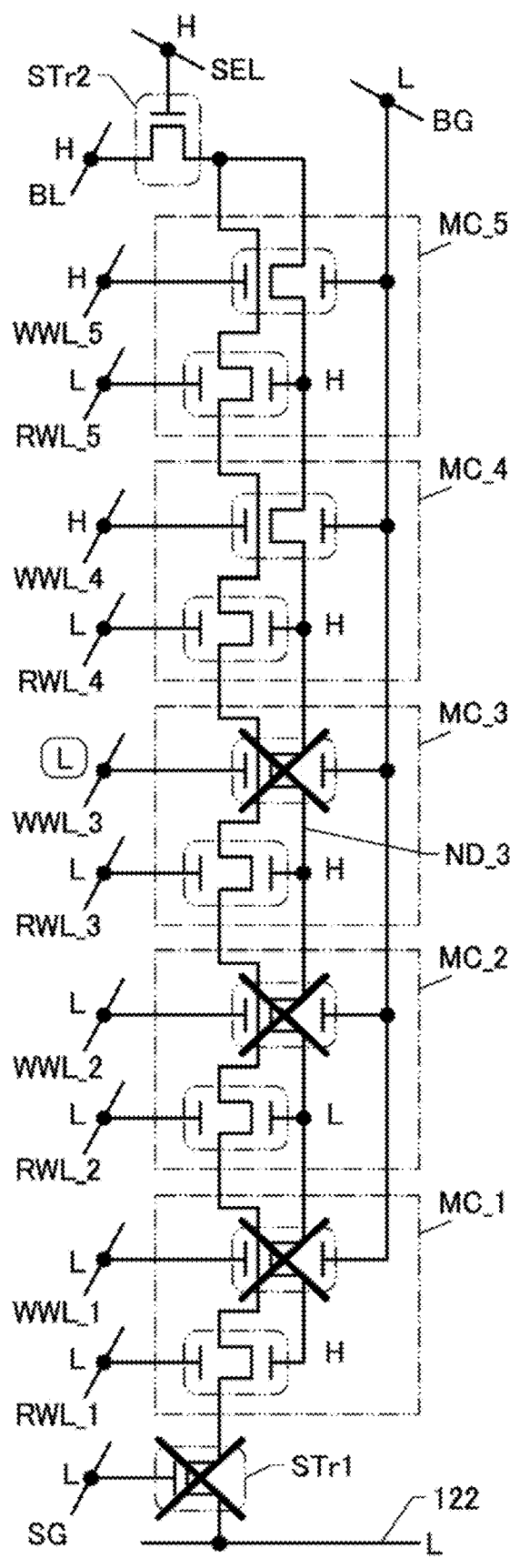
FIG. 42A and FIG. 42B are each a circuit diagram illustrating a writing operation example of a memory string.

In Period T6, the L potential is supplied to the conductor WWL_3 (see FIG. 42A). This brings a transistor WTr_3 into an off state, and charge written to the node ND_3 is retained. Here, the charge corresponding to the H potential is retained.

[Period T7]

Figure 42B:
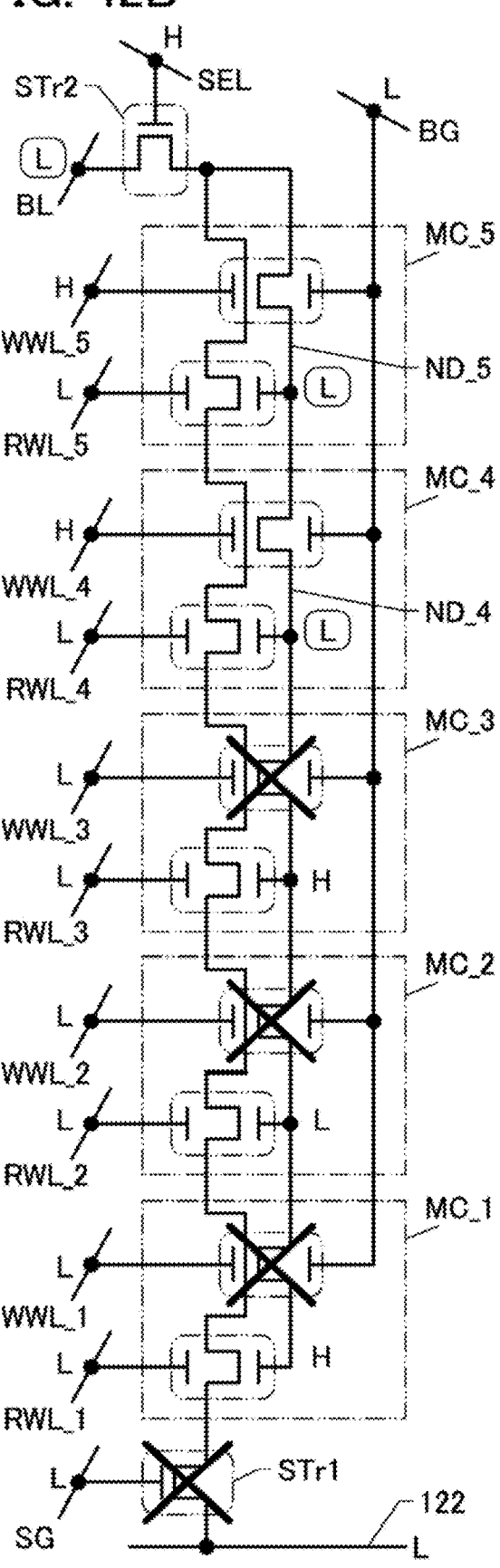

In Period T7, the L potential is supplied to the conductor BL (see FIG. 42B). This brings the potentials of a node ND_4 and the node ND_5 to the L potential.

[Period T8]

Figure 43A:
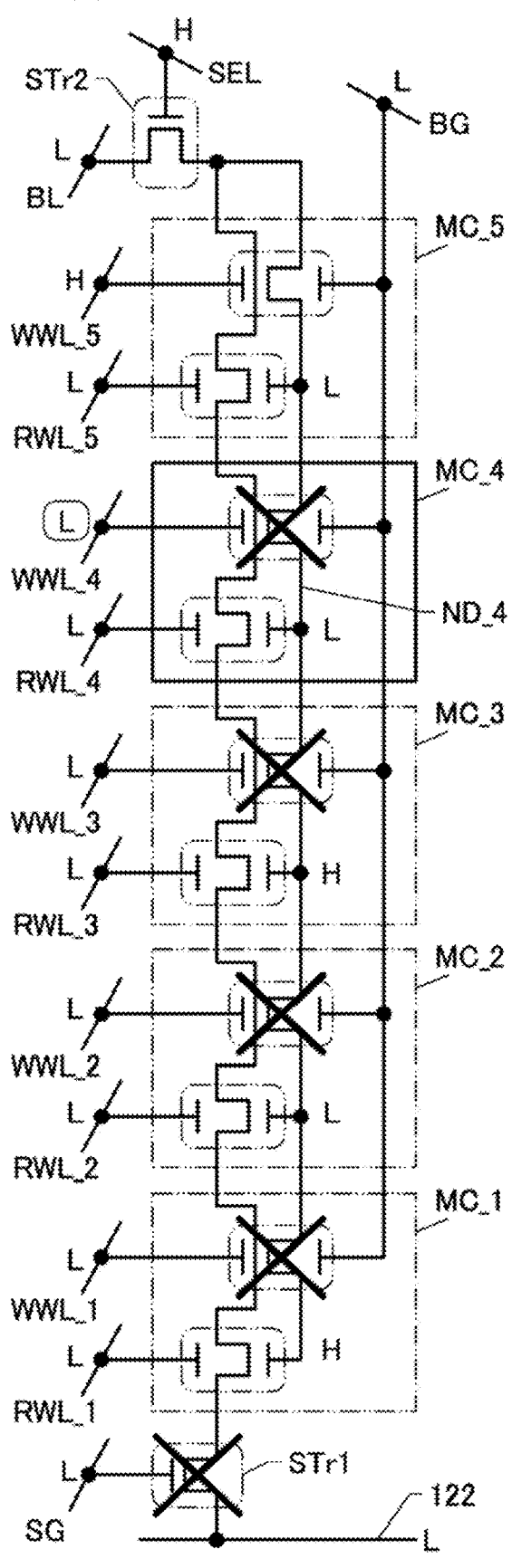
FIG. 43A and FIG. 43B are each a circuit diagram illustrating a writing operation example of a memory string.

In Period T8, the L potential is supplied to the conductor WWL_4 (see FIG. 43A). This brings a transistor WTr_4 into an off state, and charge written to the node ND_4 is retained. Here, the charge corresponding to the L potential is retained.

[Period T9]

In Period T9, the conductor BL remains at the L potential. Thus, the potential of the node ND_5 also remains at the L potential.

[Period T10]

Figure 43B:
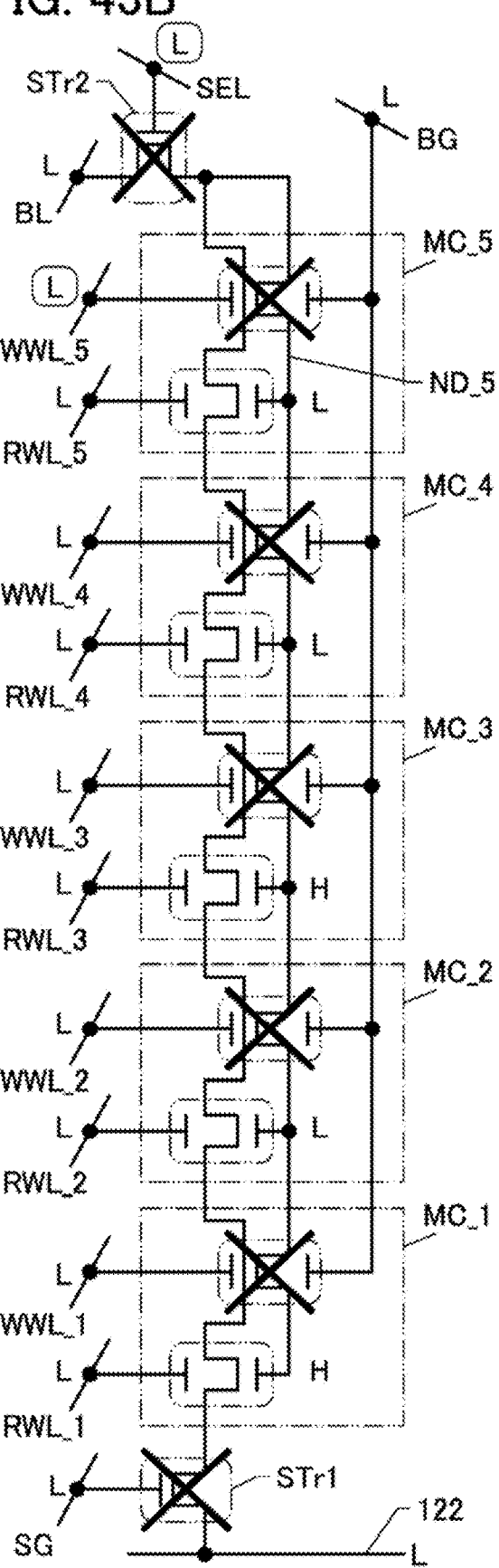

In Period T10, the L potential is supplied to the conductor WWL_5 (see FIG. 43B). This brings the transistor WTr_5 into an off state, and charge written to the node ND_5 is retained. Here, the charge corresponding to the L potential is retained. Furthermore, the L potential is supplied to the conductor SEL.

In this manner, data can be written to the memory elements MC.

Note that in the case where data is written to the i-th (except for i=1) memory element MC among the plurality of memory elements MC, a data writing operation for the memory elements MC up to the (i−1)-th memory element can be omitted. For example, in the case where data is written to a memory element MC_4, a data writing operation for the memory element MC_1 to the memory element MC_3 may be omitted. In other words, the writing operation from Period T1 to Period T6 described in this embodiment can be omitted. Therefore, the time and consumed power for the writing operation of the memory device can be reduced.

[Reading Operation]

Figure 44A:
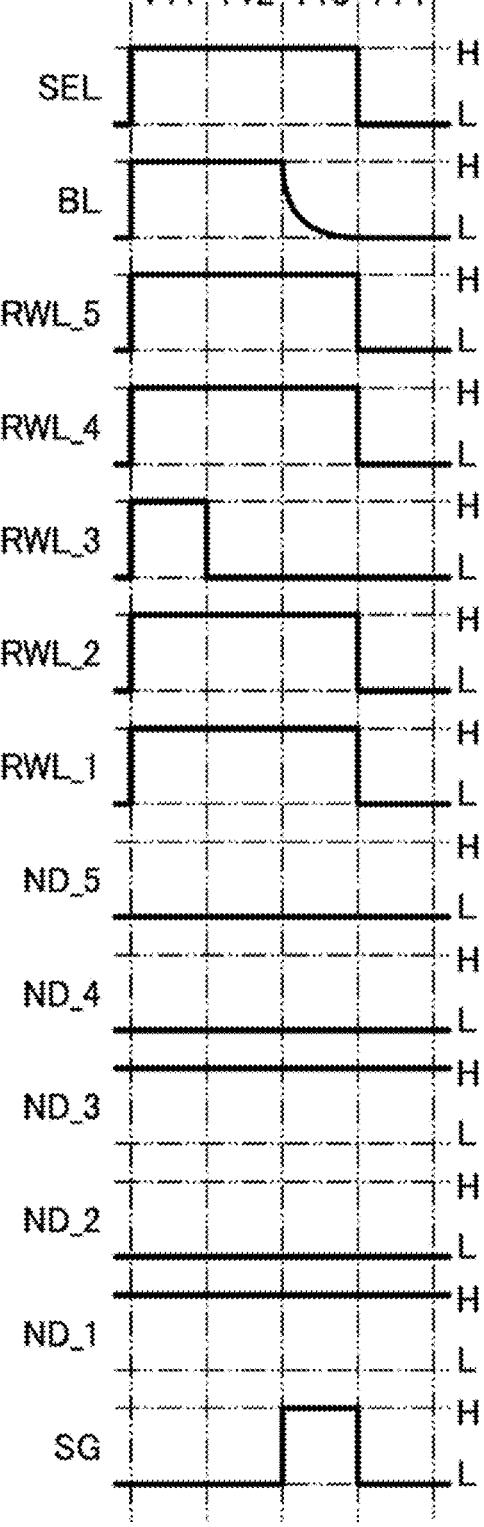
FIG. 44A and FIG. 44B are each a timing chart illustrating a reading operation example of a memory string.
Figure 44B:
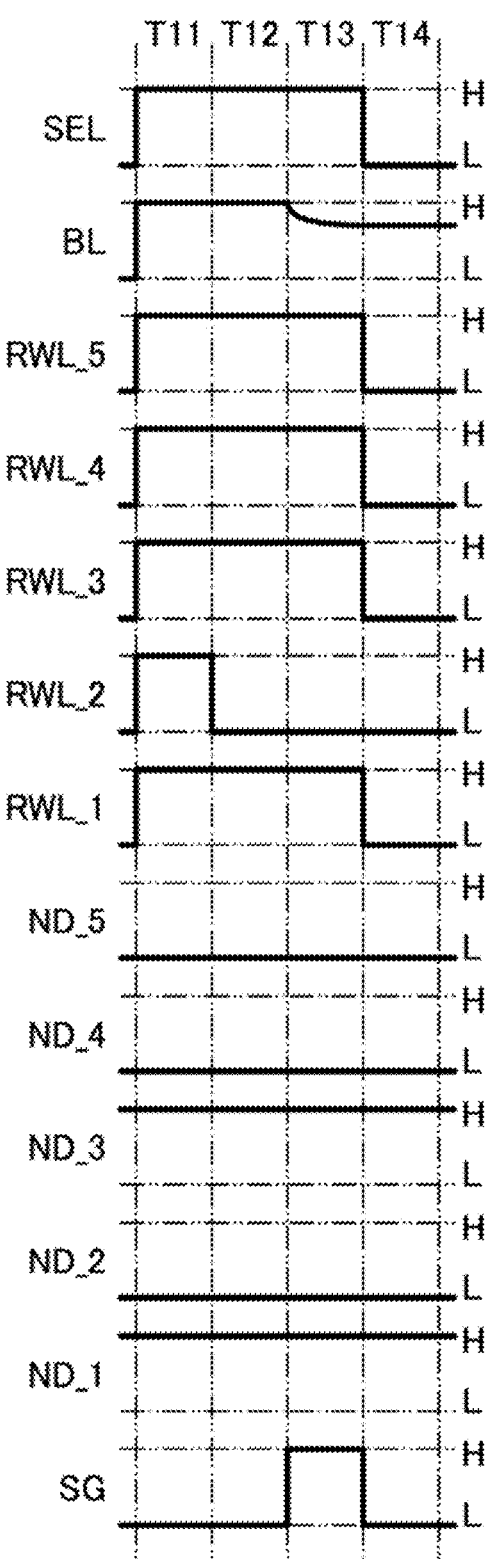
Figure 45A:
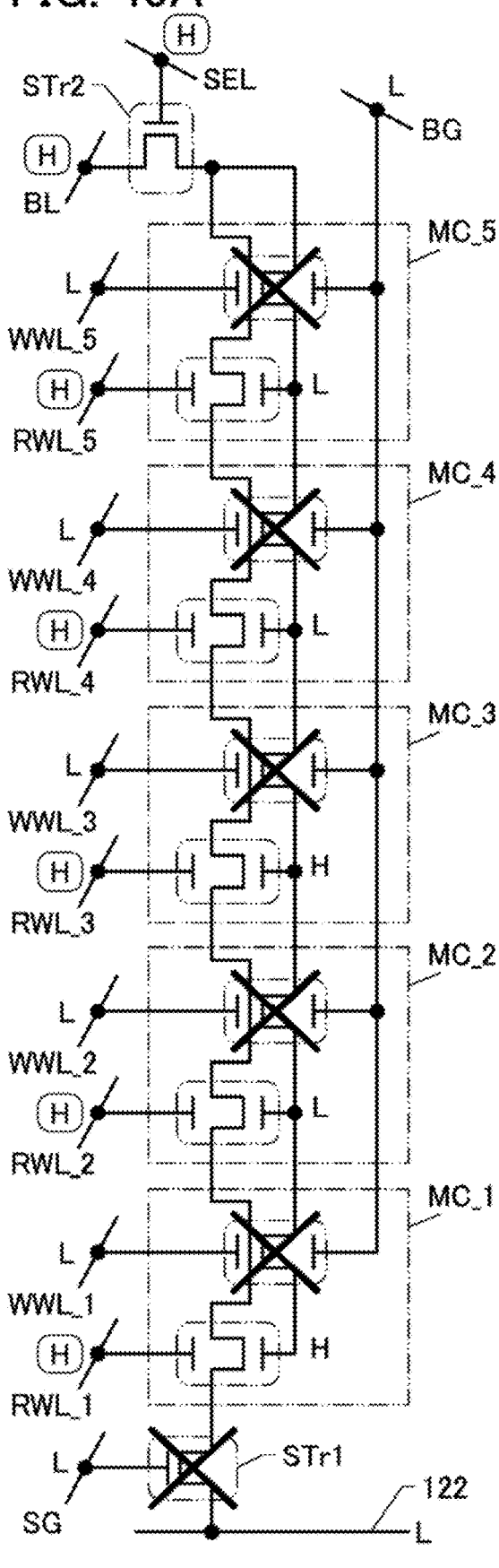
FIG. 45A and FIG. 45B are each a circuit diagram illustrating a reading operation example of a memory string.
Figure 45B:
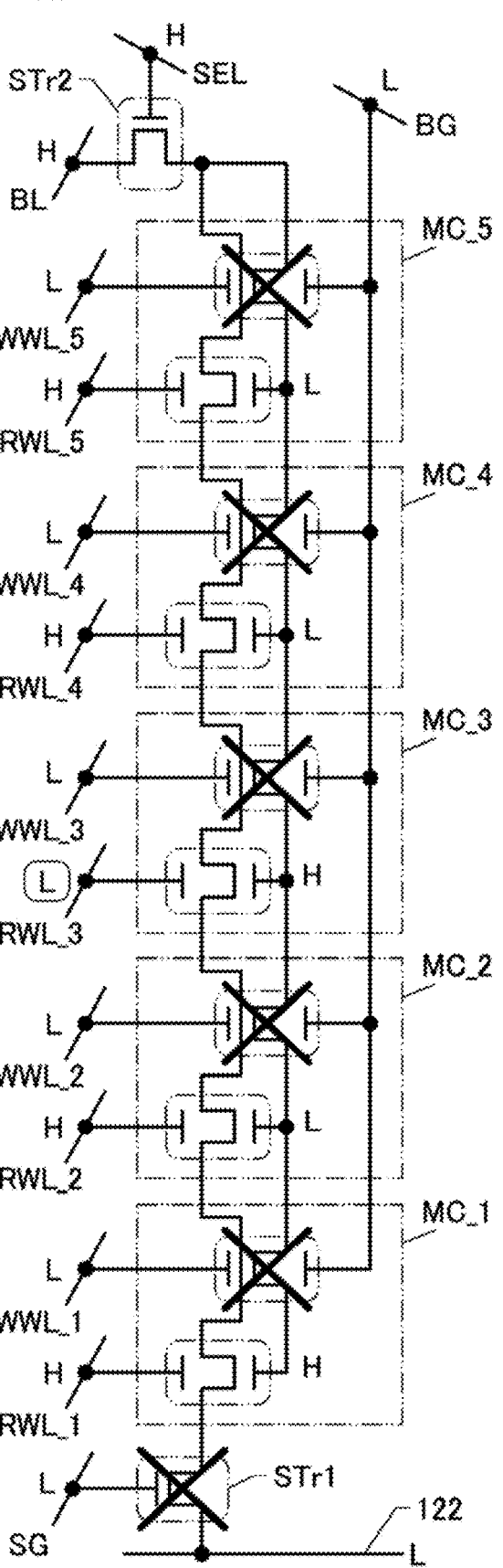

A reading operation example of the memory string 120 with the above-described circuit structure is described. In an initial state, it is assumed that the H potential is retained in the memory element MC_1 and the memory element MC_3 and the L potential is retained in a memory element MC_2, the memory element MC_4, and the memory element MC_5. Furthermore, it is assumed that the L potential is supplied to the conductor WWL_1 to the conductor WWL_5, the conductor RWL_1 to the conductor RWL_5, the conductor SEL, the conductor BG, the conductor BL, the conductor SG, and the layer 122. FIG. 44A and FIG. 44B are timing charts illustrating a reading operation. FIG. 45A, FIG. 45B, and FIG. 46 are circuit diagrams for explaining the reading operation. Note that FIG. 35 and the like can be referred to for reference numerals and the like not written in FIG. 45A, FIG. 45B, and FIG. 46.

<<Case where Retained Potential is H Potential>>

First, a reading operation for the memory element MC_3 where the H potential is retained is described.

[Period T11]

In Period T11, the H potential is supplied to the conductor RWL_1 to the conductor RWL_5 and the conductor SEL (see FIG. 45A). This brings the transistor STr2 into an on state and brings the semiconductor 125 included in the transistors RTr and the conductor BL into a conduction state.

In this state, the conductor BL and the semiconductor 125 are precharged with the H potential and both brought into a floating state.

Figure 47A:
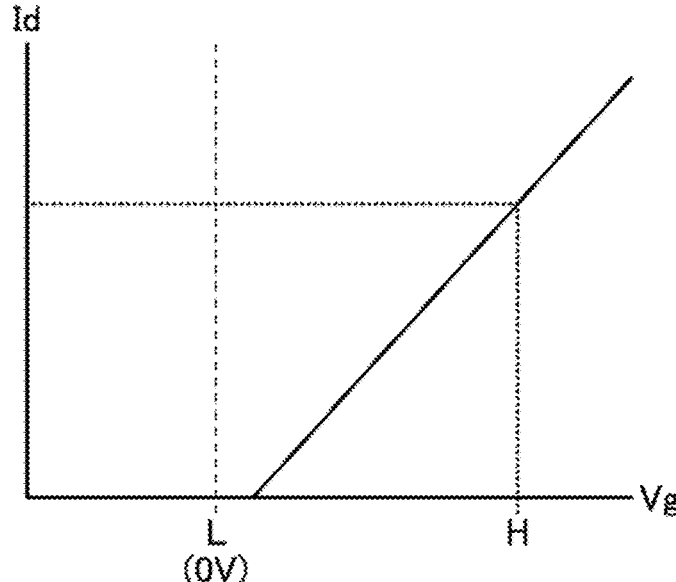
FIG. 47A and FIG. 47B are each a diagram illustrating Id-Vg characteristics of a transistor.
Figure 47B:
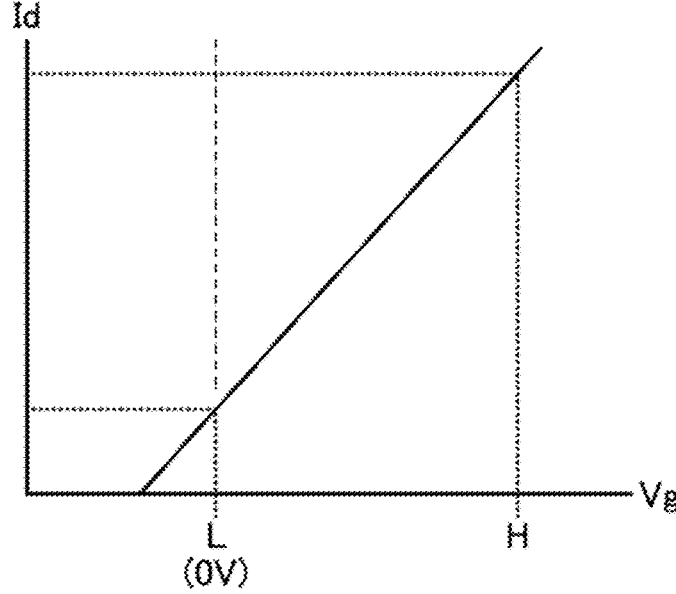

Here, Id-Vg characteristics of transistors are described. FIG. 47A and FIG. 47B are diagrams illustrating Id-Vg characteristics of transistors. In FIG. 47A and FIG. 47B, the horizontal axis represents the gate voltage (Vg) and the vertical axis represents the drain current (Id). FIG. 47A illustrates Id-Vg characteristics of a normally-off transistor, and FIG. 47B illustrates Id-Vg characteristics of a normally-on transistor.

The H potential is higher than the L potential. When the L potential is 0 V, the H potential is a positive voltage. In a normally-off transistor, the channel resistance value (channel resistance value between the source and the drain) at the time when Vg is the L potential (0 V) is extremely high and Id hardly flows. Furthermore, when Vg becomes the H potential, the channel resistance value lowers and Id increases (see FIG. 47A).

In a normally-on transistor, even when Vg is the L potential, the channel resistance value is low and a large amount of Id flows compared with the case of the normally-off transistor. Furthermore, when Vg becomes the H potential, the channel resistance value becomes further low and Id increases more (see FIG. 47B).

Since the transistors RTr are normally-on transistors, even with the potential of the conductors RWL kept at the L potential, precharging of the semiconductor 125 is possible. However, supplying the H potential to the conductors RWL further lowers the channel resistance value of the transistors RTr. Therefore, the time and consumed power necessary for precharging can be reduced.

[Period T12]

In Period T12, the L potential is supplied to the conductor RWL_3 (see FIG. 45B). The H potential is retained in the node ND_3. Therefore, although the potential of the conductor RWL_3 becomes the L potential, the channel resistance value of a transistor RTr_3 is lower than that of the case where the L potential is retained in the node ND_3.

[Period T13]

Figure 46A:
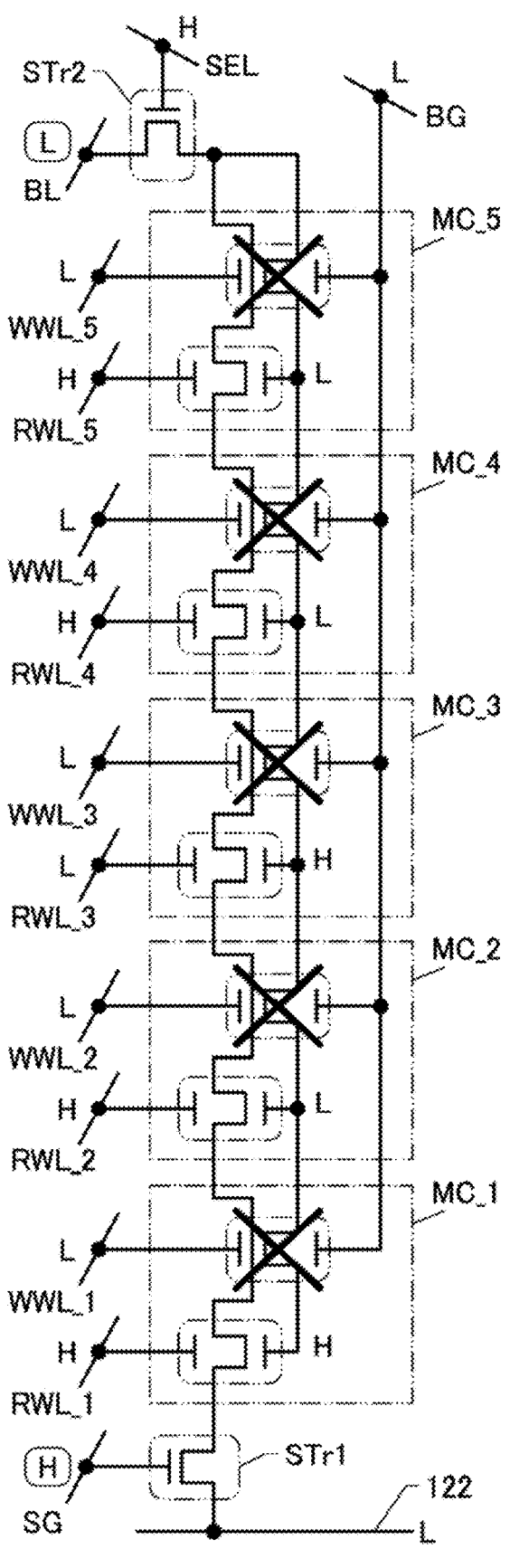
FIG. 46A and FIG. 46B are each a circuit diagram illustrating a reading operation example of a memory string.

In Period T13, the H potential is supplied to the conductor SG to bring the transistor STr1 into an on state (see FIG. 46A). This brings the conductor BL and the layer 122 into a conduction state. At this time, since the H potential is supplied to the conductor RWL_1, the conductor RWL_2, the conductor RWL_4, and the conductor RWL_5, the channel resistance values of the transistor RTr_1, the transistor RTr_2, the transistor RTr_4, and the transistor RTr_5 are low regardless of the potentials of the nodes ND. Furthermore, as described above, although the L potential is supplied to the conductor RWL_3, the H potential is retained in the node ND_3 and thus the channel resistance value of the transistor RTr_3 is low. Hence, the potential of the conductor BL in a floating state changes abruptly from the H potential to the L potential (see FIG. 44A).

[Period T14]

Figure 46B:
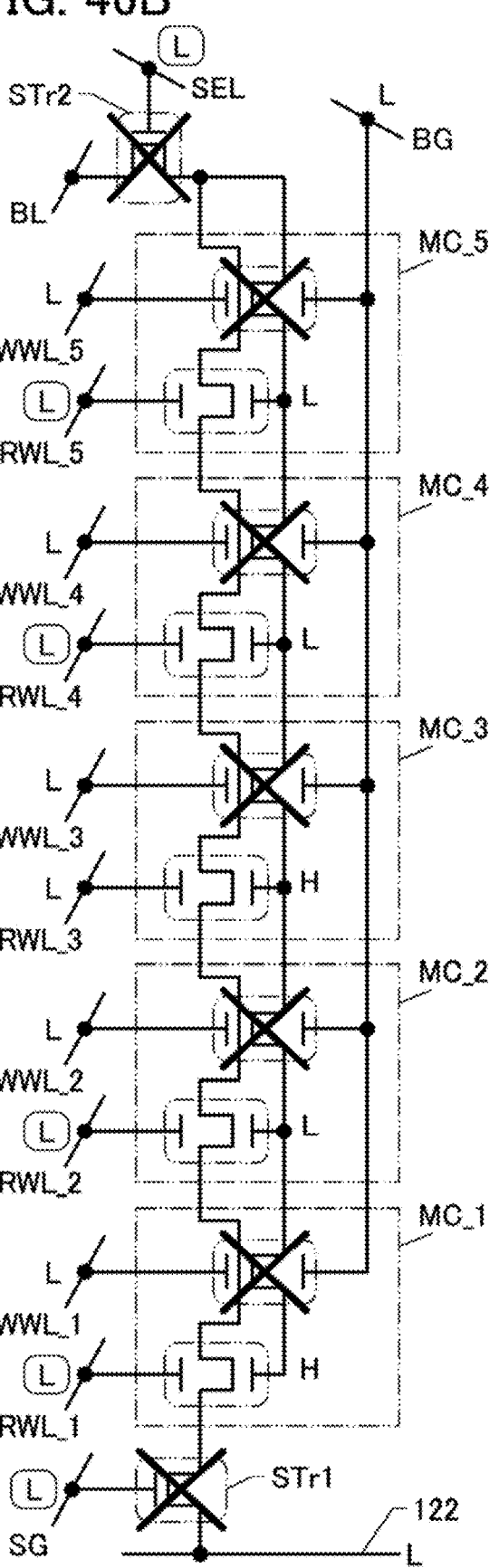

In Period T14, the L potential is supplied to the conductor SEL, the conductors RWL, and the conductor SG (see FIG. 46B).

<<Case where Retained Potential is L Potential>>

First, a reading operation for the memory element MC_2 where the L potential is retained is described. In the case where the data (potential) retained in the memory element MC_2 is read, the potential of the conductor RWL_2 is set at the L potential in Period T12 (see FIG. 44B). At this time, since the L potential is retained in the node ND_2, the channel resistance value of the transistor RTr_2 is higher than that of the case where the H potential is retained in the node ND_2.

Next, in Period T13, the H potential is supplied to the conductor SG to bring the conductor BL and the layer 122 into a conduction state. At this time, since the channel resistance value of the transistor RTr_2 is high, the potential of the conductor BL gently changes from the H potential toward the L potential.

In this manner, by setting the potential of the conductor RWL corresponding to the memory element MC of a reading target at the L potential and sensing the potential change in the conductor BL in Period T13, data retained in the memory element MC can be found.

In addition, it is preferable in a period other than a writing operation period that a potential lower than the L potential (also referred to as "LL potential") be supplied to the conductor BG. The LL potential supplied to the conductor BG can surely bring the transistors WTr into an off state. Thus, data written to the nodes ND can be retained for a longer time.

Furthermore, during the writing operation, a potential higher than the L potential may be supplied to the conductor BG. For example, during the writing operation, the H potential may be supplied to the conductor BG. The supply of the H potential to the conductor BG during the writing operation lowers the resistance value of the semiconductor 127, increasing the writing speed.

This embodiment can be implemented in an appropriate combination with the structures described in the other embodiments and the like.

Embodiment 3

In this embodiment, a structure example of a semiconductor device 200 including the memory device 100 is described.

Figure 48:
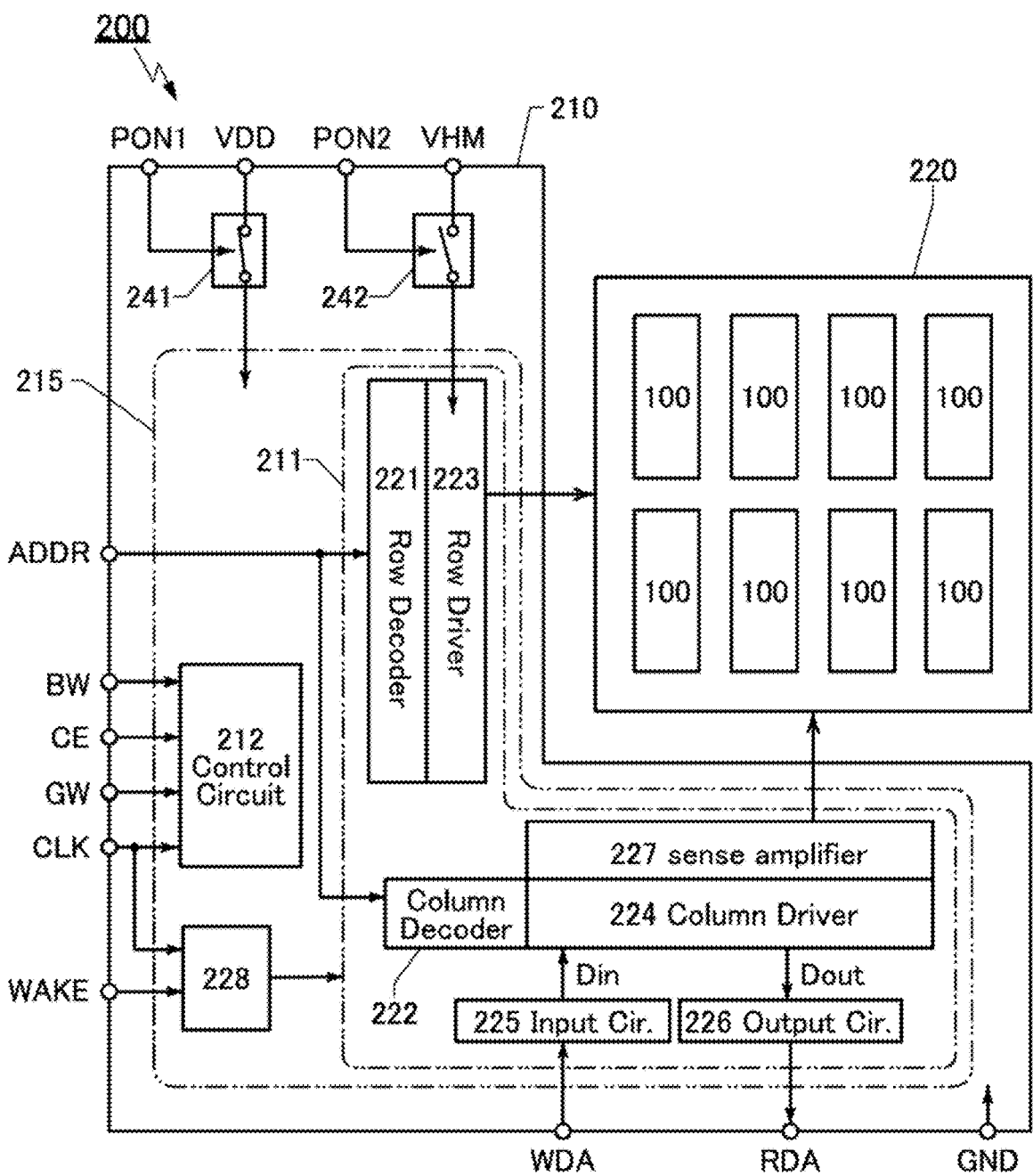
FIG. 48 is a block diagram illustrating a structure example of a semiconductor device.

FIG. 48 is a block diagram showing a structure example of the semiconductor device 200 of one embodiment of the present invention. The semiconductor device 200 illustrated in FIG. 48 includes a driver circuit 210 and a memory array 220. The memory array 220 includes one or more memory devices 100. FIG. 48 illustrates an example in which the memory array 220 includes a plurality of memory devices 100 arranged in a matrix.

The driver circuit 210 includes a PSW 241 (power switch), a PSW 242, and a peripheral circuit 215. The peripheral circuit 215 includes a peripheral circuit 211 (Row Decoder), a control circuit 212, and a voltage generation circuit 228. Note that the semiconductor device 200 includes elements, circuits, or the like having a variety of functions such as the memory array 220, the PSWs 241 and 242, the peripheral circuit 211, the control circuit 212, and the voltage generation circuit 228. Thus, the semiconductor device 200 may be referred to as a system or a subsystem.

In the semiconductor device 200, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signals BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 212.

The control circuit 212 is a logic circuit having a function of controlling the overall operation of the semiconductor device 200. For example, the control circuit performs a logical operation on the signal CE, the signal GW, and the signal BW to determine an operation mode of the semiconductor device 200 (e.g., a writing operation or a reading operation). Alternatively, the control circuit 212 generates a control signal for the peripheral circuit 211 so that the operation mode is executed.

The voltage generation circuit 228 has a function of generating a negative voltage. The signal WAKE has a function of controlling the input of the signal CLK to the voltage generation circuit 228. For example, when an H-level signal is applied as the signal WAKE, the signal CLK is input to the voltage generation circuit 228, and the voltage generation circuit 228 generates a negative voltage.

The peripheral circuit 211 is a circuit for writing and reading data to/from the memory device 100. The peripheral circuit 211 includes a row decoder 221, a column decoder 222, a row driver 223, a column driver 224, an input circuit 225, an output circuit 226, and a sense amplifier 227.

The row decoder 221 and the column decoder 222 have a function of decoding the signal ADDR. The row decoder 221 is a circuit for specifying a row to be accessed, and the column decoder 222 is a circuit for specifying a column to be accessed. The row driver 223 has a function of selecting the wiring specified by the row decoder 221. The column driver 224 has a function of writing data to the memory device 100, a function of reading data from the memory device 100, a function of retaining the read data, and the like.

The input circuit 225 has a function of retaining the signal WDA. Data retained by the input circuit 225 is output to the column driver 224. Data output from the input circuit 225 is data (Din) to be written to the memory device 100. Data (Dout) read from the memory device 100 by the column driver 224 is output to the output circuit 226. The output circuit 226 has a function of retaining Dout. In addition, the output circuit 226 has a function of outputting Dout to the outside of the semiconductor device 200. Data output from the output circuit 226 is the signal RDA.

The PSW 241 has a function of controlling the supply of VDD to the peripheral circuit 215. The PSW 242 has a function of controlling the supply of VHM to the row driver 223. Here, in the semiconductor device 200, a high power supply voltage is VDD and a low power supply voltage is GND (a ground potential). In addition, VHM is a high power supply voltage used to set the word line to the H level and is higher than VDD. The on/off of the PSW 241 is controlled by the signal PON1, and the on/off of the PSW 242 is controlled by the signal PON2. The number of power domains to which VDD is supplied is one in the peripheral circuit 215 in FIG. 48 but can be more than one. In this case, a power switch is provided for each power domain.

Figure 49A:
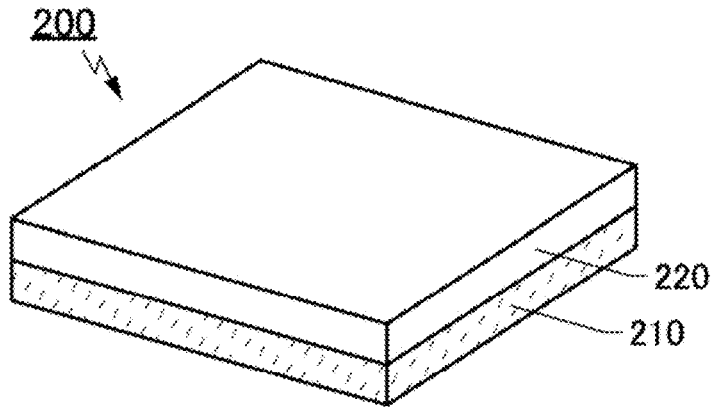
FIG. 49A to FIG. 49C are each a perspective view illustrating a structure example of a semiconductor device.
Figure 49B:
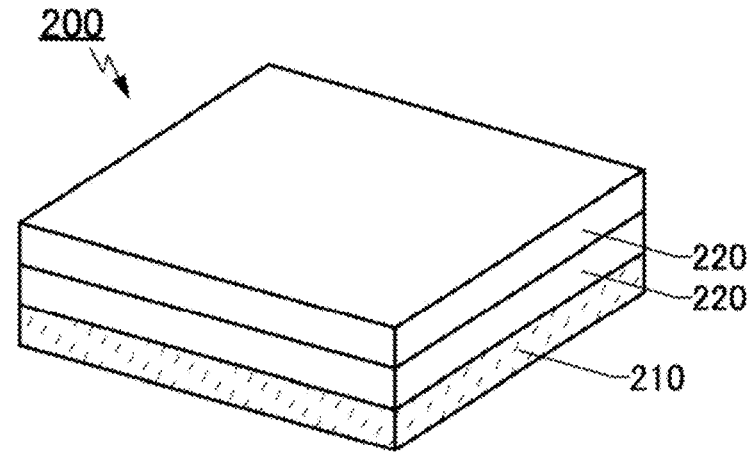

The driver circuit 210 and the memory array 220 may be provided on the same plane. As illustrated in FIG. 49A, the driver circuit 210 and the memory array 220 may be provided to overlap with each other. When the driver circuit 210 and the memory array 220 overlap with each other, the signal transmission distance can be shortened. Alternatively, a plurality of memory arrays 220 may be provided over the driver circuit 210 as illustrated in FIG. 49B.

Figure 49C:
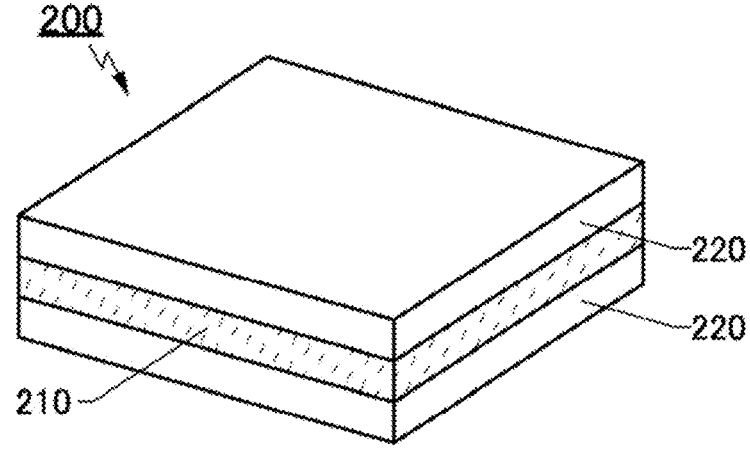

As illustrated in FIG. 49C, the memory array 220 may be provided over and under the driver circuit 210. FIG. 49C illustrates an example in which one memory array 220 is provided over and under the driver circuit 210. Providing a plurality of memory arrays 220 so that the driver circuit 210 is sandwiched therebetween can further shorten the signal propagation distance. The number of memory arrays 220 stacked over the driver circuit 210 and the number of memory arrays 220 stacked under the driver circuit 210 may each be one or more. The number of memory arrays 220 stacked over the driver circuit 210 is preferably equal to the number of memory arrays 220 stacked under the driver circuit 210.

<Cross-Sectional Structure Example of Semiconductor Device>

Figure 50:
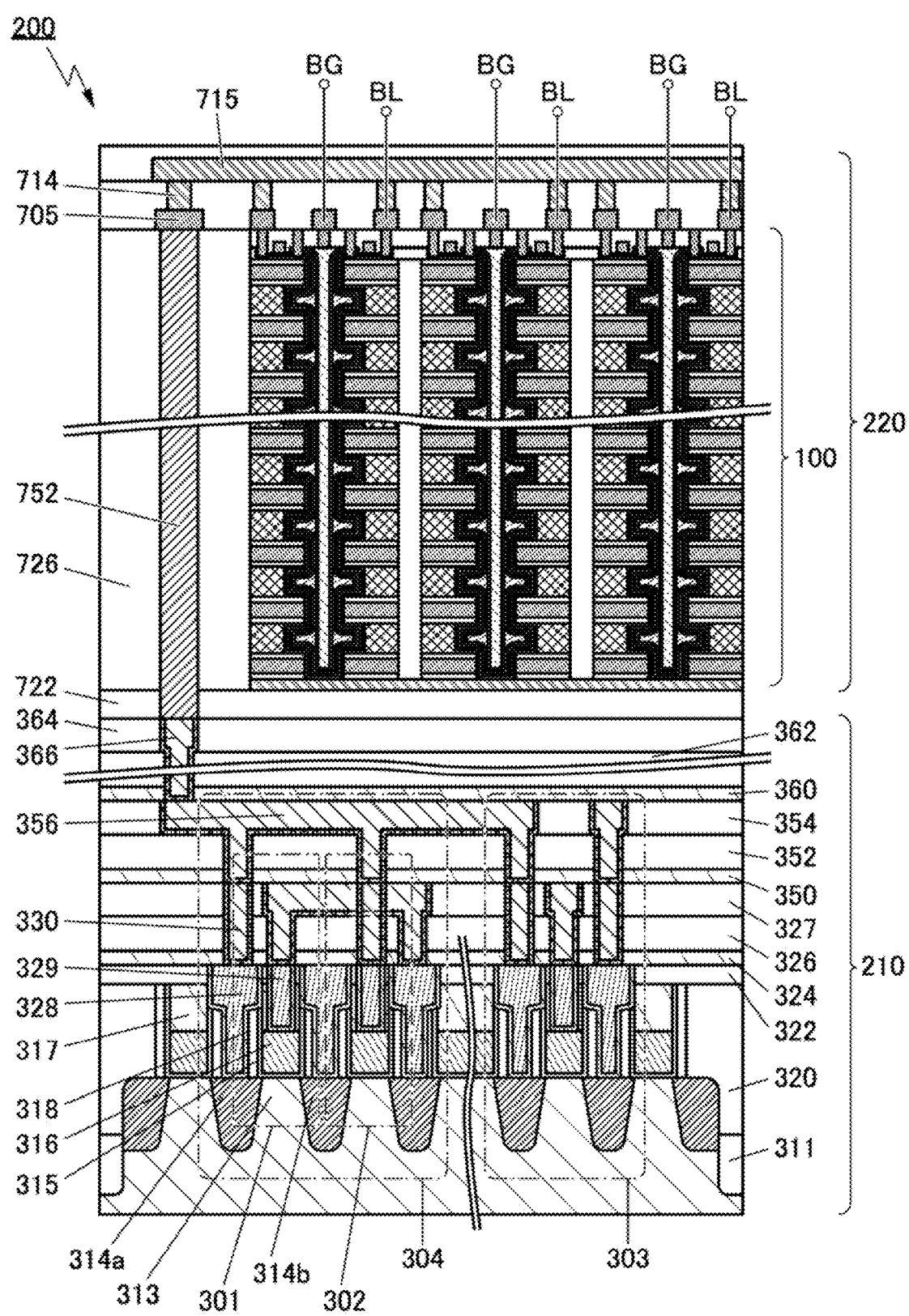
FIG. 50 is a cross-sectional view illustrating a semiconductor device of one embodiment of the present invention.

FIG. 50 illustrates a cross-sectional structure example of the semiconductor device 200 illustrated in FIG. 49A. In FIG. 50, part of the semiconductor device 200 illustrated in FIG. 49A is illustrated.

FIG. 50 illustrates a transistor 301, a transistor 302, and a transistor 303 included in the driver circuit 210. Note that the transistor 301 and the transistor 302 function as part of a sense amplifier 304. Furthermore, the transistor 303 functions as a column selection switch. Specifically, the conductor BL included in the memory array 220 is electrically connected to one of a source and a drain of the transistor 301, a gate of the transistor 301 is electrically connected to one of a source and a drain of the transistor 302, and a gate of the transistor 302 is electrically connected to the other of the source and the drain of the transistor 301. The one of the source and the drain of the transistor 301 and the other of the source and the drain of the transistor 302 are electrically connected to one of a source and a drain of the transistor 303 which functions as the column selection switch. Accordingly, the layout area of the semiconductor device 200 can be reduced. Note that an example where seven memory elements MC are provided per memory string is illustrated in FIG. 50. However, the number of memory elements MC provided in a memory string is not limited thereto. For example, the number of memory elements MC provided in a memory string may be 32, 64, 128, or 200 or more.

The conductor BL of the memory array 220 is electrically connected to the sense amplifier 304 and the transistor 303 serving as the column selection switch through a conductor 752 formed to be embedded in an insulator 726, the insulator 722, and the like, a conductor 705, a conductor 714, and a conductor 715. Note that circuits and transistors included in the driver circuit 210 are examples, and one embodiment of the present invention is not limited to the circuit structures and the transistor structures. In addition to the above, a transistor and a circuit such as a control circuit, a row decoder, a row driver, a source line driver, or an input-output circuit can be provided as appropriate in accordance with the structure and driving method of the semiconductor device 200.

The transistor 301, the transistor 302, and the transistor 303 are provided on a substrate 311 and each include a conductor 316, an insulator 315, a semiconductor region 313 that is part of the substrate 311, and a low-resistance region 314a and a low-resistance region 314b serving as a source region and a drain region. Note that as shown in FIG. 50, one low-resistance region may be used in common for a source region or a drain region of one of the transistor 301 and the transistor 302 and a source region or a drain region of the other of the transistor 301 and the transistor 302.

In each of the transistor 301, the transistor 302, and the transistor 303, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting the work function may be used for the conductor 316. The transistor 301, the transistor 302, and the transistor 303 that are described above are also referred to as FIN-type transistors because they utilize convex portions of a semiconductor substrate. Note that an insulator serving as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Although each of the transistor 301, the transistor 302, and the transistor 303 may be either a p-channel transistor or an n-channel transistor, the transistor 301 and the transistor 302 are preferably transistors having different polarities.

It is preferable that a region of the semiconductor region 313 where the channel is formed, a region in the vicinity thereof, the low-resistance region 314a and the low-resistance region 314b serving as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 301, the transistor 302, and the transistor 303 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The insulator 315 serves as a gate insulating film of each of the transistor 301, the transistor 302, and the transistor 303.

As the conductor 316 serving as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten or aluminum for the conductor, and it is particularly preferable to use tungsten in terms of heat resistance.

An insulator 317 serving as an etching stopper is preferably provided above the conductor 316. In addition, an insulator 318 serving as a spacer is preferably provided on a side surface of the insulator 315. When the insulator 317 and the insulator 318 are provided, regions where the low-resistance region 314a and the low-resistance region 314b and a conductor 328 are electrically connected to each other can be defined in a self-aligned manner. Thus, even when misalignment occurs in forming the openings for exposing part of the low-resistance region 314a and the low-resistance region 314b, the openings for exposing the intended regions can be formed. The conductor 328 provided in the openings formed in this manner can provide a favorable contact with reduced contact resistance between the low-resistance region 314a and the low-resistance region 314b and the conductor 328. The contact between the low-resistance region 314a and the low-resistance region 314b and the conductor 328 which is formed in this manner may be referred to as a self-aligned contact. Furthermore, a conductor 329 electrically connected to the conductor 316 may be provided so as to be embedded in the insulator 317 and an insulator 322.

An insulator 320, the insulator 322, an insulator 324, an insulator 326, and an insulator 327 are stacked in this order to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 301 or the like provided below the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen and impurities from the substrate 311, the transistor 301, or the like into the region where the memory array 220 is provided.

For the film having a barrier property against hydrogen, silicon nitride formed by a CVD method can be used, for example. Here, diffusion of hydrogen into a semiconductor element including an oxide semiconductor, such as the memory elements MC, degrades the characteristics of the semiconductor element in some cases. Therefore, a film that inhibits hydrogen diffusion is preferably used between the memory elements MC and the transistor 301 and the like. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of each of the insulator 326 and the insulator 327 is preferably lower than that of the insulator 324. For example, the relative permittivity of each of the insulator 326 and the insulator 327 is preferably lower than 4, further preferably lower than 3. The relative permittivity of each of the insulator 326 and the insulator 327 is, for example, preferably less than or equal to 0.7 times, further preferably less than or equal to 0.6 times the relative permittivity of the insulator 324. When a material with a low permittivity is used for the interlayer film, the parasitic capacitance generated between wirings can be reduced.

The conductor 328, the conductor 329, a conductor 330, and the like that are electrically connected to the memory array 220 are embedded in the insulator 320, the insulator 322, the insulator 324, the insulator 326, and the insulator 327. Note that the conductor 328, the conductor 329, and the conductor 330 have functions of plugs or wirings. A plurality of conductors serving as plugs or wirings are collectively denoted by the same reference numeral in some cases. Furthermore, in this specification and the like, a wiring and a plug electrically connected to the wiring may be a single component. That is, there are cases where part of a conductor serves as a wiring and another part of the conductor serves as a plug.

As a material for each of the plugs and wirings (the conductor 328, the conductor 329, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, each of the plugs and wirings is preferably formed using a low-resistance conductive material such as aluminum or copper. The use of a low-resistance conductive material can reduce wiring resistance.

A wiring layer may be provided over the insulator 327 and the conductor 330. For example, in FIG. 50, an insulator 350, an insulator 352, and an insulator 354 are stacked in this order. Furthermore, a conductor 356 is formed in the insulator 350, the insulator 352, and the insulator 354. The conductor 356 has a function of a plug or a wiring. Note that the conductor 356 can be provided using a material similar to those for the conductor 328, the conductor 329, and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 301 and the like and the memory elements MC can be separated by the barrier layer, so that diffusion of hydrogen from the transistor 301 and the like into the memory elements MC can be inhibited.

As the conductor having a barrier property against hydrogen, tantalum nitride is preferably used, for example. In addition, the use of a stack including tantalum nitride and tungsten, which has high conductivity, can inhibit diffusion of hydrogen from the transistor 301 and the like while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 50, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328, the conductor 329, and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 301 and the like and the memory element MC can be separated by the barrier layer, so that diffusion of hydrogen from the transistor 301 and the like into the memory element MC can be inhibited.

The insulator 722 is provided over the insulator 364 and the conductor 366, and the memory array 220 is provided above the insulator 722. A barrier film formed using a material similar to that for the insulator 324 may be provided between the insulator 364 and the insulator 722.

This embodiment can be implemented in an appropriate combination with the structures described in the other embodiments and the like.

Embodiment 4

In this embodiment, application examples of the semiconductor device using the memory device described in the above embodiment will be described. The memory device described in the above embodiment can be used for a variety of removable memory devices such as memory cards (e.g., SD cards), USB memories, and SSDs (solid state drives). FIG. 51A to FIG. 51E schematically illustrate some structure examples of removable memory devices. The semiconductor device described in the above embodiment is processed into a packaged memory chip and used in a variety of storage devices and removable memories, for example.

FIG. 51A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The memory device or the semiconductor device described in the above embodiment can be incorporated in the memory chip 1105 or the like.

FIG. 51B is a schematic external view of an SD card, and FIG. 51C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The memory device or the semiconductor device described in the above embodiment can be incorporated in the memory chip 1114 or the like.

FIG. 51D is a schematic external view of an SSD, and FIG. 51E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The memory device or the semiconductor device described in the above embodiment can be incorporated in the memory chip 1154 or the like.

This embodiment can be implemented in an appropriate combination with the structures described in the other embodiments and the like.

Embodiment 5

FIG. 52A to FIG. 52G illustrate specific examples of electronic devices each provided with the memory device or semiconductor device of one embodiment of the present invention.

<Electronic Device and System>

The memory device or the semiconductor device of one embodiment of the present invention can be mounted on a variety of electronic devices. Examples of electronic devices include an information terminal, a computer, a smartphone, an e-book reader, a television device, digital signage, a large game machine such as a pachinko machine, a digital camera, a digital video camera, a digital photo frame, a mobile phone, a portable game machine, a video recording/reproducing device, a navigation system, and an audio reproducing device. Here, the computer refers not only to a tablet computer, a notebook computer, and a desktop computer, but also to a large computer such as a server system.

The electronic device of one embodiment of the present invention may include an antenna. When a signal is received by the antenna, a video, data, and the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

[Information Terminal]

With the memory device or semiconductor device of one embodiment of the present invention, a memory device for storing a microcontroller program can be configured. Thus, according to one embodiment of the present invention, the size of a microcontroller chip can be reduced.

Figure 52A:
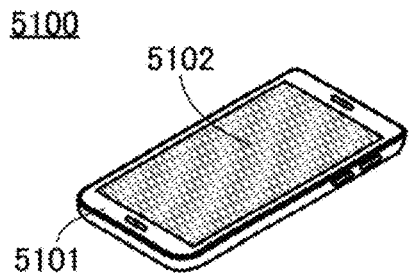
FIG. 52A to FIG. 52G are each a diagram for describing an example of an electronic device.

FIG. 52A illustrates a mobile phone (smartphone), which is a type of information terminal. An information terminal 5100 includes a housing 5101 and a display portion 5102. As input interfaces, a touch panel is provided in the display portion 5102, and a button is provided in the housing 5101. The use of a downsized microcontroller of one embodiment of the present invention allows effective use of a limited space in the mobile phone. The memory device of one embodiment of the present invention may be used for storage of the mobile phone. This results in an increase in the storage capacity per unit area of the storage.

Figure 52B:
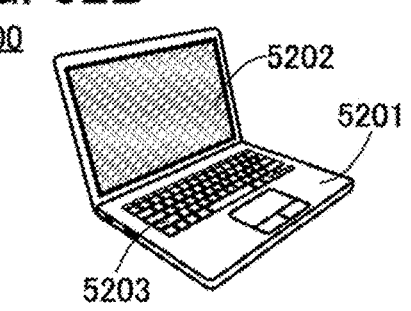

FIG. 52B illustrates a notebook information terminal 5200. The notebook information terminal 5200 includes a main body 5201 of the information terminal, a display portion 5202, and a keyboard 5203. The use of a downsized microcontroller of one embodiment of the present invention allows effective use of a limited space in the notebook information terminal. The memory device of one embodiment of the present invention may be used for storage of the notebook information terminal. This results in an increase in the storage capacity per unit area of the storage.

Note that although FIG. 52A and FIG. 52B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machine]

Figure 52C:
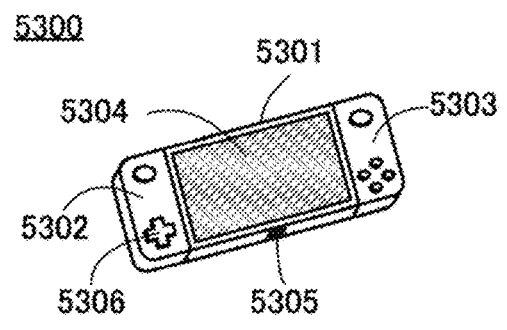

FIG. 52C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The memory device, the semiconductor device, or the like of one embodiment of the present invention can be incorporated into a chip provided on a substrate in the housing 5301, the housing 5302 and the housing 5303, for example.

Figure 52D:
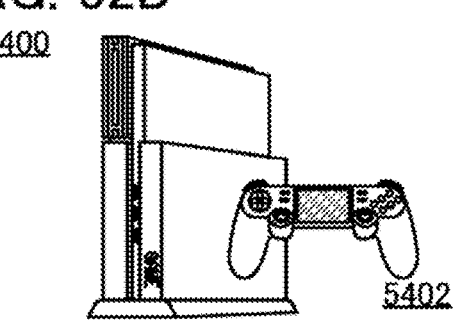

FIG. 52D illustrates a stationary game machine 5400 as an example of a game machine. A controller 5402 is wired or connected wirelessly to the stationary game machine 5400.

The use of a downsized microcontroller of one embodiment of the present invention for the game machine such as the portable game machine 5300 or the stationary game machine 5400 allows effective use of a limited space in the game machine. The memory device, the semiconductor device, or the like of one embodiment of the present invention may be used for storage of the portable game machine. This results in an increase in the storage capacity per unit area of the storage.

Although the portable game machine and the stationary game machine are illustrated as examples of game machines in FIG. 52C and FIG. 52D, the game machine using the microcontroller of one embodiment of the present invention is not limited thereto. Examples of game machines using the microcontroller of one embodiment of the present invention include an arcade game machine installed in entertainment facilities (a game center, an amusement park, or the like) and a throwing machine for batting practice installed in sports facilities.

[Large Computer]

The memory device, the semiconductor device, or the like of one embodiment of the present invention can be used in a large computer.

Figure 52E:
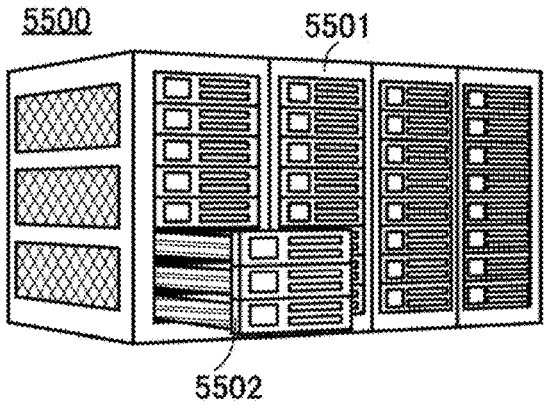
Figure 52F:
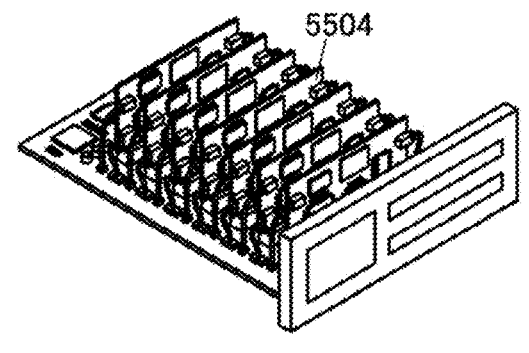

FIG. 52E illustrates a supercomputer 5500 as an example of a large computer. FIG. 52F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computers 5502 are provided with a plurality of substrates 5504, and a microcontroller of one embodiment of the present invention can be mounted on the substrates. The use of a downsized microcontroller of one embodiment of the present invention allows effective use of a limited space in the large computer. The memory device, the semiconductor device, or the like of one embodiment of the present invention may be used for storage of the large computer. This results in an increase in the storage capacity per unit area of the storage.

Although a supercomputer is illustrated as an example of a large computer in FIG. 52E and FIG. 52F, a large computer using the microcontroller of one embodiment of the present invention is not limited thereto. Examples of a large computer using the microcontroller of one embodiment of the present invention include a computer that provides service (a server) and a large general-purpose computer (a mainframe).

[Household Appliance]

Figure 52G:
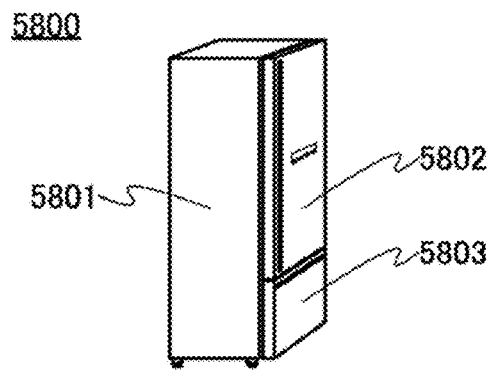

FIG. 52G illustrates an electric refrigerator-freezer 5800 as an example of a household appliance. The electric refrigerator-freezer 5800 includes a housing 5801, a refrigerator door 5802, a freezer door 5803, and the like.

The memory device, the semiconductor device, or the like of one embodiment of the present invention can also be used for the electric refrigerator-freezer 5800. For example, the use of a downsized microcontroller of one embodiment of the present invention for the electric refrigerator-freezer 5800 allows effective use of a limited space in the electric refrigerator-freezer.

Although the electric refrigerator-freezer is described as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, its effects, and the like described in this embodiment can be combined as appropriate with the description of another electronic device.

This embodiment can be implemented in an appropriate combination with the structures described in the other embodiments and the like.

REFERENCE NUMERALS

100: memory device, 105: region, 110: memory cell array, 120: memory string, 121: base, 122: layer, 123: insulator, 124: insulator, 125: semiconductor, 126: insulator, 127: semiconductor, 128: conductor, 129: insulator, 130: conductor, 132: insulator, 134: conductor, 136: conductor

The invention claimed is:

1. A semiconductor device comprising:
a structural body extending in a first direction;
a plurality of first conductors extending in a second direction that intersects with the first direction; and
a plurality of second conductors extending in the second direction,
wherein the structural body comprises:
    a third conductor;
    a first insulator;
    a plurality of fourth conductors;
    a first semiconductor;
    a second insulator;
    a second semiconductor; and
    a third insulator,
wherein, in a first region corresponding to each intersecting portion of the plurality of first conductors and the structural body, the first insulator, the first semiconductor, the second insulator, the second semiconductor, and the third insulator are arranged concentrically in that order around the third conductor,
wherein, in the first region, a first portion of one of the plurality of first conductors is configured to function as a first gate electrode of a first transistor, a first portion of the first semiconductor is configured to function as a first channel formation region of the first transistor, and a first portion of the third conductor is configured to function as a second gate electrode of the first transistor wherein, in a second region corresponding to each intersecting portion of the plurality of second conductors and the structural body, the first insulator, one of the plurality of fourth conductors, the first semiconductor, the second insulator, the second semiconductor, and the third insulator are arranged concentrically in that order around the third conductor and the one of the plurality of fourth conductors is in contact with the first semiconductor, wherein, in the second region, a first portion of one of the plurality of second conductors is configured to function as a first gate electrode of a second transistor, a first portion of the second semiconductor is configured to function as a second channel formation region of the second transistor, and a first portion of the one of the plurality of fourth conductors is configured to function as a second gate electrode of the second transistor, wherein the first semiconductor comprises an oxide semiconductor, wherein the second semiconductor comprises silicon, wherein the second semiconductor comprises a region in contact with a first layer, and wherein the first layer comprises a first metal element.

2. The semiconductor device according to claim 1, wherein the first metal element is nickel.

3. The semiconductor device according to claim 1, wherein the first layer comprises an impurity element.

4. The semiconductor device according to claim 3, wherein the impurity element is phosphorus.

5. The semiconductor device according to claim 1, wherein the oxide semiconductor comprises at least one of indium and zinc.

6. The semiconductor device according to claim 1, wherein the oxide semiconductor comprises CAAC-OS, nc-OS, or a-like OS.

7. A semiconductor device comprising:
a structural body extending in a first direction;
a plurality of first conductors extending in a second direction that intersects with the first direction; and
a plurality of second conductors extending in the second direction,
wherein the structural body comprises:
  a third conductor;
  a first insulator;
  a plurality of fourth conductors;
  a first semiconductor;
  a second insulator;
  a second semiconductor; and
  a third insulator,
wherein, in a first region corresponding to each intersecting portion of the plurality of first conductors and the structural body, the first insulator, the first semiconductor, the second insulator, the second semiconductor, and the third insulator are arranged concentrically in that order on the outside of the third conductor, wherein, in the first region, a first portion of one of the plurality of first conductors is configured to function as a first gate electrode of a first transistor, a first portion of the first semiconductor is configured to function as a first channel formation region of the first transistor, and a first portion of the third conductor is configured to function as a second gate electrode of the first transistor, wherein, in a second region corresponding to each intersecting portion of the plurality of second conductors and the structural body, the first insulator, one of the plurality of fourth conductors, the first semiconductor, the second insulator, the second semiconductor, and the third insulator are arranged concentrically in that order on the outside of the third conductor and the one of the plurality of fourth conductors is in contact with the first semiconductor, wherein, in the second region, a first portion of one of the plurality of second conductors is configured to function as a first gate electrode of a second transistor, a first portion of the second semiconductor is configured to function as a second channel formation region of the second transistor, and a first portion of the one of the plurality of fourth conductors is configured to function as a second gate electrode of the second transistor, wherein the first semiconductor comprises an oxide semiconductor, wherein the second semiconductor comprises silicon, wherein the second semiconductor comprises a region in contact with a first layer, and wherein the first layer comprises a first metal element.

8. A semiconductor device comprising:
a structural body extending in a first direction;
a plurality of first conductors extending in a second direction that intersects with the first direction; and
a plurality of second conductors extending in the second direction,
wherein the structural body comprises:
  a third conductor;
  a first insulator;
  a plurality of fourth conductors;
  a first semiconductor;
  a second insulator;
  a second semiconductor; and
  a third insulator,
wherein, in a first region where the plurality of first conductors and the structural body intersect each other, the first insulator, the first semiconductor, the second insulator, the second semiconductor, and the third insulator are arranged concentrically around the third conductor in that order with the first insulator being in contact with the third conductor, wherein, in the first region, a first portion of one of the plurality of first conductors is configured to function as a first gate electrode of a first transistor, a first portion of the first semiconductor is configured to function as a first channel formation region of the first transistor, and a first portion of the third conductor is configured to function as a second gate electrode of the first transistor, wherein, in a second region where the plurality of second conductors and the structural body intersect each other, the first insulator, one of the plurality of fourth conductors, the first semiconductor, the second insulator, the second semiconductor, and the third insulator are arranged concentrically around the third conductor in that order and the one of the plurality of fourth conductors is in contact with the first semiconductor, wherein, in the second region, a first portion of one of the plurality of second conductors is configured to function as a first gate electrode of a second transistor, a first portion of the second semiconductor is configured to function as a second channel formation region of the second transistor, and a first portion of the one of the plurality of fourth conductors is configured to function as a second gate electrode of the second transistor, wherein the first semiconductor comprises an oxide semiconductor, wherein the second semiconductor comprises silicon, wherein the second semiconductor comprises a region in contact with a first layer, and wherein the first layer comprises a first metal element.

9. The semiconductor device according to claim 7, wherein the first metal element is nickel, wherein the first layer comprises an impurity element, wherein the oxide semiconductor comprises at least one
of indium and zinc, and wherein the oxide semiconductor comprises CAAC-OS,
nc-OS, or a-like OS.

10. The semiconductor device according to claim 8, wherein the first metal element is nickel, wherein the first layer comprises an impurity element, wherein the oxide semiconductor comprises at least one
of indium and zinc, and wherein the oxide semiconductor comprises CAAC-OS,
nc-OS, or a-like OS.

* * * * *